(12) United States Patent
Kanna et al.

(10) Patent No.: US 7,335,454 B2
(45) Date of Patent: Feb. 26, 2008

(54) POSITIVE RESIST COMPOSITION

(75) Inventors: Shinichi Kanna, Shizuoka (JP);
Kazuyoshi Mizutani, Shizuoka (JP);
Kunihiko Kodama, Shizuoka (JP);
Tomoya Sasaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 58 days.

(21) Appl. No.: 10/317,110

(22) Filed: Dec. 12, 2002

(65) Prior Publication Data
US 2003/0194650 A1    Oct. 16, 2003

(30) Foreign Application Priority Data
Dec. 13, 2001 (JP) ............... P.2001-380104
Dec. 13, 2001 (JP) ............... P.2001-380105

(51) Int. Cl.
*G03C 1/00* (2006.01)

(52) U.S. Cl. ............... 430/270.1; 430/905; 430/913; 430/914

(58) Field of Classification Search ............... 430/270.1, 430/905, 921
See application file for complete search history.

(56) References Cited

U.S. PATENT DOCUMENTS

| | | | |
|---|---|---|---|
| 5,585,507 A | 12/1996 | Nakano et al. | |
| 6,013,416 A | 1/2000 | Nozaki et al. | |
| 6,147,249 A * | 11/2000 | Watanabe et al. | 560/120 |
| 6,808,862 B2 * | 10/2004 | Kodama | 430/270.1 |
| 6,858,370 B2 * | 2/2005 | Kodama et al. | 430/270.1 |
| 6,858,379 B2 * | 2/2005 | Zampini et al. | 430/325 |
| 2003/0036016 A1 * | 2/2003 | Szmanda et al. | 430/270.1 |

FOREIGN PATENT DOCUMENTS

| | | |
|---|---|---|
| EP | 0 709 736 A1 | 5/1996 |
| EP | 1 041 442 A1 | 10/2000 |
| EP | 1 113 334 A1 | 7/2001 |
| EP | 1 207 423 A1 | 5/2002 |
| EP | 1 243 968 A2 | 9/2002 |
| EP | 1 275 666 A1 | 1/2003 |
| WO | WO 00/17712 | 3/2000 |
| WO | WO 01/74916 A1 | 10/2001 |
| WO | WO 02/084401 | 10/2002 |

OTHER PUBLICATIONS

XP-002189552, Seiji Nagahara et al., Methods to Improve Radiation Sensitivity of Chemically Amplified Resists by Using Chain Reactions of Acid Generation, (2003), vol. 3999, No. 1, pp. 386-394.

(Continued)

*Primary Examiner*—Amanda C. Walke
(74) *Attorney, Agent, or Firm*—Sughrue Mion, PLLC.

(57) ABSTRACT

A positive resist composition comprising (A) a fluorine group-containing resin, which has a structure substituted with a fluorine atom in the main chain and/or side chain of polymer skeleton and a group that is decomposed by the action of an acid to increase solubility in an alkali developer and (B) an acid generator capable of generating an acid upon irradiation of an actinic ray or radiation, and the acid generator of (B) is a compound selected from a sulfonium salt containing no aromatic ring and a compound having a phenacylsulfonium salt structure.

40 Claims, 1 Drawing Sheet

OTHER PUBLICATIONS

XP-002226914, Dirk Schmaljohann et al., Design Strategies for 157 nm Single-Layer Photoresists: Lithographic Evaluation of a Poly($\alpha$-trifluoromethyl vinyl alcohol) Copol.ymer, (2000), vol. 3999, No. 1, pp. 330-333.

XP-002193904, Michael K. Crawford et al., New Materials for 157 nm Photoresists: Characterization and Properties, (2000), vol. 3999, pp. 357-364.

XP-002200721, Kyle Patterson et al., Polymers for 157 nm Photoresists Applications: A Progress Report, (2000), vol. 3999, No. 1, pp. 365-374.

XP-002149583, T.M. Bloomstein, Critical Issues in 157 nm Lithography, (1998), vol. 16, No. 6, pp. 3154-3157.

European Search Report dated Mar. 27, 2003.

Patent Abstracts of Japan (Oct. 20, 2000)—JP 2000 292917.

European Search Report dated Jun. 6, 2003.

\* cited by examiner

POSITIVE RESIST COMPOSITION

FIELD OF THE INVENTION

The present invention relates to a positive resist composition suitably used in a microlithography process, for example, the production of VLSI and high capacity microtips, and in other photofabrication processes. More particularly, the present invention relates to a positive resist composition capable of forming a highly precise pattern using a vacuum ultraviolet ray of not more than 160 nm as a light source for exposure.

BACKGROUND OF THE INVENTION

The degree of integration of integrated circuits has recently become much higher, and the processing of ultra-fine patterns having a line width of a quarter micron or below is required in the production of semiconductor substrate, for example, VSLI. It is known to make an exposure light source for use in the production of resist pattern shorter as one means for the formation of fine pattern.

For instance, in the production of semiconductor device having the degree of integration up to 64 Mbits, an i-line (365 nm) of high pressure mercury lamp has been employed as the light source. As a positive resist corresponding to the light source, a large number of compositions containing a novolak resin and a naphthoquinone diazide compound as a photosensitive substance have been developed. These compositions have achieved full success in the processing of linewidth up to about 0.3 µm. Also, in the production of semiconductor device having the degree of integration of 256 Mbits or more, a KrF excimer laser beam (248 nm) is employed as the light source in place of the i-line.

In recent years, for the purpose of the production of semiconductor device having the degree of integration of 1 Gbit or more, as a light source having shorter wavelength, the use of an ArF excimer laser beam (193 nm) and further, the use of an F2 excimer laser beam (157 nm) in order to form a pattern of not more than 0.1 µm have been investigated.

In response to such a trend of using light source having a shorter wavelength, constituents of the resist materials and structure of compounds used for the constituents have been greatly changed. Specifically, since the conventional resist material containing a novolak resin and a naphthoquinone diazide compound has a large absorption in a far ultraviolet region of around 248 nm, it is hard for the exposure light to adequately reach to the bottom of resist layer. As a result, the resist material has low sensitivity and can merely provide a tapered pattern.

In order to resolve such problems, a composition in which a resin including a basic skeleton of poly (hydroxystyrene) that has a small absorption in the region of around 248 nm and being protected by an acid-decomposable group is used as the main component and a compound that generates an acid upon irradiation of a far ultraviolet ray (a photo-acid generator) is used in combination, that is a so-called chemical amplification resist has been developed. The chemical amplification resist has high sensitivity and can form a pattern of high resolution because the solubility thereof in a developer is changed by a catalytic decomposition reaction of an acid generated in the irradiated area.

However, in case of using an ArF excimer laser beam (193 nm), the above-described chemical amplification resist is still in sufficient for providing satisfactory performances since a compound containing an aromatic group essentially has a large absorption in the region of around 193 nm.

In order to solve the problem, improvement of the chemical amplification resist has been made by replacing the acid-decomposable resin including a basic skeleton of poly (hydroxystyrene) with an acid-decomposable resin in which an alicyclic structure that does not have an absorption in the region of around 193 nm is introduced into the main chain or side chain thereof.

It has been found in case of using an F2 excimer laser beam (157 nm), however, that since the above-described alicyclic group-containing resin still has a large absorption in the region of around 157 nm, it is insufficient for obtaining the desired pattern of not more than 0.1 µm. In the circumstances, it is reported that a resin having a fluorine atom (a perfluoro structure) introduced therein has sufficient transparency in the region of around 157 nm in Proc. SPIE., Vol. 3678, Page 13 (1999). Structures of effective fluorine resins are also proposed, for example, in Proc. SPIE., Vol. 3999, page 330 (2000), ibid., page 357 (2000), ibid., page 365 (2000) and WO 00/17712.

However, a resist containing such a fluorine resin is not always satisfactory with respect to dry etching resistance. It is also desired to improve a coating property (uniformity of coated surface) caused by the unique water-repellent and oil-repellent properties due to the perfluoro structure and to prevent development defect.

Further, when the resolution of lithography comes close to the limit in accordance with the miniaturization of processing size of pattern, it is difficult to ensure sufficient defocus latitude. Thus, a resist having a broad defocus latitude has been desired. The term "resist having a broad defocus latitude" means a resist in which variation of linewidth based on the defocus is small.

Moreover, when a contrast of image formation becomes poor in accordance with the miniaturization of processing size of pattern, a boundary region between the exposed area and the unexposed area becomes fuzzy and uniformity of edge of line pattern (line edge roughness) remarkably gets worth. Thus, solution of such a problem has also been desired.

SUMMARY OF THE INVENTION

Therefore, an object of the present invention is to provide a positive resist composition suitable for using an exposure light source having a wavelength of not more than 160 nm, particularly an F2 excimer laser beam (157 nm).

Another object of the present invention is to provide a positive resist composition, which exhibits sufficient transmittancy in case of using an exposure light source of 157 nm and has a broad defocus latitude.

A further object of the present invention is to provide a positive resist composition, which exhibits sufficient transmittancy in case of using an exposure light source of 157 nm, has a broad defocus latitude, and forms a resist film that is substantially completely dissolved upon development with a developer without concerns about photocrosslinking.

A still further object of the present invention is to provide a positive resist composition, which exhibits sufficient transmittancy in case of using an exposure light source of 157 nm, has a broad defocus latitude, and reduces the degree of line edge roughness.

Other objects of the present invention will become apparent from the following description.

As a result of the intensive investigations on the above-described performances of positive resist composition, it has been found that the objects of the present invention are accomplished by using the specific composition described below to complete the present invention.

Specifically, the present invention has the following configuration.

(1) A positive resist composition comprising (A) a fluorine group-containing resin, which has a structure substituted with a fluorine atom in the main chain and/or side chain of polymer skeleton and a group that is decomposed by the action of an acid to increase solubility in an alkali developer and (B) an acid generator capable of generating an acid upon irradiation of an actinic ray or radiation, and the acid generator of (B) is a compound selected from a sulfonium salt containing no aromatic ring and a compound having a phenacylsulfonium salt structure.

DETAILED DESCRIPTION OF THE INVENTION

Figure 1:
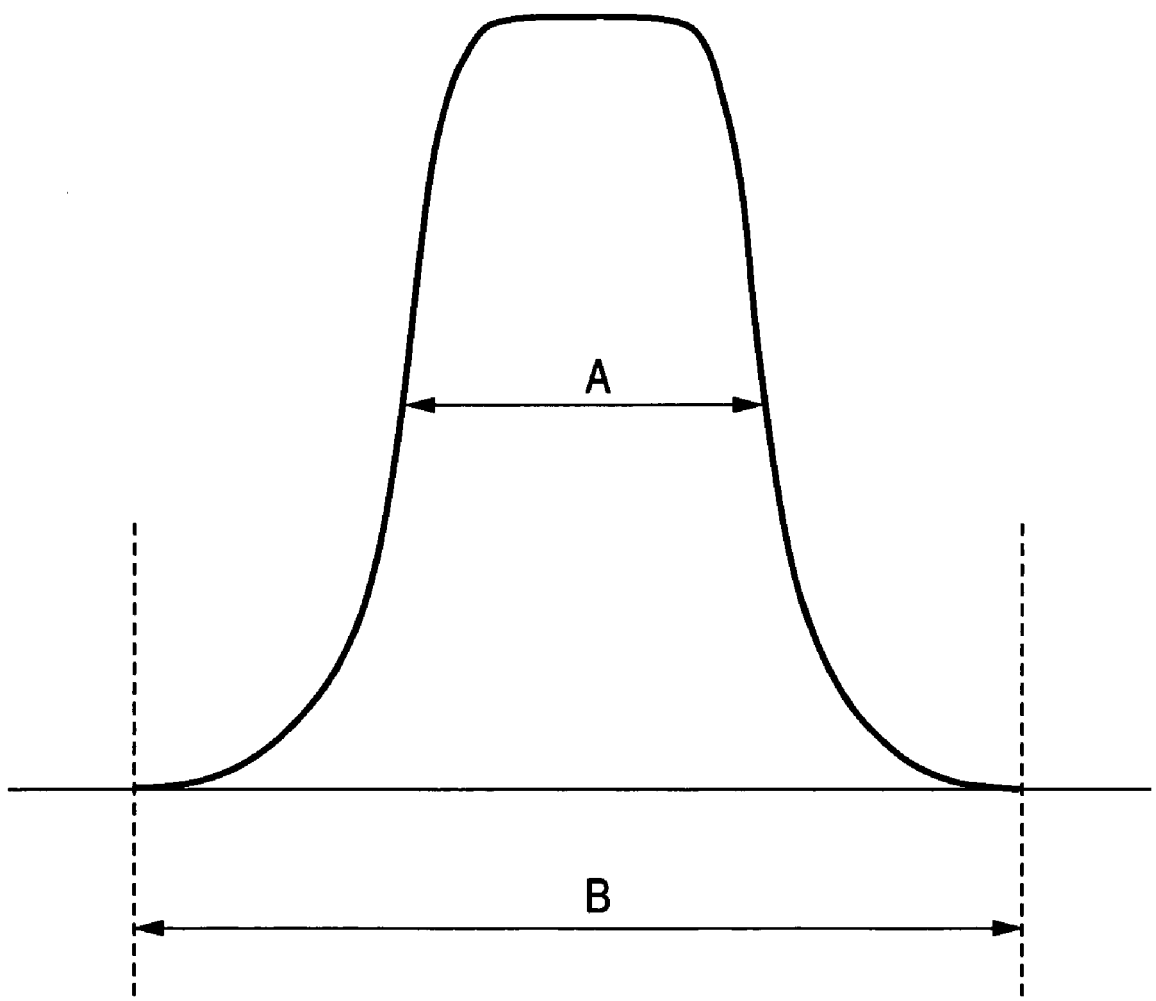
FIG. 1 is a view showing a footing profile of resist pattern for the evaluation in the present invention.

The present invention also includes the following preferred embodiments.

(2) The positive resist composition as described in item (1) above, wherein the fluorine group-containing resin of (A) is a resin containing at least one moiety selected from a perfluoroalkylene group and a perfluoroarylene group in the main chain of polymer skeleton or a resin containing at least one moiety selected from a perfluoroalkyl group, a perfluoroaryl group, a hexafluoro-2-propanol group and a group obtained by protecting the hydroxy group of hexafluoro-2-propanol group in the side chain of polymer skeleton.

(3) The positive resist composition as described in item (1) or (2) above, wherein the fluorine group-containing resin of (A) has at least one of repeating units represented by the following formulae (I) to (X):

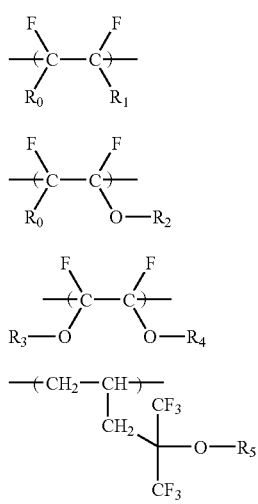

(V)

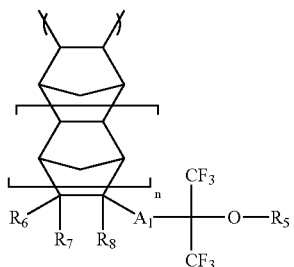

(VI)

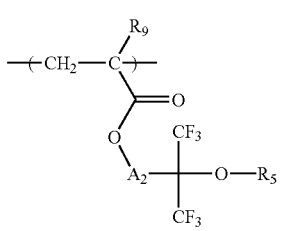

(VII)

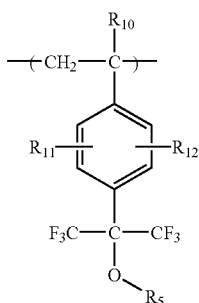

(VIII)

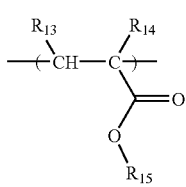

(IX)

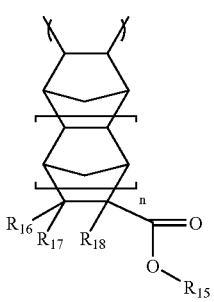

(X)

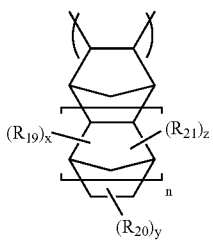

wherein $R_0$ and $R_1$ each represent a hydrogen atom, a fluorine atom, an alkyl group which may have a substituent, a perfluoroalkyl group which may have a substituent, a cycloalkyl group which may have a substituent or an aryl group which may have a substituent; $R_2$ to $R_4$ each represent an alkyl group which may have a substituent, a perfluoroalkyl group which may have a substituent, a cycloalkyl group which may have a substituent or an aryl group which may have a substituent; or $R_0$ and $R_1$, $R_0$ and $R_2$ or $R_3$ and $R_4$ may be combined with each other to form a ring; $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represent a hydrogen atom, a halogen atom, an alkyl group which may have a substituent, a perfluoroalkyl group which may have a substituent or an alkoxy group which may have a substituent; $R_9$ and $R_{10}$, which may be the same or different, each represent a hydrogen atom, a halogen atom, a cyano group, an alkyl group which may have a substituent or a haloalkyl group which may have a substituent; $R_{11}$ and $R_{12}$, which may be the same or different, each represent a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent; $R_{13}$ and $R_{14}$, which may be the same or different, each represent a hydrogen atom, a halogen atom, a cyano group, an alkyl group which may have a substituent or a haloalkyl group which may have a substituent; $R_{15}$ represents an alkyl group having a fluorine atom, a monocyclic or polycyclic cycloalkyl group having a fluorine atom, an alkenyl group having a fluorine atom, an aralkyl group having a fluorine atom or an aryl group having a fluorine atom; $R_{16}$, $R_{17}$ and $R_{18}$, which may be the same or different, each represent a hydrogen atom, a halogen atom, a cyano group, an alkyl group which may have a substituent, a perfluoroalkyl group which may have a substituent, an alkoxy group which may have a substituent or —CO—O—$R_{15}$; $R_{19}$, $R_{20}$ and $R_{21}$, which may be the same or different, each represent a hydrogen atom, a fluorine atom, an alkyl group having a fluorine atom, a monocyclic or polycyclic cycloalkyl group having a fluorine atom, an alkenyl group having a fluorine atom, an aralkyl group having a fluorine atom, an aryl group having a fluorine atom or an alkoxy group having a fluorine atom, provided that at least one of $R_{19}$, $R_{20}$ and $R_{21}$ is a substituent other than a hydrogen atom; $A_1$ and $A_2$ each represent a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represent a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; n represents 0 or 1; and x, y and z each represent an integer of from 0 to 4.

(4) The positive resist composition as described in any one of items (1) to (3) above, wherein the fluorine group-containing resin of (A) further has at least one of repeating units represented by the following formulae (XI) to (XIII):

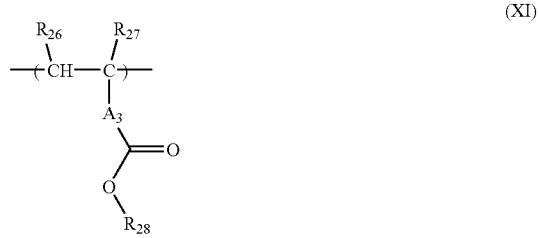

(XI)

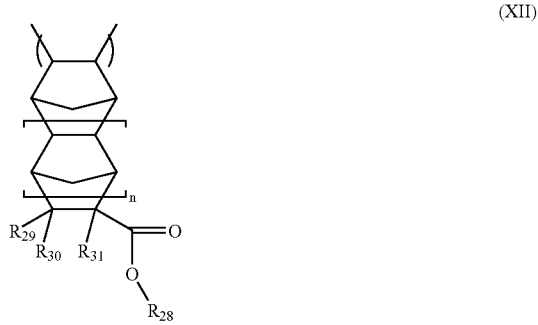

(XII)

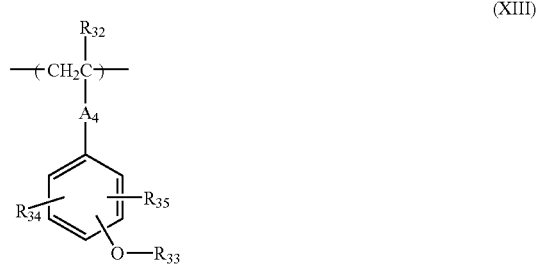

(XIII)

wherein $R_{26}$, $R_{27}$ and $R_{32}$, which may be the same or different, each represent a hydrogen atom, a halogen atom, a cyano group, an alkyl group which may have a substituent or a haloalkoxy group which may have a substituent; $R_{28}$ and $R_{33}$ each represent —C($R_{36}$)($R_{37}$)($R_{38}$), —C($R_{36}$)($R_{37}$)(O$R_{39}$) or a group represented by the following formula (XIV):

(XIV)

wherein $R_{29}$, $R_{30}$ and $R_{31}$, which may be the same or different, each represent a hydrogen atom, a halogen atom, a cyano group, an alkyl group which may have a substituent, a perfluoroalkyl group which may have a substituent, an alkoxy group which may have a substituent or —CO—O—$R_{28}$; $R_{34}$ and $R_{35}$, which may be the same or different, each represent a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent;

$R_{36}$, $R_{37}$, $R_{38}$ and $R_{39}$, which may be the same or different, each represent an alkyl group which may have a substituent, a cycloalkyl group which may have a substituent, an alkenyl group which may have a substituent, an alkynyl group which may have a substituent, an aralkyl group which may have a substituent or an aryl group which may have a substituent; or two of $R_{36}$, $R_{37}$ and $R_{38}$ or two of $R_{36}$, $R_{37}$ and $R_{39}$ may be combined with each other to form a ring which may contain an oxo group; $R_{40}$ represents an alkyl group which may have a substituent, a cycloalkyl group which may have a substituent, an alkenyl group which may have a substituent, an alkynyl group which may have a substituent, an aralkyl group which may have a substituent or an aryl group which may have a substituent; $A_3$ and $A_4$ each represent a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represent a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; Z represents an atomic group necessary for forming a monocyclic or polycyclic alicyclic group together with the carbon atom; and n represents 0 or 1.

(5) The positive resist composition as described in any one of items (1) to (4) above, wherein the fluorine group-containing resin of (A) further has at least one of repeating units represented by the following formulae (XV) to (XVII):

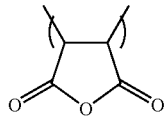

(XV)

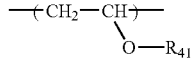

(XVI)

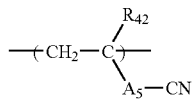

(XVII)

wherein $R_{41}$ represents an alkyl group which may have a substituent, a cycloalkyl group which may have a substituent, an aralkyl group which may have a substituent or an aryl group which may have a substituent; $R_{42}$ represents a hydrogen atom, a halogen atom, a cyano group, an alkyl group which may have a substituent or a haloalkyl group which may have a substituent; $A_5$ represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represent a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent.

(6) The positive resist composition as described in any one of items (1) to (5) above, wherein the fluorine group-containing resin of (A) has at least one of repeating units represented by the following formulae (I) to (III) and at least one of repeating units represented by the following formulae (IV) to (VI):

(I)

(II)

(III)

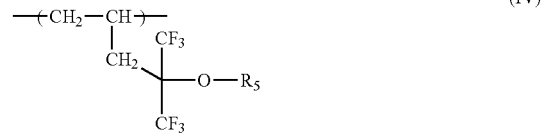

(IV)

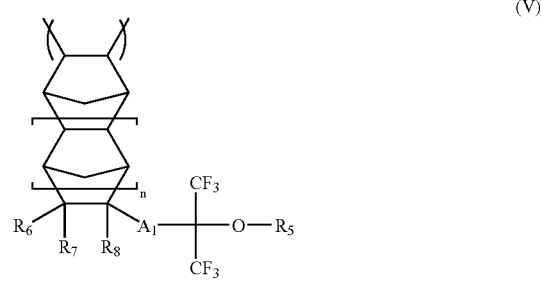

(V)

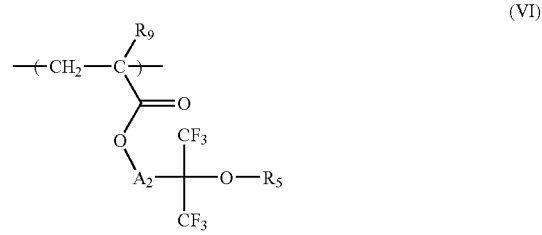

(VI)

wherein $R_0$ and $R_1$ each represent a hydrogen atom, a fluorine atom, an alkyl group which may have a substituent, a perfluoroalkyl group which may have a substituent, a cycloalkyl group which may have a substituent or an aryl group which may have a substituent; $R_2$ to $R_4$ each represent an alkyl group which may have a substituent, a perfluoroalkyl group which may have a substituent, a cycloalkyl group which may have a substituent or an aryl group which may have a substituent; or $R_0$ and $R_1$, $R_0$ and $R_2$ or $R_3$ and $R_4$ may be combined with each other to form a ring; $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represent a hydrogen atom, a halogen atom, an alkyl group which may have a substituent, a perfluoroalkyl group which may have a substituent or an alkoxy group which may have a substituent; $R_9$ represents a hydrogen atom, a halogen atom, a cyano group, an alkyl group which may have a substituent or a haloalkyl group which may have a substituent; $A_1$ and $A_2$ each represent a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represent a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; and n represents 0 or 1.

(7) The positive resist composition as described in any one of items (1) to (5) above, wherein the fluorine group-containing resin of (A) has at least one of repeating units represented by the following formulae (IV) to (VI) and at least one of repeating units represented by the following formulae (VIII) to (X):

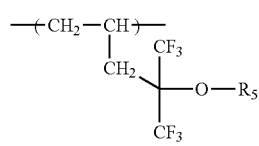

(IV)

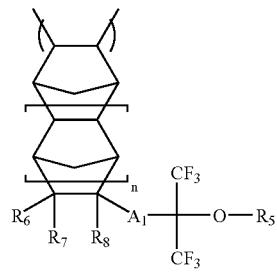

(V)

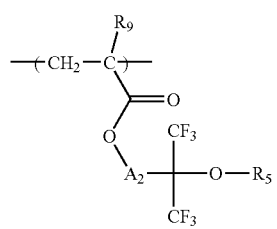

(VI)

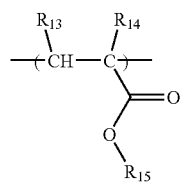

(VIII)

-continued

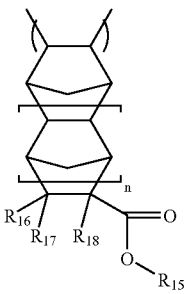

(IX)

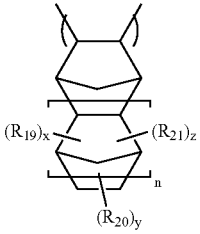

(X)

wherein $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represent a hydrogen atom, a halogen atom, an alkyl group which may have a substituent, a perfluoroalkyl group which may have a substituent or an alkoxy group which may have a substituent; $R_9$ represents a hydrogen atom, a halogen atom, a cyano group, an alkyl group which may have a substituent or a haloalkyl group which may have a substituent; $R_{13}$ and $R_{14}$, which may be the same or different, each represent a hydrogen atom, a halogen atom, a cyano group, an alkyl group which may have a substituent or a haloalkyl group which may have a substituent; $R_{15}$ represents an alkyl group having a fluorine atom, a monocyclic or polycyclic cycloalkyl group having a fluorine atom, an alkenyl group having a fluorine atom, an aralkyl group having a fluorine atom or an aryl group having a fluorine atom; $R_{16}$, $R_{17}$ and $R_{18}$, which may be the same or different, each represent a hydrogen atom, a halogen atom, a cyano group, an alkyl group which may have a substituent, a perfluoroalkyl group which may have a substituent, an alkoxy group which may have a substituent or —CO—O—$R_{15}$; $R_{19}$, $R_{20}$ and $R_{21}$, which may be the same or different, each represent a hydrogen atom, a fluorine atom, an alkyl group having a fluorine atom, a monocyclic or polycyclic cycloalkyl group having a fluorine atom, an alkenyl group having a fluorine atom, an aralkyl group having a fluorine atom, an aryl group having a fluorine atom or an alkoxy group having a fluorine atom, provided that at least one of $R_{19}$, $R_{20}$ and $R_{21}$ is a substituent other than a hydrogen atom; $A_1$ and $A_2$ each represent a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represent a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; n represents 0 or 1; and x, y and z each represent an integer of from 0 to 4.

(8) The positive resist composition as described in any one of items (1) to (5) above, wherein the fluorine group-containing resin of (A) has at least one of repeating units represented by the following formulae (IV) to (VII) and at least one of repeating units represented by the following formulae (XV) to (XVII):

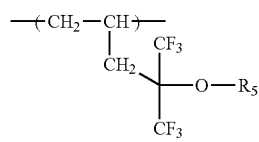
(IV)

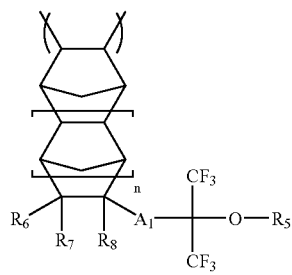
(V)

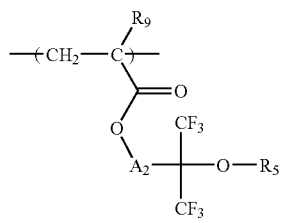
(VI)

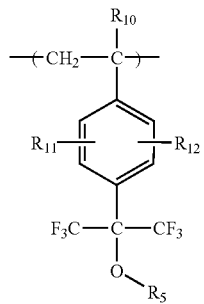
(VII)

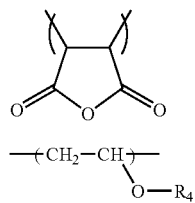
(XV)

(XVI)

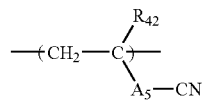
(XVII)

wherein $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represent a hydrogen atom, a halogen atom, an alkyl group which may have a substituent, a perfluoroalkyl group which may have a substituent or an alkoxy group which may have a substituent; $R_9$ and $R_{10}$ which may be the same or different, each represent a hydrogen atom, a halogen atom, a cyano group, an alkyl group which may have a substituent or a haloalkyl group which may have a substituent; $R_{11}$ and $R_{12}$, which may be the same or different, each represent a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent; $A_1$ and $A_2$ each represent a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represent a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; n represents 0 or 1; $R_{41}$ represents an alkyl group which may have a substituent, a cycloalkyl group which may have a substituent, an aralkyl group which may have a substituent or an aryl group which may have a substituent; $R_{42}$ represents a hydrogen atom, a halogen atom, a cyano group, an alkyl group which may have a substituent or a haloalkyl group which may have a substituent; and $A_5$ represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—.

(9) The positive resist composition as described in item (1) above, wherein the fluorine group-containing resin of (A) is a resin having at least one repeating unit represented by the following formula (IA) and at least one repeating unit represented by the following formula (IIA):

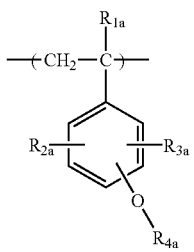

(IA)

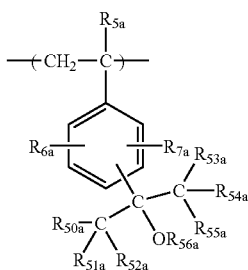

(IIA)

wherein $R_{1a}$ and $R_{5a}$, which may be the same or different, each represent a hydrogen atom, a halogen atom, a cyano group or an alkyl group which may have a substituent; $R_{2a}$, $R_{3a}$, $R_{6a}$ and $R_{7a}$, which may be the same or different, each represent a hydrogen atom, a halogen atom, a cyano group, a hydroxy group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{50a}$ to $R_{55a}$, which may be the same or different, each represent a hydrogen atom, a fluorine atom or an alkyl group which may have a substituent, provided that at least one of $R_{50a}$ to $R_{55a}$ represents a fluorine atom or an alkyl group in which at least one of the hydrogen atoms is substituted with a fluorine atom; $R_{56a}$ represents a hydrogen atom, an alkyl group which may have a substituent, a cycloalkyl group which may have a substituent, an acyl group which may have a substituent or an alkoxycarbonyl group which may have a substituent; $R_{4a}$ represents a group represented by the following formula (IVA) or (VA):

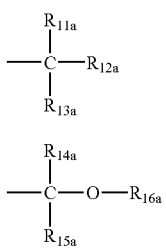

(IVA)

(VA)

wherein $R_{11a}$, $R_{12a}$ and $R_{13a}$, which may be the same or different, each represent an alkyl group which may have a substituent, a cycloalkyl group which may have a substituent, an alkenyl group which may have a substituent, an aralkyl group which may have a substituent or an aryl group which may have a substituent; $R_{14a}$ and $R_{15a}$, which may be the same or different, each represent a hydrogen atom or an alkyl group which may have a substituent; $R_{16a}$ represents an alkyl group which may have a substituent, a cycloalkyl group which may have a substituent, an aralkyl group which may have a substituent or an aryl group which may have a substituent; or two of $R_{14a}$ to $R_{16a}$ may be combined with each other to form a ring.

(10) The positive resist composition as described in item (1) above, wherein the fluorine group-containing resin of (A) is a resin having at least one repeating unit represented by the following formula (IIA) and at least one repeating unit represented by the following formula (VIA):

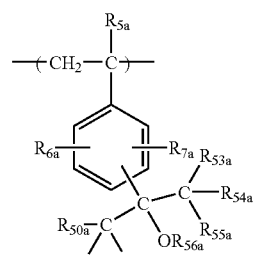

(IIA)

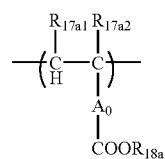

(VIA)

wherein $R_{5a}$ represents a hydrogen atom, a halogen atom, a cyano group or an alkyl group which may have a substituent; $R_{6a}$ and $R_{7a}$, which may be the same or different, each represent a hydrogen atom, a halogen atom, a cyano group, a hydroxy group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{50a}$ to $R_{55a}$, which may be the same or different, each represent a hydrogen atom, a fluorine atom or an alkyl group which may have a substituent, provided that at least one of $R_{50a}$ to $R_{55a}$ represents a fluorine atom or an alkyl group in which at least one of the hydrogen atoms is substituted with a fluorine atom; $R_{56a}$ represents a hydrogen atom, an alkyl group which may have a substituent, a cycloalkyl group which may have a substituent, an acyl group which may have a substituent or an alkoxycarbonyl group which may have a substituent; $R_{17a1}$ and $R_{17a2}$, which may be the same or different, each represent a hydrogen atom, a halogen atom, a cyano group or an alkyl group which may have a substituent; $R_{18a}$ represents —C($R_{18a1}$)($R_{18a2}$)($R_{18a3}$) or —C($R_{18a1}$)($R_{18a2}$)(O$R_{18a4}$); $R_{18a1}$ to $R_{18a4}$, which may be the same or different, each represent a hydrogen atom, an alkyl group which may have a substituent, a cycloalkyl group which may have a substituent, an alkenyl group which may have a substituent, an aralkyl group which may have a substituent or an aryl group which may have a substituent; or two of $R_{18a1}$, $R_{18a2}$ and $R_{18a3}$ or two of $R_{18a1}$, $R_{18a2}$ and $R_{18a4}$ may be combined with each other to form a ring; and $A_0$ represents a single bond or a divalent connecting group which may have a substituent.

(11) The positive resist composition as described in item (10) above, wherein $R_{18a}$ in formula (VIA) is a group represented by the following formula (VIA-A):

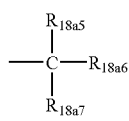

(VIA-A)

wherein $R_{18a5}$ and $R_{18a6}$, which may be the same or different, each represent an alkyl group which may have a substituent; and $R_{18a7}$ represents a cycloalkyl group which may have a substituent.

(12) The positive resist composition as described in item (10) above, wherein $R_{18a}$ in formula (VIA) is a group represented by the following formula (VIA-B):

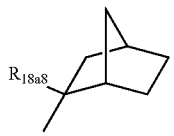

(VIA-B)

wherein $R_{18a8}$ represents an alkyl group which may have a substituent, an alkenyl group which may have a substituent, an alkynyl group which may have a substituent, an aralkyl group which may have a substituent or an aryl group which may have a substituent.

(13) The positive resist composition as described in item (9) or (10) above, wherein at least one of $R_{1a}$ in formula (IA), $R_{5a}$ in formula (IIA) and $R_{17a2}$ in formula (VIA) is a trifluoromethyl group.

(14) The positive resist composition as described in any one of items (9) to (13) above, wherein the fluorine group-containing resin of (A) further has at least one of repeating units represented by the following formulae (IIIA) and (VIIA):

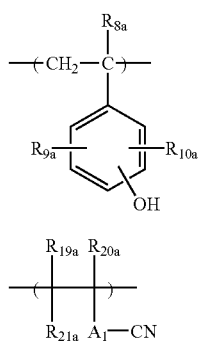

(IIIA)

(VIIA)

wherein $R_{8a}$ represents a hydrogen atom, a halogen atom, a cyano group or an alkyl group which may have a substituent; $R_{9a}$ and $R_{10a}$, which may be the same or different, each represent a hydrogen atom, a halogen atom, a cyano group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{19a}$ and $R_{20a}$, which may be the same or different, each represent a hydrogen atom, a halogen atom, a cyano group or an alkyl group which may have a substituent; $R_{21a}$ represent a hydrogen atom, a halogen atom, an alkyl group which may have a substituent or a group of —$A_1$—CN wherein $A_1$ represents a single bond or a divalent connecting group.

(15) The positive resist composition as described in any one of items (1) to (14) above, which further comprises (C) a silicon-based and/or fluorine-based surface active agent.

(16) The positive resist composition as described in any one of items (1) to (15) above, which further comprises a compound having a basic nitrogen atom as (D) an acid diffusion inhibiting agent.

(17) The positive resist composition as described in any one of items (1) to (16) above, wherein the acid generator of (B) is a compound selected from a sulfonium salt or iodonium salt, which generates a perfluoroalkylsulfonic acid having at least 2 carbon atoms, a perfluoroarylsulfonic acid or an arylsulfonic acid substituted with a perfluoroalkyl group upon irradiation of an actinic ray or radiation.

(18) The positive resist composition as described in any one of items (1) to (17) above, which is used a vacuum ultraviolet ray of not more than 160 nm as a light source for exposure.

Now, the compounds for use in the positive resist composition of the present invention are described in detail below.

[1] Fluorine Group-Containing Resin of Component (A) of the Present Invention:

The fluorine group-containing resin of Component (A) of the present invention is a resin characterized by having a structure substituted with a fluorine atom in the main chain and/or side chain of polymer skeleton and a group that is decomposed by the action of an acid to increase solubility in an alkali developer. The fluorine group-containing resin is preferably a resin containing at least one moiety selected from a perfluoroalkylene group and a perfluoroarylene group in the main chain of polymer skeleton or a resin containing at least one moiety selected from a perfluoroalkyl group, a perfluoroaryl group, a hexafluoro-2-propanol group and a group obtained by protecting the hydroxy group of hexafluoro-2-propanol group in the side chain of polymer skeleton.

Specifically, the fluorine group-containing resin containing an acid-decomposable group has at least one of repeating units represented by formulae (I) to (X). Preferably, the fluorine group-containing resin further has at least one of repeating units represented by formulae (XI) to (XIII).

The fluorine group-containing resin may have at least one of repeating units derived from maleic anhydride, vinyl ether and a vinyl compound containing a cyano group and represented by formula (XV) to (XVII) respectively in order to adjust characteristics of the resin, for example, a hydrophilic/hydrophobic property, a glass transition point or transmittancy to exposure light, or to control a polymerization property at the synthesis of the resin.

In the formulae, $R_0$ and $R_1$ each represent a hydrogen atom, a fluorine atom, an alkyl group which may have a substituent, a perfluoroalkyl group which may have a substituent, a cycloalkyl group which may have a substituent or an aryl group which may have a substituent.

The term "perfluoroalkyl group which has a substituent" as used herein means a perfluoroalkyl group in which one or more of the fluorine atoms are substituted with other atoms and/or groups.

$R_2$ to $R_4$ each represent an alkyl group which may have a substituent, a perfluoroalkyl group which may have a substituent, a cycloalkyl group which may have a substituent or an aryl group which may have a substituent. Alternatively, $R_0$ and $R_1$, $R_0$ and $R_2$ or $R_3$ and $R_4$ may be combined with each other to form a ring.

$R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent.

$R_6$, $R_7$ and $R_8$, which may be the same or different, each represent a hydrogen atom, a halogen atom, an alkyl group which may have a substituent, a perfluoroalkyl group which may have a substituent or an alkoxy group which may have a substituent.

$R_9$ and $R_{10}$, which may be the same or different, each represent a hydrogen atom, a halogen atom, a cyano group, an alkyl group which may have a substituent or a haloalkyl group which may have a substituent.

$R_{11}$ and $R_{12}$, which may be the same or different, each represent a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent.

$R_{13}$ and $R_{14}$, which may be the same or different, each represent a hydrogen atom, a halogen atom, a cyano group, an alkyl group which may have a substituent or a haloalkyl group which may have a substituent.

$R_{15}$ represents an alkyl group having a fluorine atom, a monocyclic or polycyclic cycloalkyl group having a fluorine atom, an alkenyl group having a fluorine atom, an aralkyl group having a fluorine atom or an aryl group having a fluorine atom.

$R_{16}$, $R_{17}$ and $R_{18}$, which may be the same or different, each represent a hydrogen atom, a halogen atom, a cyano group, an alkyl group which may have a substituent, a perfluoroalkyl group which may have a substituent, an alkoxy group which may have a substituent or —CO—O—$R_{15}$.

$R_{19}$, $R_{20}$ and $R_{21}$, which may be the same or different, each represent a hydrogen atom, a fluorine atom, an alkyl group having a fluorine atom, a monocyclic or polycyclic cycloalkyl group having a fluorine atom, an alkenyl group having a fluorine atom, an aralkyl group having a fluorine atom, an aryl group having a fluorine atom or an alkoxy group having a fluorine atom, provided that at least one of $R_{19}$, $R_{20}$ and $R_{21}$ is a substituent other than a hydrogen atom.

$A_1$ and $A_2$ each represent a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—.

$R_{22}$, $R_{23}$ and $R_{25}$, which may be the same or different, each represent a single bond or a divalent group selected from an alkylene group, an alkenylene group, a cycloalkylene group and an arylene group, each of which may have an ether group, an ester group, an amido group, a urethane group or a ureido group.

$R_{24}$ represents a hydrogen atom, an alkyl group which may have a substituent, a cycloalkyl group which may have a substituent, an aralkyl group which may have a substituent or an aryl group which may have a substituent.

$R_{26}$, $R_{27}$ and $R_{32}$, which may be the same or different, each represent a hydrogen atom, a halogen atom, a cyano group, an alkyl group which may have a substituent or a haloalkoxy group which may have a substituent.

$R_{28}$ and $R_{33}$ each represent —C($R_{36}$)($R_{37}$)($R_{38}$), —C($R_{36}$)($R_{37}$)(O$R_{39}$) or a group represented by the above-described formula (XIV).

$R_{29}$, $R_{30}$ and $R_{31}$, which may be the same or different, each represent a hydrogen atom, a halogen atom, a cyano group, an alkyl group which may have a substituent, a perfluoroalkyl group which may have a substituent, an alkoxy group which may have a substituent or —CO—O—$R_{28}$.

$R_{34}$ and $R_{35}$, which may be the same or different, each represent a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent.

$R_{36}$, $R_{37}$, $R_{38}$ and $R_{39}$, which may be the same or different, each represent an alkyl group which may have a substituent, a cycloalkyl group which may have a substituent, an alkenyl group which may have a substituent, an alkynyl group which may have a substituent, an aralkyl group which may have a substituent or an aryl group which may have a substituent. Alternatively, two of $R_{36}$, $R_{37}$ and $R_{38}$ or two of $R_{36}$, $R_{37}$ and $R_{39}$ may be combined with each other to form a ring. The ring formed may also contain an oxo group.

$R_{40}$ represents an alkyl group which may have a substituent, a cycloalkyl group which may have a substituent, an alkenyl group which may have a substituent, an alkynyl group which may have a substituent, an aralkyl group which may have a substituent or an aryl group which may have a substituent.

$A_3$ and $A_4$ each represent a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—.

Z represents an atomic group necessary for forming a monocyclic or polycyclic alicyclic group together with the carbon atom.

$R_{41}$ represents an alkyl group which may have a substituent, a cycloalkyl group which may have a substituent, an aralkyl group which may have a substituent or an aryl group which may have a substituent.

$R_{42}$ represents a hydrogen atom, a halogen atom, a cyano group, an alkyl group which may have a substituent or a haloalkyl group which may have a substituent.

$A_5$ represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—.

n represents 0 or 1, and x, y and z each represent an integer of from 0 to 4.

More preferred fluorine-group containing resin of Component (A) for use in the present invention includes a resin having at least one repeating unit represented by formula (IA) described above and at least one repeating unit represented by formula (IIA) described above and a resin having at least one repeating unit represented by formula (IIA) described above and at least one repeating unit represented by formula (VIA) described above. These fluorine-group containing resins of Component (A) may further has at least one repeating unit represented by formula (IIIA) or (VIIA) described above. Of these fluorine-group containing resins of Component (A), it is preferred that $R_{18a}$ in formula (VIA) is a group represented by formula (VIA-A) or (VIA-B) described above. Of these fluorine-group containing resins of Component (A), it is also preferred that at least one of $R_{1a}$ in formula (IA), $R_{5a}$ in formula (IIA) and $R_{17a2}$ in formula (VIA) is a trifluoromethyl group.

The fluorine-group containing resin of Component (A) having at least one repeating unit represented by formula (IA) and at least one repeating unit represented by formula (IIA) and the fluorine-group containing resin of Component (A) having at least one repeating unit represented by formula (IIA) and at least one repeating unit represented by formula (VIA) may further have a repeating unit represented by any one of formulae (I) to (V).

In formulae (IA) and (IIA), $R_{1a}$ and $R_{5a}$, which may be the same or different, each represent a hydrogen atom, a halogen atom, a cyano group or an alkyl group which may have a substituent. $R_{2a}$, $R_{3a}$, $R_{6a}$ and $R_{7a}$, which may be the same or different, each represent a hydrogen atom, a halogen atom, a cyano group, a hydroxy group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent. $R_{50a}$ to $R_{55a}$, which may be the same or different, each represent a hydrogen atom, a fluorine atom or an alkyl group which may have a substituent, provided that at least one of $R_{50a}$ to $R_{55a}$ represents a fluorine atom or an alkyl group in which at least one of the hydrogen atoms is substituted with a fluorine atom. $R_{56a}$ represents a hydrogen atom, an alkyl group which may have a substituent, a cycloalkyl group which may have a substituent, an acyl group which may have a substituent or an alkoxycarbonyl group which may have a substituent. $R_{56a}$ is preferably a hydrogen atom. $R_{4a}$ represents a group represented by formula (IVA) or (VA) described above.

In formula (IVA), $R_{11a}$, $R_{12a}$ and $R_{13a}$, which may be the same or different, each represent an alkyl group which may have a substituent, a cycloalkyl group which may have a substituent, an alkenyl group which may have a substituent, an aralkyl group which may have a substituent or an aryl group which may have a substituent.

In formula (VA), $R_{14a}$ and $R_{15a}$, which may be the same or different, each represent a hydrogen atom or an alkyl group which may have a substituent. $R_{16a}$ represents an alkyl group which may have a substituent, a cycloalkyl group which may have a substituent, an aralkyl group which may have a substituent or an aryl group which may have a substituent, or two of $R_{14a}$ to $R_{16a}$ may be combined with each other to form a ring.

In formula (VIA), $R_{17a1}$ and $R_{17a2}$, which may be the same or different, each represent a hydrogen atom, a halogen atom, a cyano group or an alkyl group which may have a substituent. $R_{18a}$ represents —$C(R_{18a1})(R_{18a2})(R_{18a3})$ or —$C(R_{18a1})(R_{18a2})(OR_{18a4})$. $R_{18a1}$ to $R_{18a4}$, which may be the same or different, each represent a hydrogen atom, an alkyl group which may have a substituent, a cycloalkyl group which may have a substituent, an alkenyl group which may have a substituent, an aralkyl group which may have a substituent or an aryl group which may have a substituent, or two of $R_{18a1}$, $R_{18a2}$ and $R_{18a3}$ or two of $R_{18a1}$, $R_{18a2}$ and $R_{18a4}$ may be combined with each other to form a ring. $A_0$ represents a single bond or a divalent connecting group which may have a substituent. $A_0$ is preferably a single bond.

In formula (VIA-A), $R_{18a5}$ and $R_{18a6}$, which may be the same or different, each represent an alkyl group which may have a substituent. $R_{18a7}$ represents a cycloalkyl group which may have a substituent.

In formula (VIA-B), $R_{18a8}$ represents an alkyl group which may have a substituent, an alkenyl group which may have a substituent, an alkynyl group which may have a substituent, an aralkyl group which may have a substituent or an aryl group which may have a substituent.

In formula (IIIA), $R_{8a}$ represents a hydrogen atom, a halogen atom, a cyano group or an alkyl group which may have a substituent. $R_{9a}$ and $R_{10a}$, which may be the same or different, each represent a hydrogen atom, a halogen atom, a cyano group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent.

In formula (VIIA), $R_{19a}$ and $R_{20a}$, which may be the same or different, each represent a hydrogen atom, a halogen atom, a cyano group or an alkyl group which may have a substituent. $R_{21a}$ represent a hydrogen atom, a halogen atom, an alkyl group which may have a substituent or a group of —$A_1$—CN wherein $A_1$ represents a single bond or a divalent connecting group.

The alkyl group described above preferably includes an alkyl group having from 1 to 8 carbon atoms, specifically, for example, methyl, ethyl, propyl, n-butyl, sec-butyl, hexyl, 2-ethylhexyl or octyl group.

The cycloalkyl group described above may be a monocyclic type or a polycyclic type. The monocyclic type preferably includes that having from 3 to 8 carbon atoms, for example, cyclopropyl, cyclopentyl, cyclohexyl, cycloheptyl or cyclooctyl group. The polycyclic type preferably includes that having from 6 to 20 carbon atoms, for example, adamantyl, norbornyl, isobornyl, camphanyl, dicyclopentyl, α-pinenyl, tricyclodecanyl, tetracyclododecyl or androstanyl group. The carbon atom in the monocyclic or polycyclic cycloalkyl group may be replaced by a hetero atom, for example, an oxygen atom.

The perfluoroalkyl group described above preferably includes a perfluoroalkyl group having from 4 to 12 carbon atoms, specifically, for example, perfluorobutyl, perfluorohexyl, perfluorooctyl, perfluorooctylethyl or perfluorododecyl group.

The haloalkyl group described above preferably includes a haloalkyl group having from 1 to 4 carbon atoms, specifically, for example, chloromethyl, chloropropyl, chlorobutyl, bromomethyl or bromoethyl group.

The aryl group described above preferably includes an aryl group having from 6 to 15 carbon atoms, specifically, for example, phenyl, tolyl, dimethylphenyl, 2,4,6-trimethylphenyl, naphthyl, anthryl or 9,10-dimethoxyanthryl group.

The aralkyl group described above preferably includes an aralkyl group having from 7 to 12 carbon atoms, specifically, for example, benzyl, phenethyl or naphthylmethyl group.

The alkenyl group described above preferably includes an alkenyl group having from 2 to 8 carbon atoms, specifically, for example, vinyl, allyl, butenyl or cyclohexenyl group.

The alkoxy group described above preferably includes an alkoxy group having from 1 to 8 carbon atoms, specifically, for example, methoxy, ethoxy, n-propoxy, isopropoxy, butoxy, pentoxy, allyloxy or octoxy group.

The acyl group described above preferably includes an acyl group having from 1 to 10 carbon atoms, specifically, for example, formyl, acetyl, propanoyl, butanoyl, pivaloyl, octanoyl or benzoyl group.

The acyloxy group described above preferably includes an acyloxy group having from 2 to 12 carbon atoms, specifically, for example, acetoxy, propionyloxy or benzoyloxy group.

The alkynyl group described above preferably includes an alkynyl group having from 2 to 5 carbon atoms, specifically, for example, ethynyl, propynyl or butynyl group.

The alkoxycarbonyl group described above includes, for example, isopropoxycarbonyl, tert-butoxycarbonyl, tert-amyloxycarbonyl and 1-methyl-1-cyclohecyloxycarbonyl groups. The alkoxycarbonyl group is preferably a secondary alkoxycarbonyl group and more preferably a tertiary alkoxycarbonyl group.

The halogen atom described above includes, for example, fluorine, chlorine, bromine and iodine atoms.

The alkylene group described above preferably includes an alkylene group having from 1 to 8 carbon atoms, which may have a substituent, specifically, for example, methylene, ethylene, propylene, butylene, hexylene or octylene group.

The alkenylene group described above preferably includes an alkenylene group having from 2 to 6 carbon atoms, which may have a substituent, specifically, for example, ethenylene, propenylene or butenylene group.

The cycloalkylene group described above preferably includes a cycloalkylene group having from 5 to 8 carbon atoms, which may have a substituent, specifically, for example, cyclopentylene or cyclohexylene group.

The arylene group described above preferably includes an arylene group having from 6 to 15 carbon atoms, which may have a substituent, specifically, for example, phenylene, tolylene or naphthylene group.

The divalent connecting group described above includes a divalent group selected from an alkylene group, a cycloalkylene group, an alkenylene group and an arylene group, each of which may have a substituent, —O—CO—$R_{22a}$—, —CO—O—$R_{23a}$— or —CO—N($R_{24a}$)—$R_{25a}$—. $R_{22a}$, $R_{23a}$ and $R_{25a}$, which may be the same or different, each represent a single bond or a divalent group selected from an alkylene group, an alkenylene group, a cycloalkylene group and an arylene group, each of which may have an ether group, an ester group, an amido group, a urethane group or a ureido group. $R_{24}$ represents a hydrogen atom, an alkyl group which may have a substituent, a cycloalkyl group which may have a substituent, an aralkyl group which may have a substituent or an aryl group which may have a substituent.

The ring formed by combining $R_0$ and $R_1$, $R_0$ and $R_2$ or $R_3$ and $R_4$ includes, for example, a 5-membered to 7-membered ring, specifically, for example, pentane, hexane, furan, dioxonol or 1,3-dioxolane ring substituted with fluorine atoms.

The ring formed by combining two of $R_{36}$, $R_{37}$ and $R_{38}$ or two of $R_{36}$, $R_{37}$ and $R_{39}$ includes, for example, a 3-membered to 8-membered ring, specifically, for example, cyclopropane, cyclopentane, cyclohexane, furan or pyran ring.

The ring formed by combining two of $R_{14a}$, $R_{15a}$ and $R_{16a}$, two of $R_{18a1}$, $R_{18a2}$ and $R_{18a3}$ or two of $R_{18a1}$, $R_{18a2}$ and $R_{18a4}$ includes preferably a 3-membered to 8-membered ring, specifically, for example, cyclopropane, cyclopentane, cyclohexane, tetramethyleneoxide, pentamethyleneoxide, hexamethyleneoxide, furan, pyran, dioxonol or 1,3-dioxolane ring.

Z in formula (XIV) represents an atomic group necessary for forming a monocyclic or polycyclic alicyclic group. The monocyclic alicyclic group formed preferably includes that having from 3 to 8 carbon atoms, for example, cyclopropyl, cyclopentyl, cyclohexyl, cycloheptyl or cyclooctyl group. The polycyclic alicyclic group formed preferably includes that having from 6 to 20 carbon atoms, for example, adamantyl, norbornyl, isobornyl, camphanyl, dicyclopentyl, α-pinenyl, tricyclodecanyl, tetracyclodecyl or androstanyl group.

The substituent for the groups described above includes an alkyl group, a cycloalkyl group, an aryl group, an amino group, an amido group, a ureido group, a urethane group, a group having an active hydrogen atom, e.g., a hydroxy group or a carboxy group, a halogen atom (e.g., fluorine, chlorine, bromine or iodine atom), an alkoxy group (e.g., methoxy, ethoxy, propoxy or butoxy group), a thioether group, an acyl group (e.g., acetyl, propanoyl or benzoyl group), an acyloxy group (e.g., acetoxy, propanoyloxy or benzoyloxy group), an alkoxycarbonyl group (e.g., methoxycarbonyl, ethoxycarbonyl or propoxycarbonyl group), a cyano group and a nitro group.

The alkyl group, cycloalkyl group and aryl group as the substituents are same as those described above, respectively. The alkyl group may further be substituted with a fluorine atom or a cycloalkyl group.

The group, which is decomposed by the action of an acid to increase solubility in an alkali developer, included in the fluorine-group containing resin includes, for example, —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$) or —COO—C($R_{36}$)($R_{37}$)(O$R_{39}$). $R_{36}$ to $R_{39}$ have the same meanings as defined above, respectively. $R_{01}$ and $R_{02}$ each represent a hydrogen atom, an alkyl group which may have the substituent described above, a cycloalkyl group which may have the substituent described above, an alkenyl group which may have the substituent described above, an aralkyl group which may have the substituent described above or an aryl group which may have the substituent described above.

Specific preferred examples of the group that is decomposed by the action of an acid to increase solubility in an alkali developer include an ester or ether group of a tertiary alkyl group, e.g., tert-butyl, tert-amyl, 1-alkyl-1-cyclohexyl, 2-alkyl-2-adamantyl, 2-adamantyl-2-propyl or 2-(4-methylcyclohexyl)-2-propyl group, an acetal or acetal ester group, e.g., 1-alkoxy-1-ethoxy or tetrahydropyranyl group, a tertiary alkylcarbonate group and a tertiary alkylcarbonylmethoxy group.

The total content of repeating units represented by formulae (I) to (X) is ordinarily from 10 to 80% by mol, preferably from 30 to 70% by mol, and more preferably from 35 to 65% by mol, in the whole polymer composition.

The content of repeating units represented by formulae (XI) to (XIII) is ordinarily from 0 to 70% by mol, preferably from 10 to 60% by mol, and more preferably from 20 to 50% by mol, in the whole polymer composition.

The content of repeating units represented by formulae (XV) to (XVII) is ordinarily from 0 to 70% by mol, preferably from 10 to 60% by mol, and more preferably from 20 to 50% by mol, in the whole polymer composition.

As the resin of Component (A), a resin having at least one of repeating units represented by formulae (I) to (III) and at least one of repeating units represented by formulae (IV) to (VI) is more preferred.

Also, as the resin of Component (A), a resin having at least one of repeating units represented by formulae (IV) to (VI) and at least one of repeating units represented by formulae (VIII) to (X) is more preferred same as described above.

Further, as the resin of Component (A), a resin having at least one of repeating units represented by formulae (IV) to (VII) and at least one of repeating units represented by formulae (XV) to (XVII) is more preferred same as described above.

Using these resins, the positive resist composition exhibits sufficiently high transmittancy in 157 nm and the degradation of dry etching resistance can be prevented.

In the case where the resin of Component (A) according to the present invention has at least one of repeating units represented by formulae (I) to (III) and at least one of repeating units represented by formulae (IV) to (VI), the total content of repeating units represented by formulae (I) to (III) is ordinarily not more than 70% by mol, preferably from 10 to 60% by mol, and more preferably from 20 to 50% by mol, in the whole polymer composition.

The total content of repeating units represented by formulae (IV) to (VI) is ordinarily from 10 to 80% by mol, preferably from 30 to 70% by mol, and more preferably from 35 to 65% by mol, in the whole polymer composition.

In the case where the resin of Component (A) according to the present invention has at least one of repeating units represented by formulae (IV) to (VI) and at least one of repeating units represented by formulae (VIII) to (X), the total content of repeating units represented by formulae (IV) to (VI) is ordinarily from 10 to 80% by mol, preferably from 30 to 70% by mol, and more preferably from 35 to 65% by mol, in the whole polymer composition.

The total content of repeating units represented by formulae (VIII) to (X) is ordinarily not more than 70% by mol, preferably from 10 to 60% by mol, and more preferably from 20 to 50% by mol, in the whole polymer composition.

In the case where the resin of Component (A) according to the present invention has at least one of repeating units represented by formulae (IV) to (VII) and at least one of repeating units represented by formulae (XV) to (XVII), the total content of repeating units represented by formulae (IV) to (VII) is ordinarily from 10 to 80% by mol, preferably from 30 to 70% by mol, and more preferably from 35 to 65% by mol, in the whole polymer composition.

The total content of repeating units represented by formulae (XV) to (XVII) is ordinarily not more than 70% by mol, preferably from 10 to 60% by mol, and more preferably from 20 to 50% by mol, in the whole polymer composition.

In the fluorine group-containing resin of Component (A) having at least one of repeating unit represented by formula (IA) and at least one of repeating unit represented by formula (IIA), the content of repeating unit represented by formula (IA) is ordinarily from 5 to 80% by mol, preferably from 10 to 75% by mol, and more preferably from 20 to 70% by mol, in the whole polymer composition.

In the fluorine group-containing resin of Component (A) having at least one of repeating unit represented by formula (IA) and at least one of repeating unit represented by formula (IIA), the content of repeating unit represented by formula (IIA) is ordinarily from 5 to 80% by mol, preferably from 10 to 70% by mol, and more preferably from 20 to 65%  by mol, in the whole polymer composition.

In the fluorine group-containing resin of Component (A) having at least one of repeating unit represented by formula (IIA) and at least one of repeating unit represented by formula (VIA), the content of repeating unit represented by formula (IIA) is ordinarily from 5 to 80% by mol, preferably from 10 to 70% by mol, and more preferably from 20 to 65% by mol, in the whole polymer composition.

In the fluorine group-containing resin of Component (A) having at least one of repeating unit represented by formula (IIA) and at least one of repeating unit represented by formula (VIA), the content of repeating unit represented by formula (VIA) is ordinarily from 5 to 80% by mol, preferably from 10 to 70% by mol, and more preferably from 20 to 65% by mol, in the whole polymer composition.

In these fluorine group-containing resins of Component (A), the content of repeating unit represented by formula (IIIA) is ordinarily from 1 to 40% by mol, preferably from 3 to 35% by mol, and more preferably from 5 to 30% by mol, in the whole polymer composition.

In these fluorine group-containing resins of Component (A), the content of repeating unit represented by formula (VIIA) is ordinarily from 1 to 40% by mol, preferably from 3 to 35% by mol, and more preferably from 5 to 30% by mol, in the whole polymer composition.

The resin of Component (A) according to the present invention may have repeating units derived from other copolymerizable monomers in addition to the above-described repeating structural units for the purpose of improving the performances of the positive resist composition.

The copolymerizable monomer, which can be used, includes a compound having one addition polymerizable unsaturated bond selected, for example, from an acrylate, an acrylamide, a methacrylate, a methacrylamide, an allyl compound, a vinyl ether, a vinyl ester, a styrene and a crotonate.

Specific examples of the monomer include an acrylate, for example, an alkyl acrylate (preferably an alkyl acrylate containing an alkyl group having from 1 to 10 carbon atoms), e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate or tetrahydrofurfuryl acrylate, or an aryl acrylate e.g., phenyl acrylate; a methacrylate, for example, an alkyl methacrylate (preferably an alkyl methacrylate containing an alkyl group having form 1 to 10 carbon atoms), e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or tetrahydrofurfuryl methacrylate, or an aryl methacrylate, e.g., phenyl methacrylate, cresyl methacrylate or naphthyl methacrylate; an acrylamide, for example, acrylamide, an N-alkylacrylamide (the alkyl group of which is an alkyl group having from 1 to 10 carbon atoms, e.g., methyl, ethyl, propyl, butyl, tert-butyl, heptyl, octyl, cyclohexyl, benzyl or hydroxyethyl group), an N-arylacrylamide (the aryl group of which includes, e.g., phenyl, tolyl, nitrophenyl, naphthyl, cyanophenyl, hydroxyphenyl and carboxyphenyl groups), an N,N-dialkylacrylamide (the alkyl group of which is an alkyl group having form 1 to 10 carbon atoms, e.g., methyl, ethyl, butyl, isobutyl, ethylhexyl or cyclohexyl group), an N,N-diarylacrylamide (the aryl group of which includes, e.g., phenyl group), N-methyl-N-phenylacrylamide, N-hydroxyethyl-N-methylacrylamide or N-2-acetamidoethyl-N-acetylacrylamide; a methacrylamide, for example, methacrylamide, an N-alkylmethacrylamide (the alkyl group of which is an alkyl group having from 1 to 10 carbon atoms, e.g., methyl, ethyl, tert-butyl, ethylhexyl, hydroxyethyl or cyclohexyl group), an N-arylmethacrylamide (the aryl group of which includes, e.g., phenyl group), an N,N-dialkylmethacrylamide (the alkyl group of which includes, e.g., ethyl, propyl and butyl groups), an N,N-diarylmethacrylamide (the aryl group of which includes, e.g., phenyl group), N-hydroxyethyl-N-methylmethacrylamide, N-methyl-N-phenylmethacrylamide or N-ethyl-N-phenylmethacrylamide; an allyl compound, for example, an allyl ester (e.g., allyl acetate, allyl caproate, ally caprate, allyl laurate, allyl palmitate, allyl stearate, allyl benzoate, allyl acetoacetate or ally lactate) or allyl oxyethanol; a vinyl ether, for example, an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether or tetrahydrofurfuryl vinyl ether) or a vinyl aryl ether (e.g., vinyl phenyl ether, vinyl tolyl ether, vinyl chlorophenyl ether, vinyl 2,4-dichlorophenyl ether, vinyl naphthyl ether or vinyl anthranyl ether); a vinyl ester, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate or vinyl naphthoate; a styrene, for example, styrene, an alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxystyrene (e.g., methoxystyrene, 4-methoxy-3-methylstyrene or dimethoxystyrene), a halogenated styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene), carboxystyrene or vinyl naphthalene; a crotonate, for example, an alkyl crotonate (e.g., butyl crotonate, hexyl crotonate or glycerin monocrotonate);

a dialkyl itaconate, for example, dimethyl itaconate, diethyl itaconate or dibutyl itaconate; a dialkyl maleate or fumarate, e.g., dimethyl maleate or dibutyl fumarate; maleic anhydride, maleimide, acrylonitrile, methacrylonitrile and maleonitrile. In addition, any addition polymerizable unsaturated compound copolymerizable with monomers corresponding to the repeating units described above may be ordinarily employed.

Specific examples of the repeating structural unit represented by any one of formulae (I) to (X) are set forth below, but the present invention should not be construed as being limited thereto.

 (F-1)

 (F-2)

 (F-3)

 (F-4)

 (F-5)

 (F-6)

 (F-7)

 (F-8)

 (F-9)

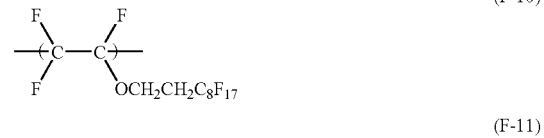 (F-10)

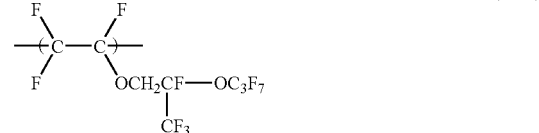 (F-11)

 (F-12)

-continued
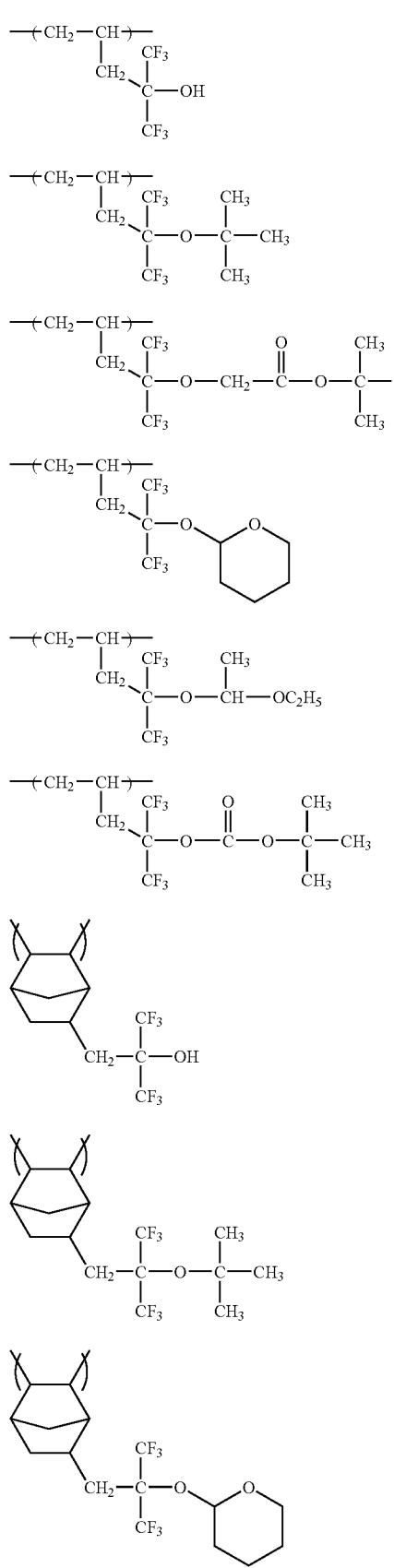
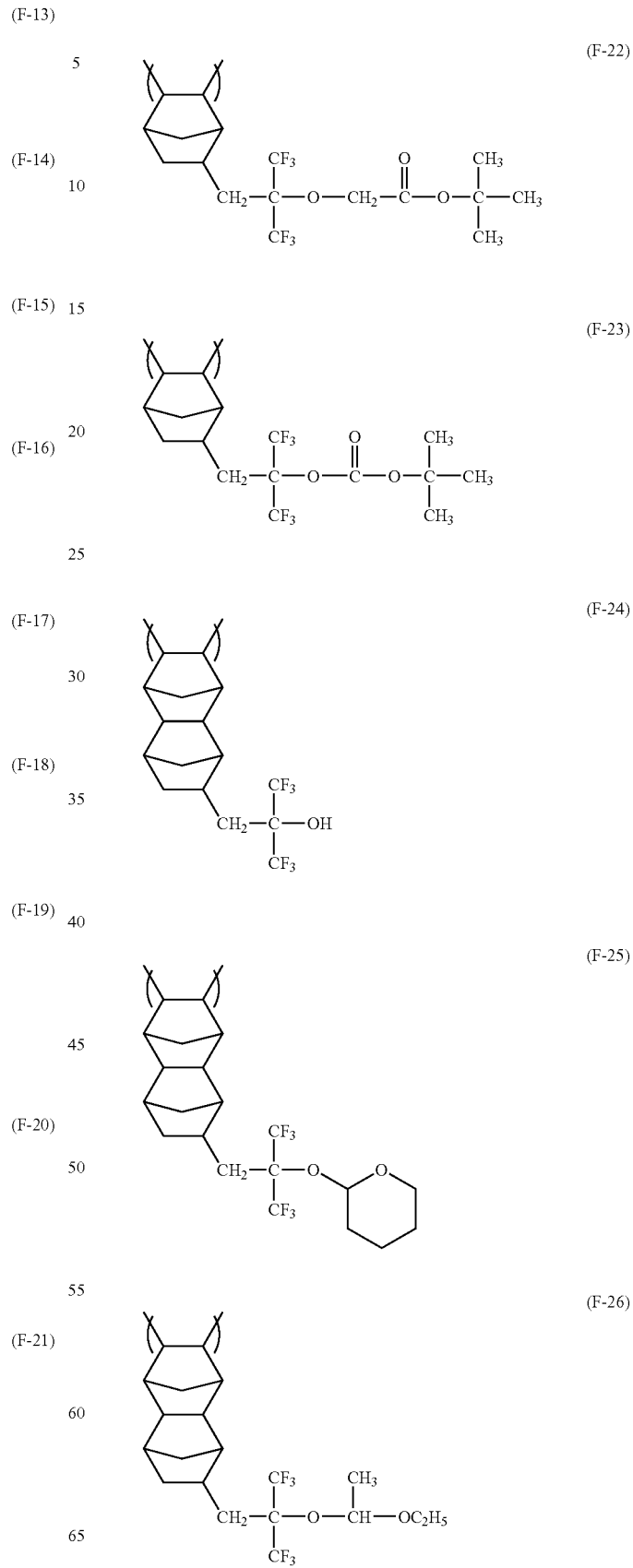

-continued
(F-27)
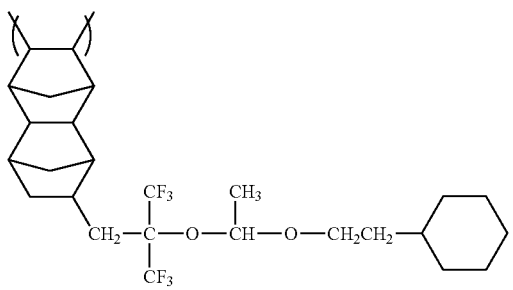
(F-28)
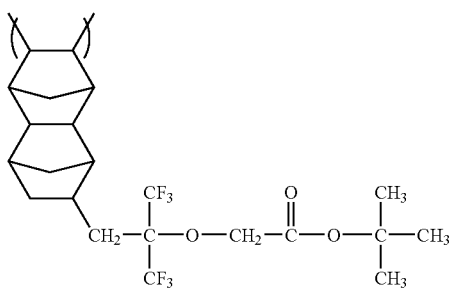
(F-29)
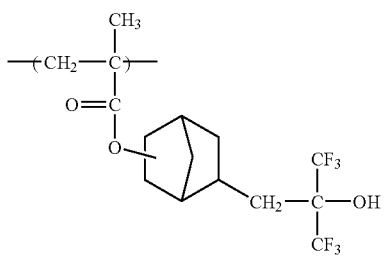
(F-30)
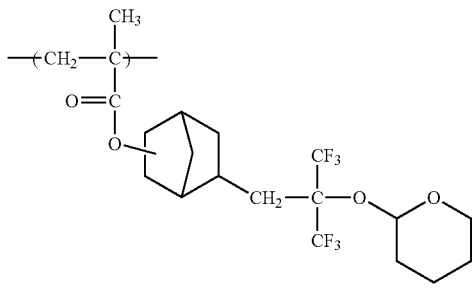
(F-31)
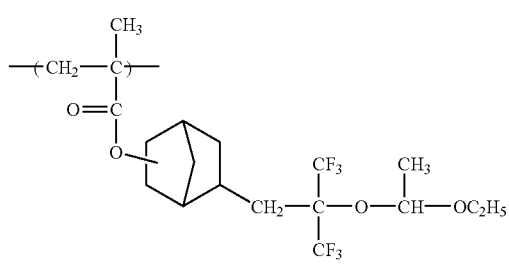
-continued
(F-32)
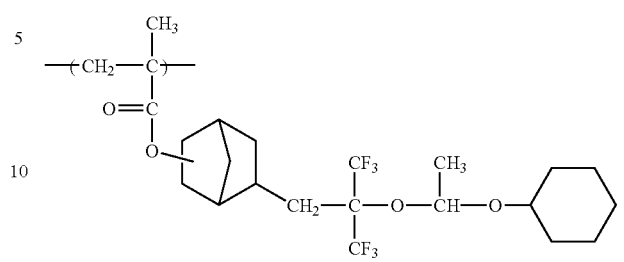
(F-33)
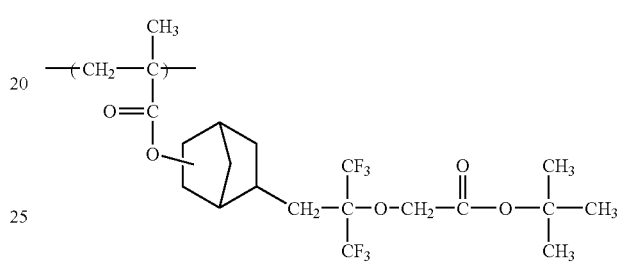
(F-34)
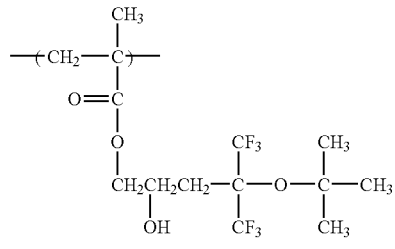
(F-35)
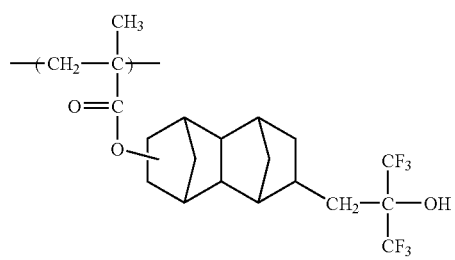
(F-36)
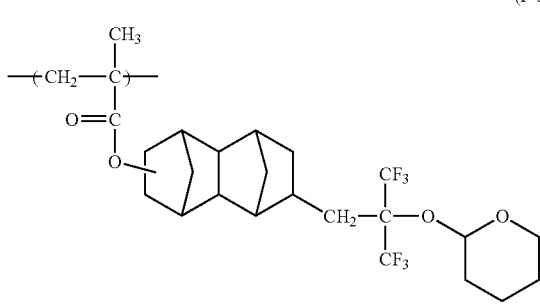

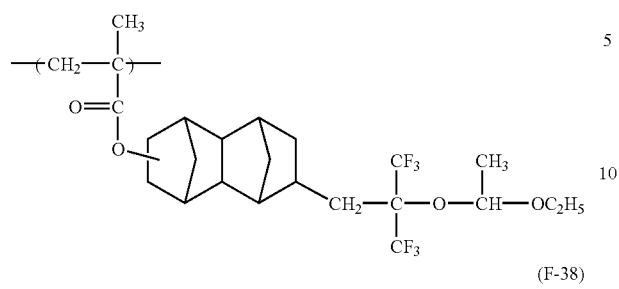
(F-37)
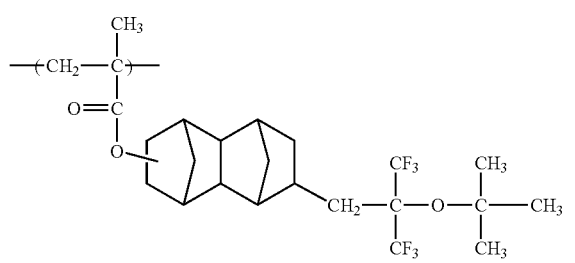
(F-38)
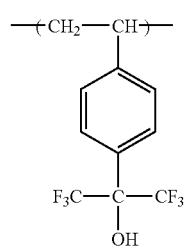
(F-39)
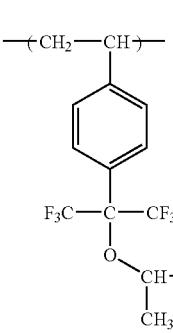
(F-42)
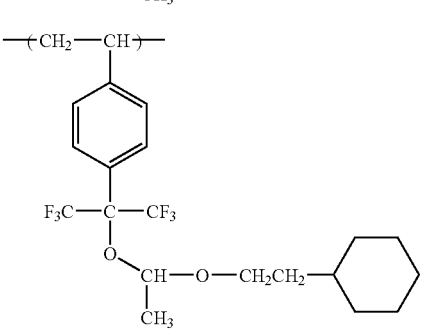
(F-43)
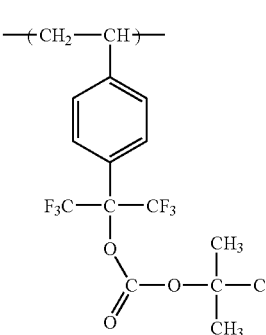
(F-44)
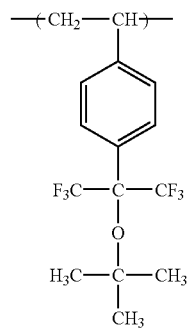
(F-40)
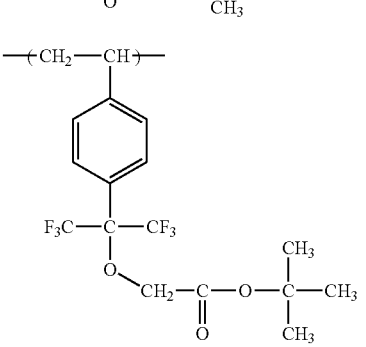
(F-45)
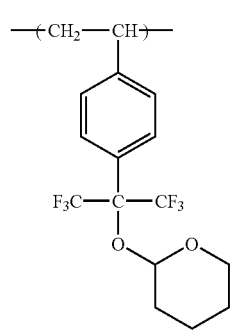
(F-41)
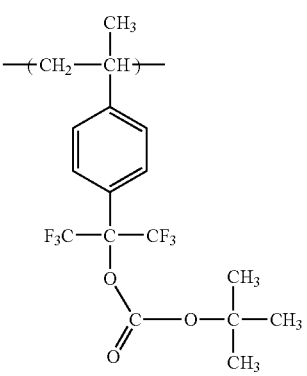
(F-46)

-continued
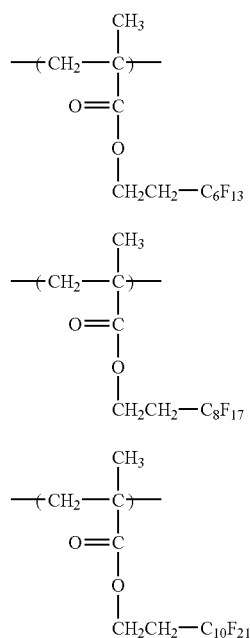
(F-47)
(F-48)
(F-49)
(F-50)
(F-51)
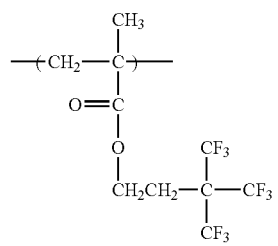
(F-52)
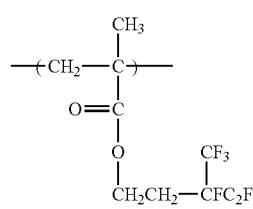
(F-53)
-continued
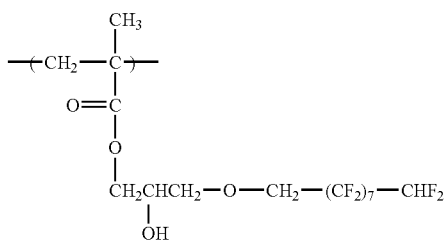
(F-54)
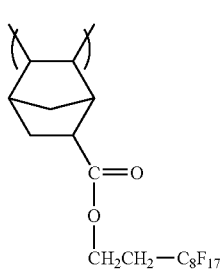
(F-55)
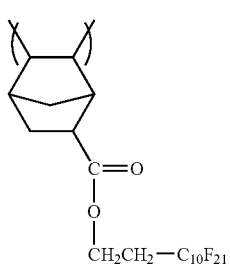
(F-56)
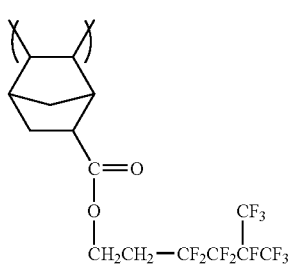
(F-57)
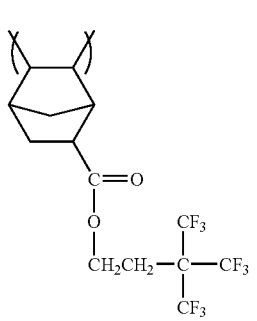
(F-58)

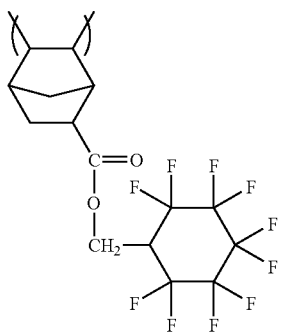 (F-59)
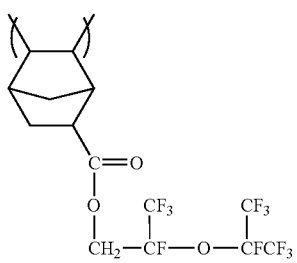 (F-60)
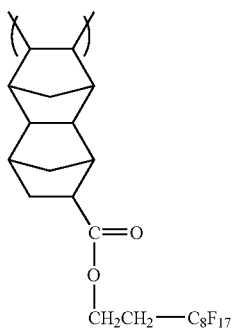 (F-61)
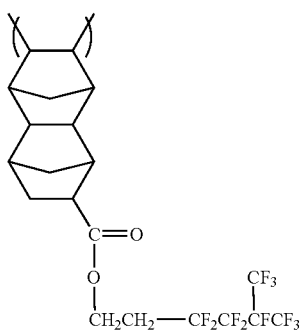 (F-62)
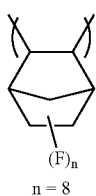 (F-63)
n = 8
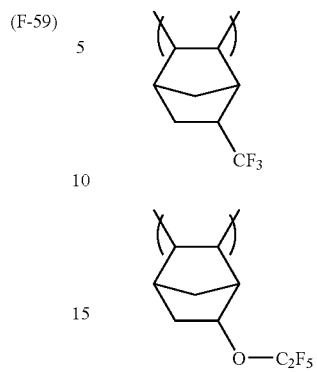 (F-64)
(F-65)
Specific examples of the repeating structural unit represented by any one of formulae (XI) to (XIII) are set forth below, but the present invention should not be construed as being limited thereto.
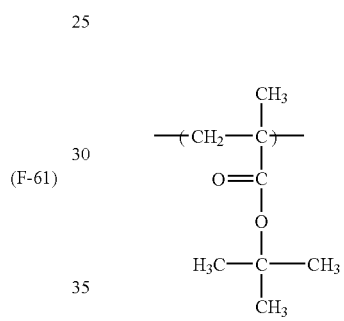 (B-1)
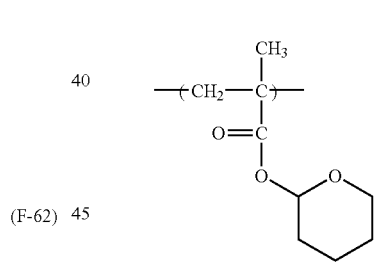 (B-2)
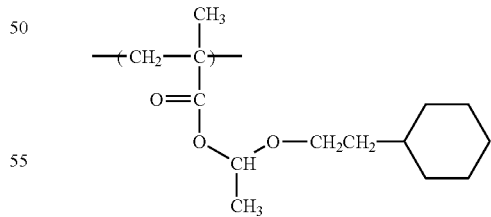 (B-3)
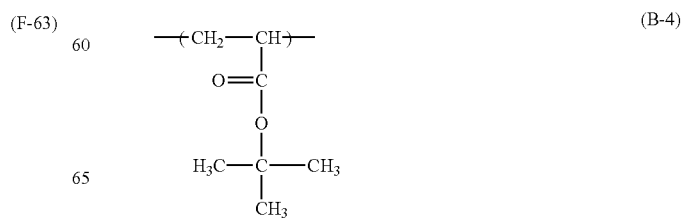 (B-4)

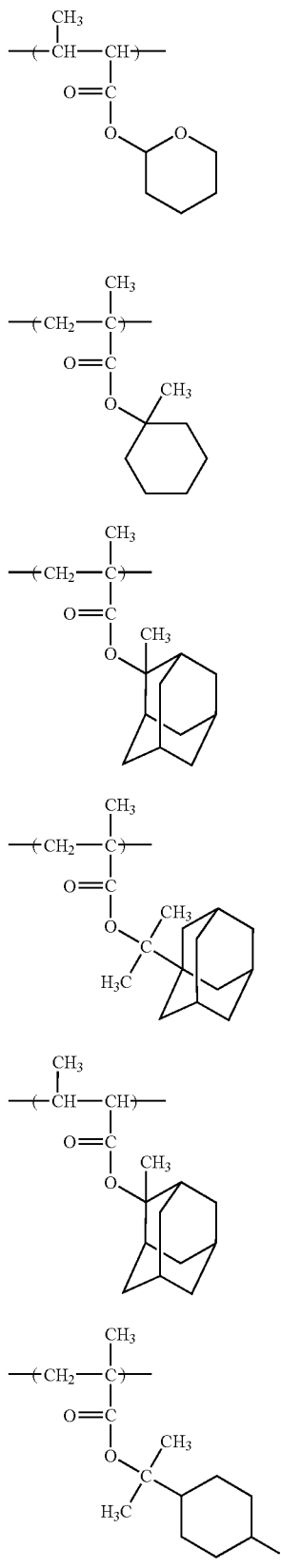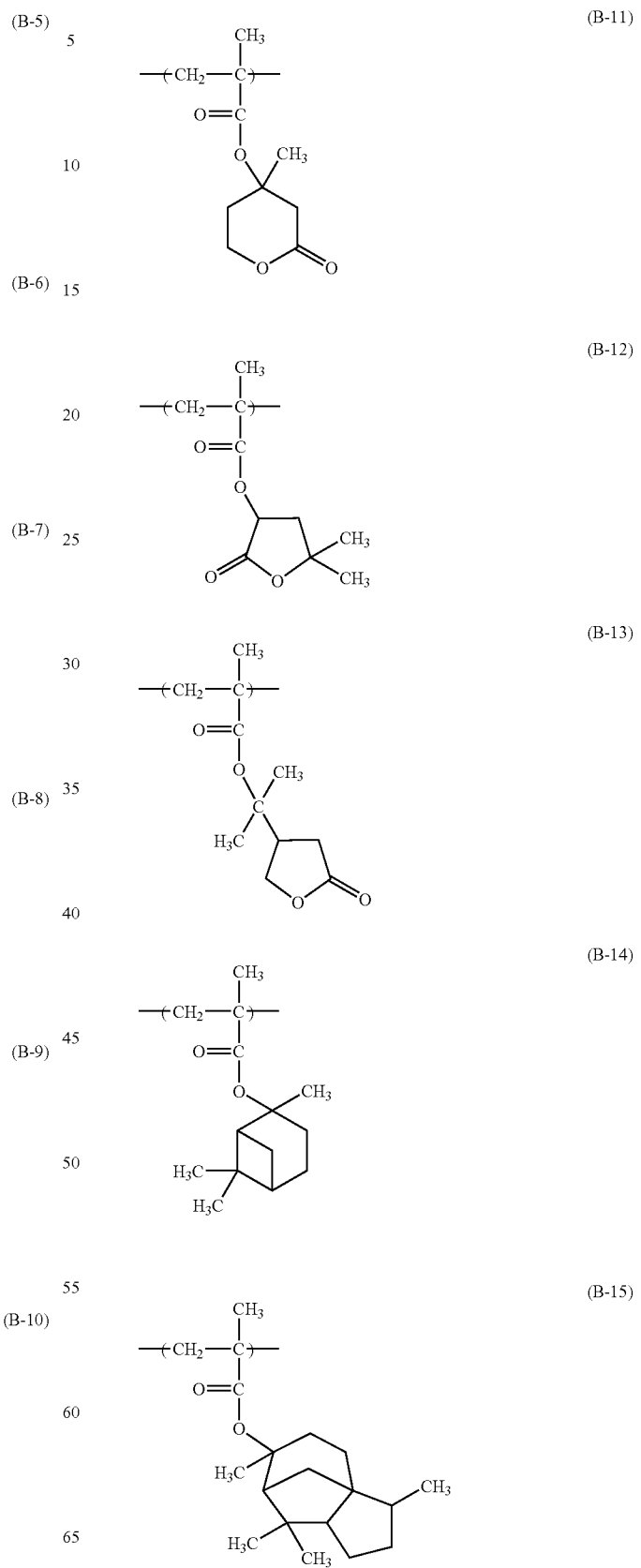

-continued
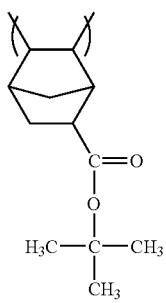 (B-16)
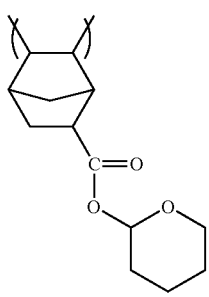 (B-17)
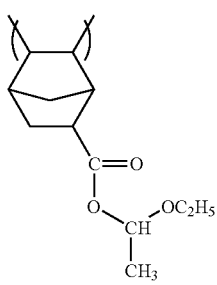 (B-18)
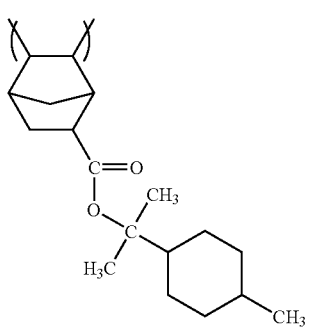 (B-19)
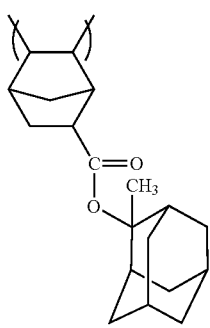 (B-20)
-continued
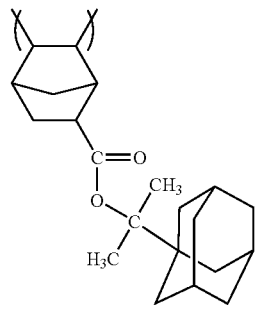 (B-21)
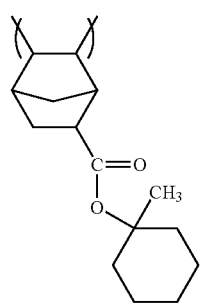 (B-22)
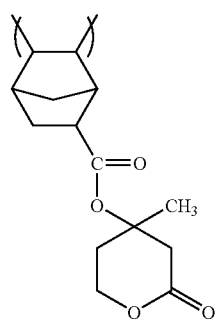 (B-23)
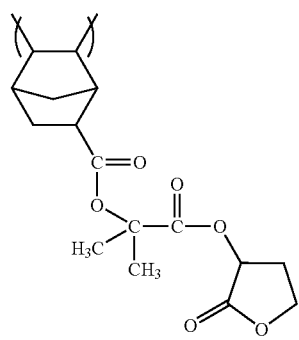 (B-24)
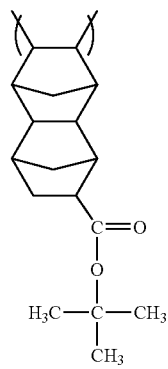 (B-25)

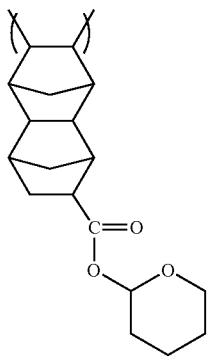 (B-26)
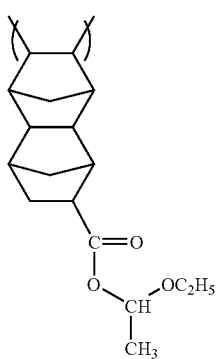 (B-27)
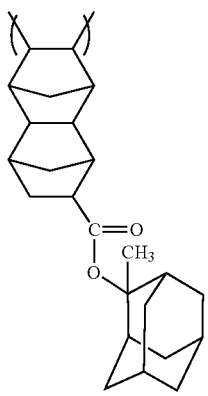 (B-28)
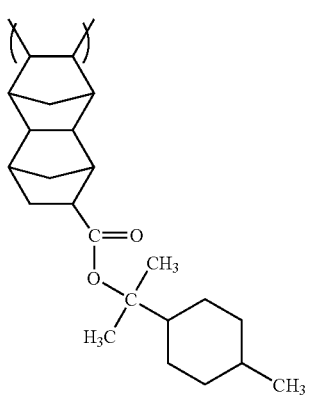 (B-29)
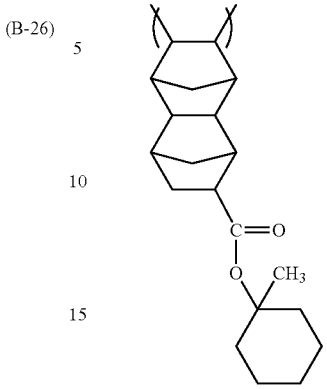 (B-30)
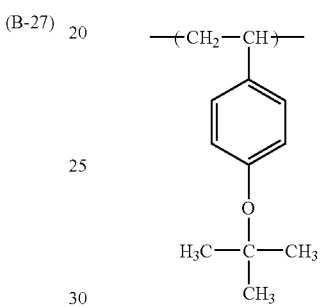 (B-31)
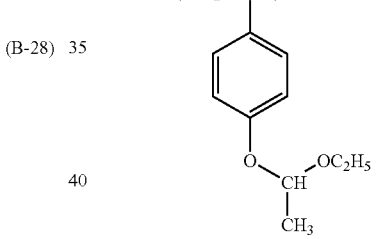 (B-32)
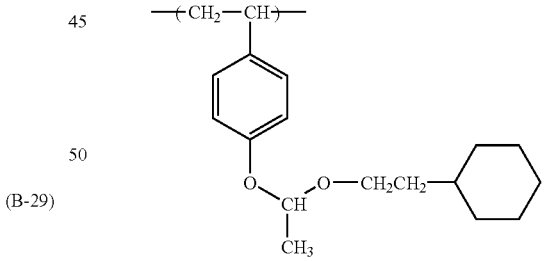 (B-33)
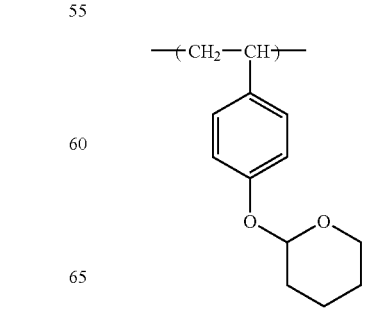 (B-34)

(B-35) 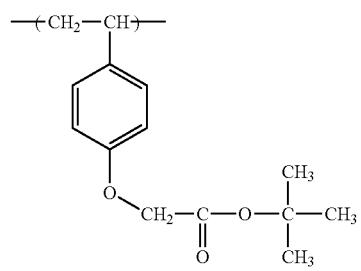

(B-36) 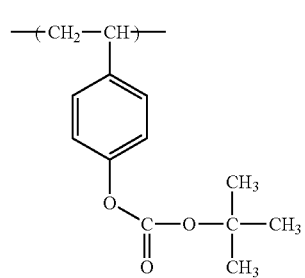

Specific examples of the repeating structural unit represented by any one of formulae (XVI) to (XVII) are set forth below, but the present invention should not be construed as being limited thereto.

(C-1) 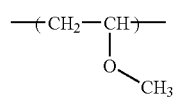

(C-2) 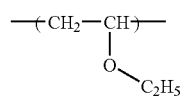

(C-3) 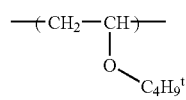

(C-4) 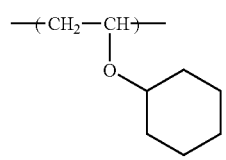

(C-5) 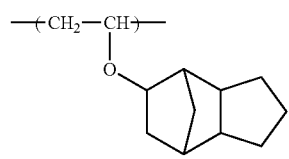

(C-6) 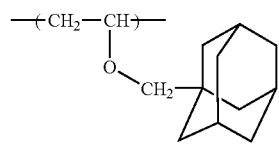

(C-7) 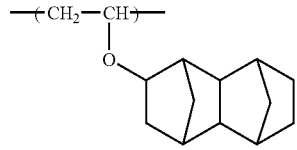

(C-8) 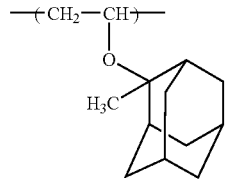

(C-9) 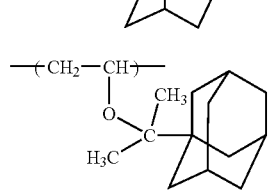

(C-10) 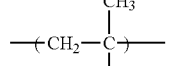

(C-11) 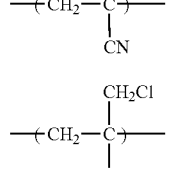

(C-12) 

(C-13) 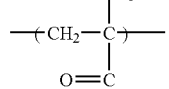

(C-14) 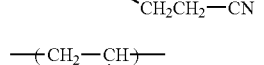

(C-15) 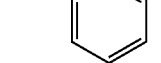

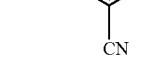

Specific examples of the repeating structural unit represented by formula (IA) are set forth below, but the present invention should not be construed as being limited thereto.

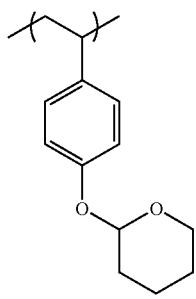 (A-1)
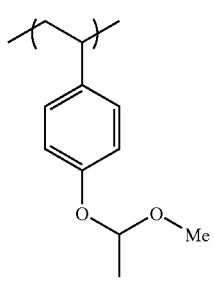 (A-2)
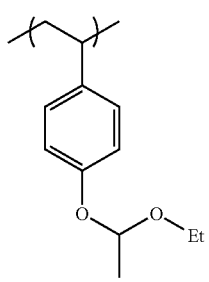 (A-3)
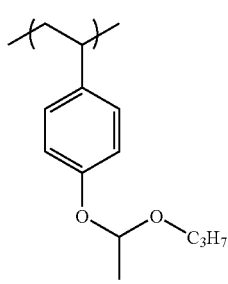 (A-4)
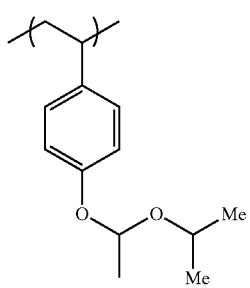 (A-5)
-continued
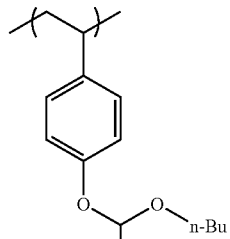 (A-6)
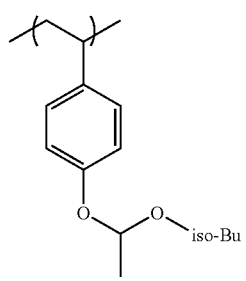 (A-7)
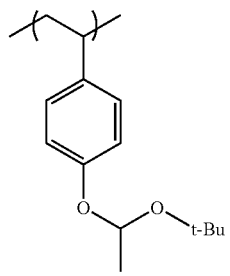 (A-8)
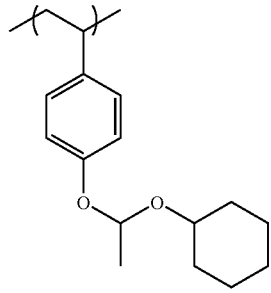 (A-9)
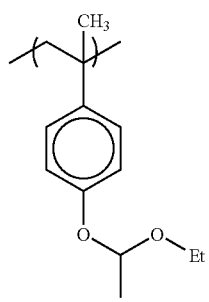 (A-3')

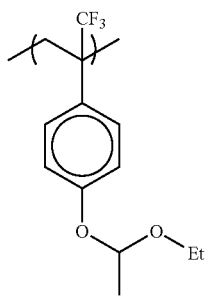 (A-3")
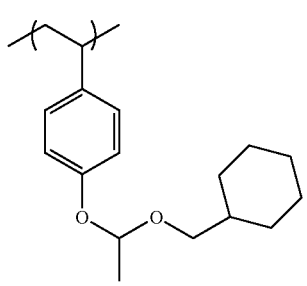 (A-10)
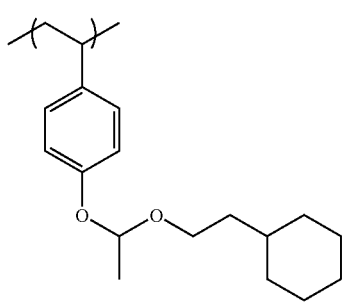 (A-11)
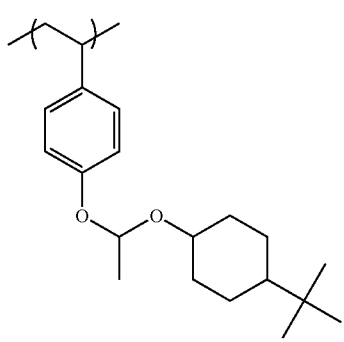 (A-12)
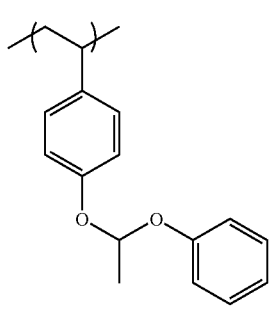 (A-13)
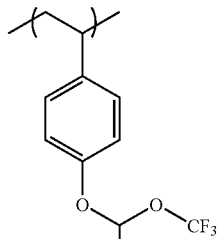 (A-14)
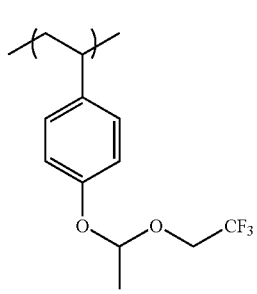 (A-15)
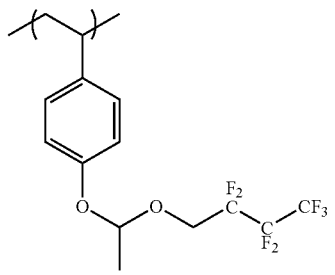 (A-16)
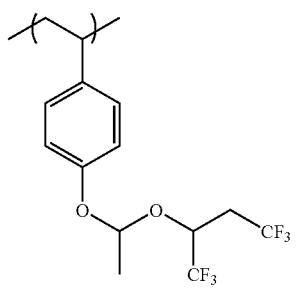 (A-17)
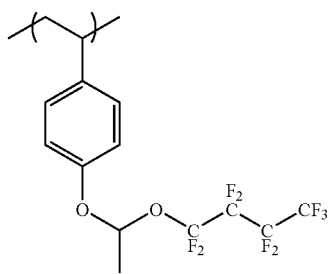 (A-18)

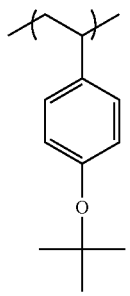 (A-19)
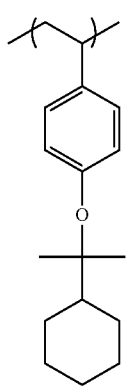 (A-20)
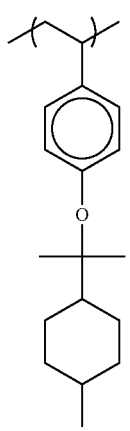 (A-20')
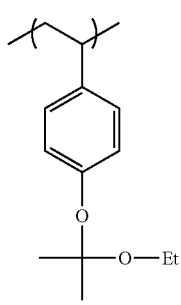 (A-24)
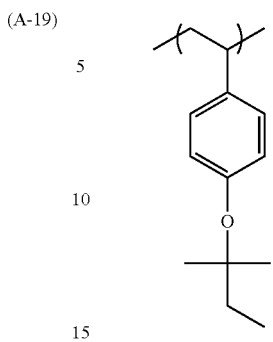 (A-25)
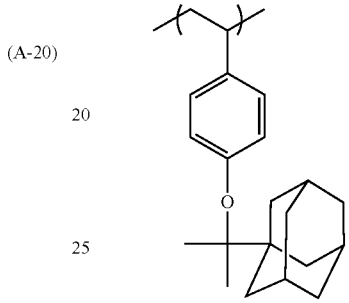 (A-26)
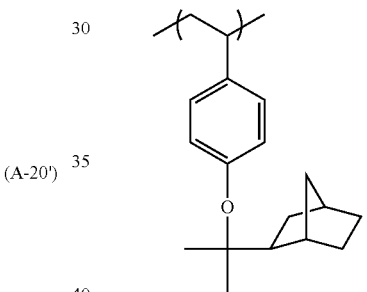 (A-27)
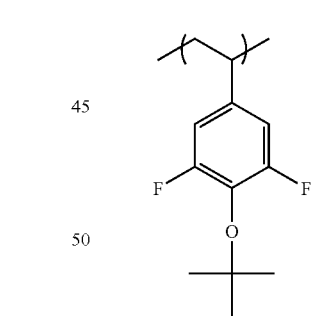 (A-28)
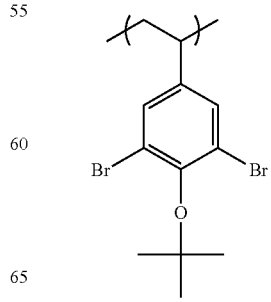 (A-29)

-continued
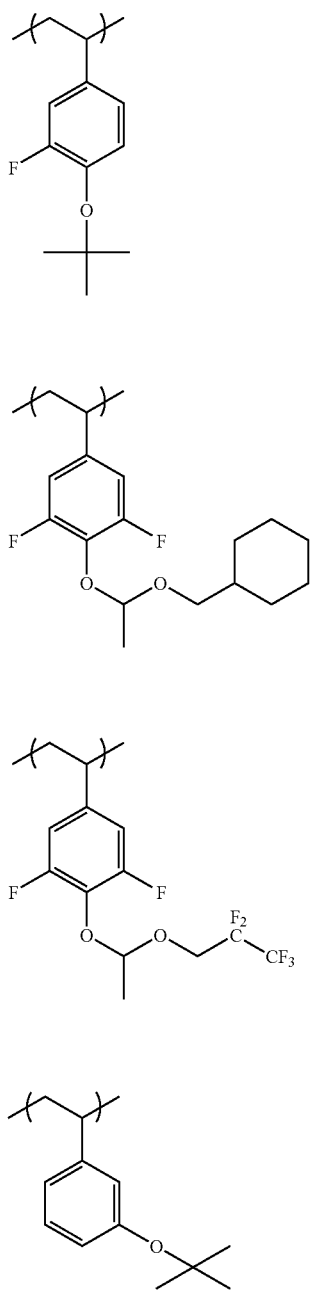
(A-30)
(A-31)
(A-32)
(A-33)
(A-34)
-continued
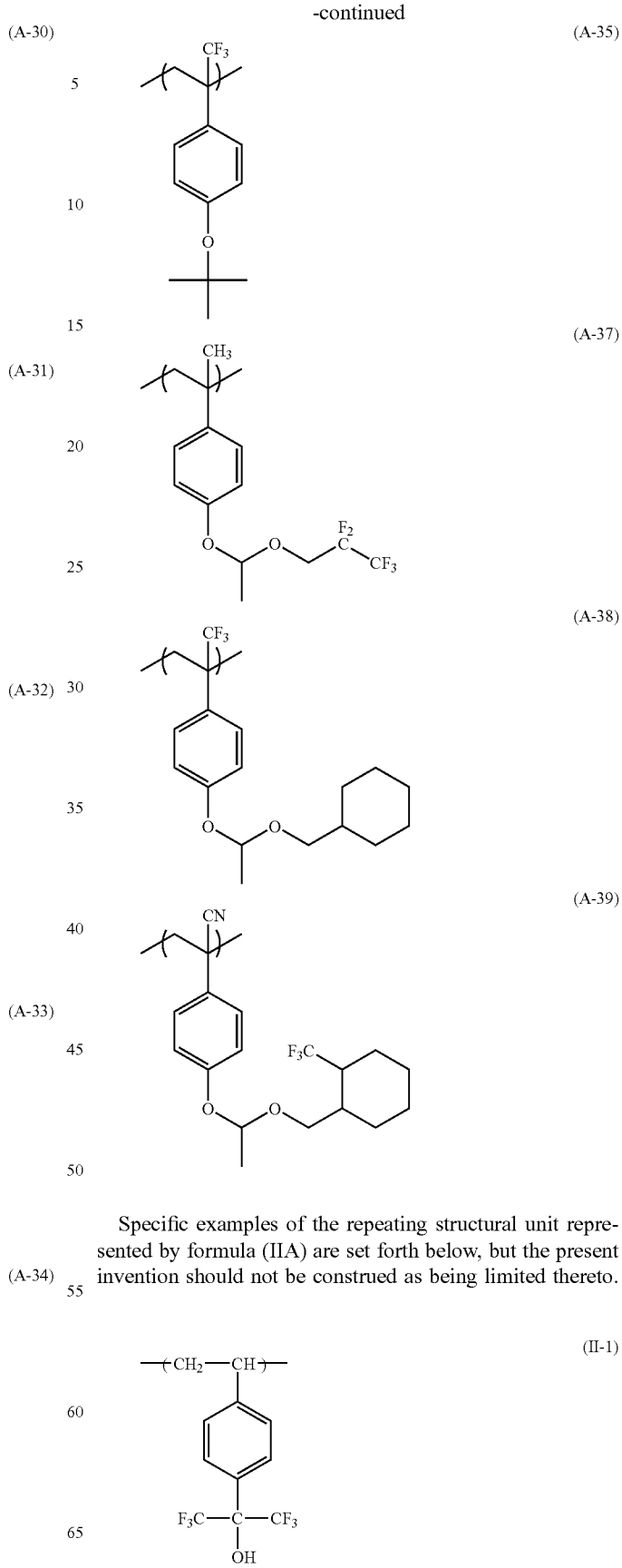
(A-35)
(A-37)
(A-38)
(A-39)
Specific examples of the repeating structural unit represented by formula (IIA) are set forth below, but the present invention should not be construed as being limited thereto.
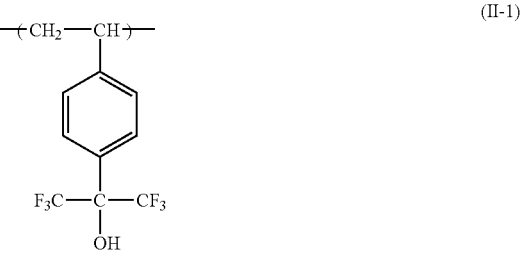
(II-1)

-continued

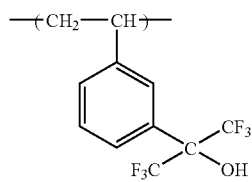 (II-2)

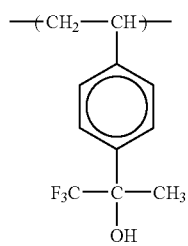 (II-1')

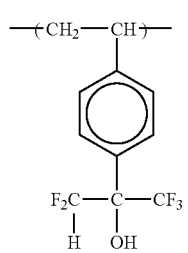 (II-1'')

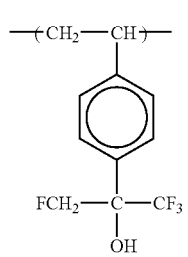 (II-1''')

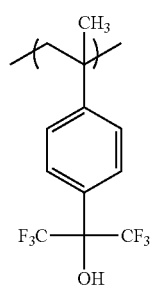 (II-3)

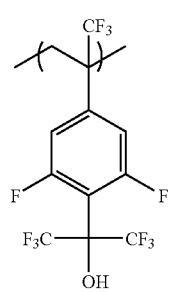 (II-4)

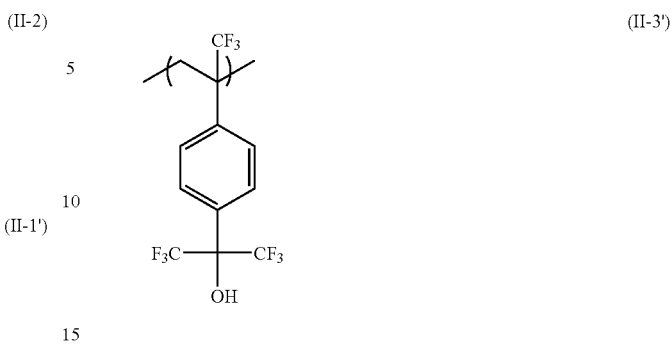

(II-3')

Further, the repeating structural units (F-40) to (F-45) shown hereinbefore are also the specific examples of repeating structural unit represented by formula (IIA).

Specific examples of the repeating structural unit represented by formula (VIA) are set forth below, but the present invention should not be construed as being limited thereto.

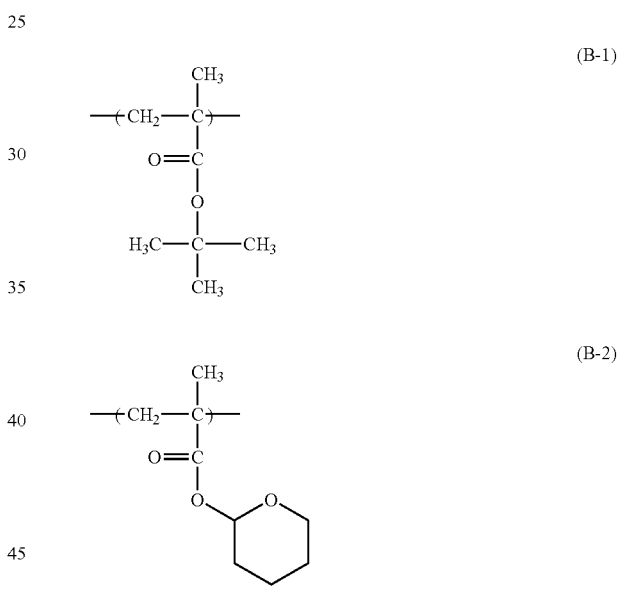

(B-1)

(B-2)

(B-3)

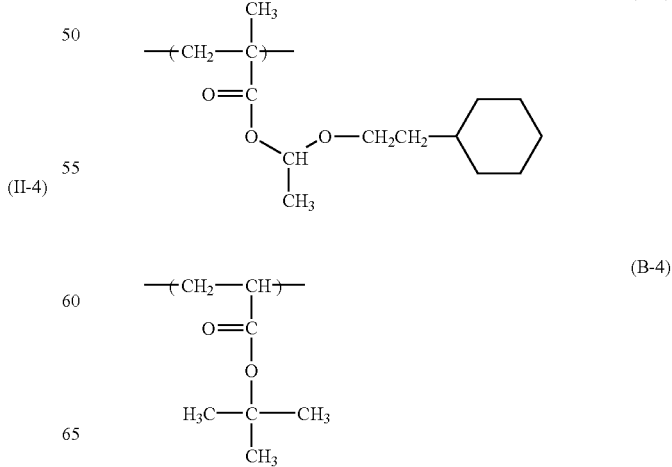

(B-4)

(B-5) 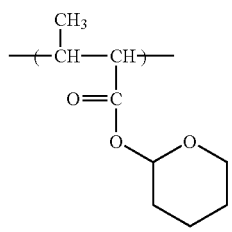
(B-6) 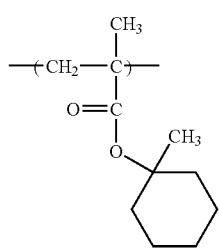
(B-7) 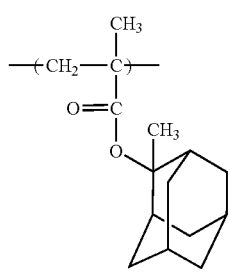
(B-8) 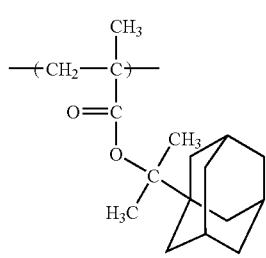
(B-9) 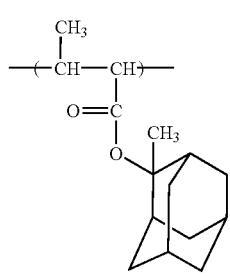
(B-10) 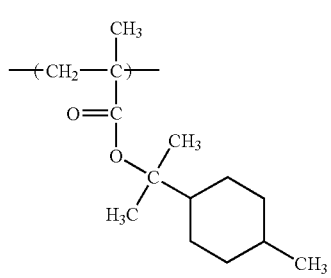
(B-11) 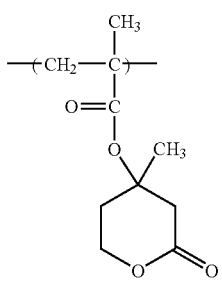
(B-12) 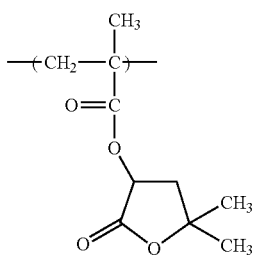
(B-13) 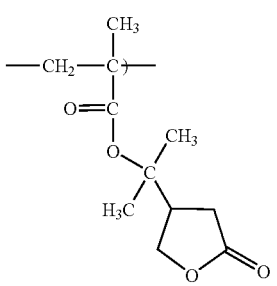
(B-14) 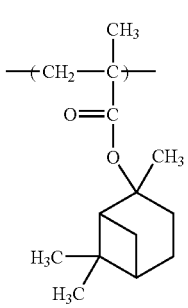
(B-15) 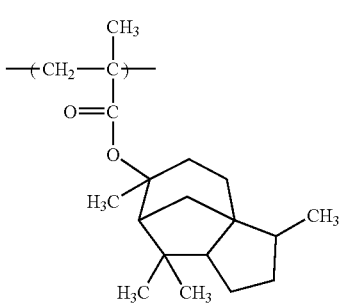

-continued

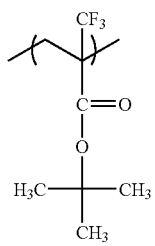
(B-1')

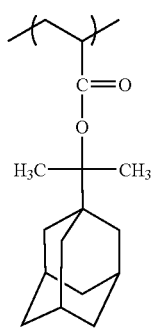
(B-8')

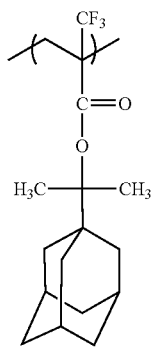
(B-8")

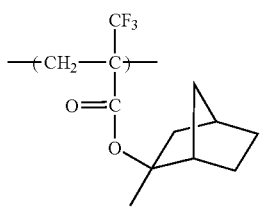
(B-12')

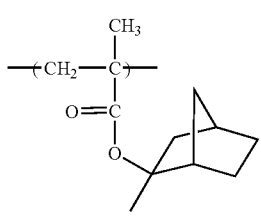
(B-12")

Further, the repeating structural units (F-29) to (F-38) and (F-47) to (F-54) shown hereinbefore are also the specific examples of repeating structural unit represented by formula (VIA).

Specific examples of the repeating structural unit represented by formula (IIIA) are set forth below, but the present invention should not be construed as being limited thereto.

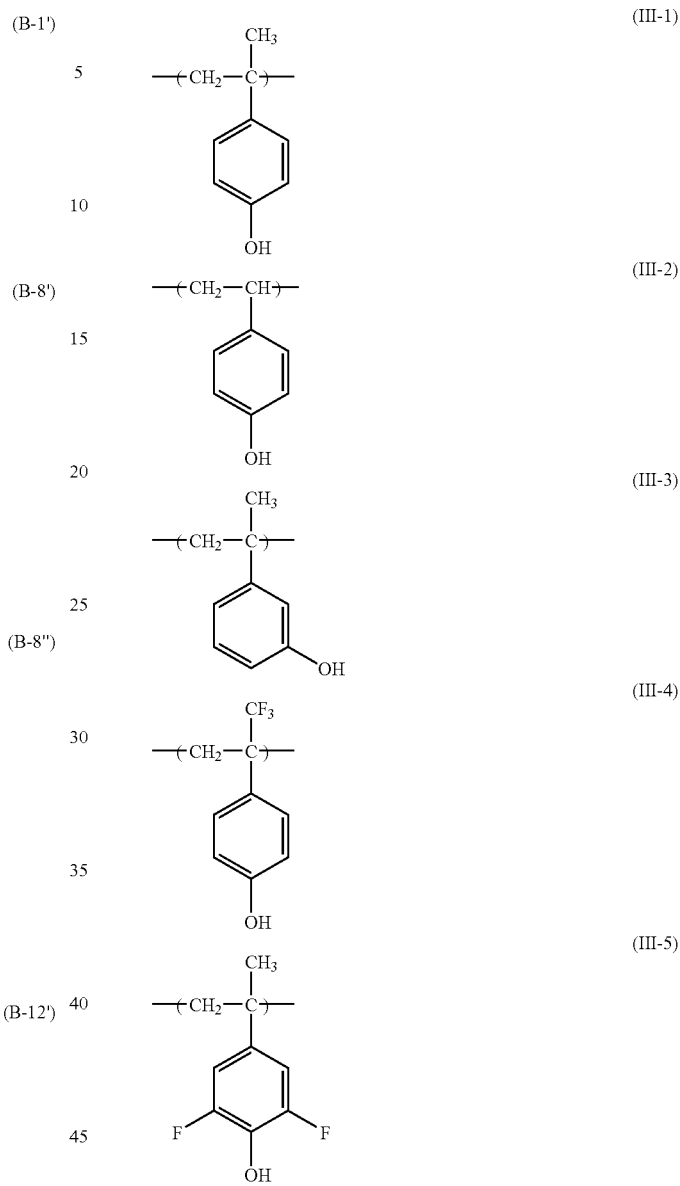

Specific examples of the repeating structural unit represented by formula (VIIA) are set forth below, but the present invention should not be construed as being limited thereto.

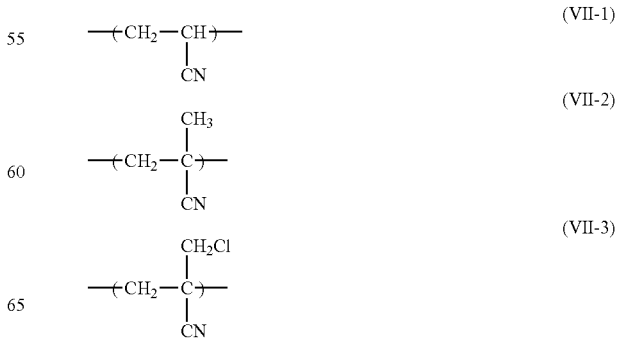

-continued

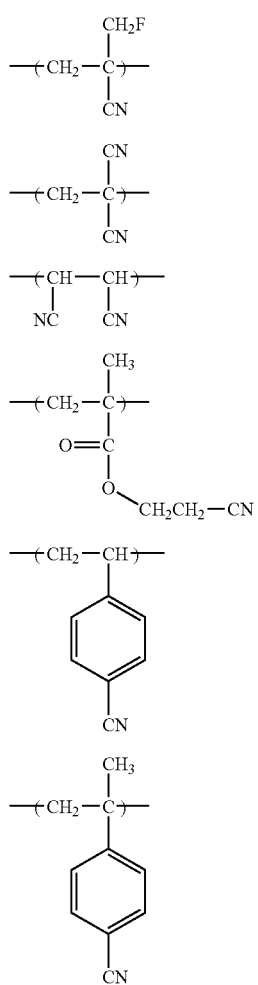

(VII-4)

(VII-5)

(VII-6)

(VII-7)

(VII-8)

(VII-9)

The repeating structural units shown in the above-described specific examples may be used individually or as a mixture of two or more thereof.

A weight average molecular weight of the resin of Component (A) having the repeating structural units described above for use in the present invention is preferably in a range of from 1,000 to 200,000, and more preferably in a range of from 3,000 to 20,000. Distribution of molecular weight of the resin of Component (A) for use in the present invention is ordinarily from 1 to 10, preferably from 1 to 3, and more preferably from 1 to 2. As the distribution of molecular weight of the resin used is small, the resulting resist composition is more excellent in the resolution, resist shape, sidewall smoothness of resist pattern and line edge roughness.

The amount of the resin of Component (A) used in positive resist composition according to the present invention is ordinarily not less than 50% by weight, preferably from 60 to 98% by weight, and more preferably from 65 to 95% by weight, based on the total solid content of the resist composition.

[2] Acid Generator Capable of Generating an Acid Upon Irradiation of an Actinic Ray or Radiation of Component (B) of the Present Invention:

The acid generator for use in the present invention is a compound, which is capable of generating an acid upon irradiation of an actinic ray or radiation and selected from sulfonium salts containing no aromatic ring and compounds having a phenacylsulfonium salt structure (hereinafter also referred to as a compound of Component (B) or an acid generator).

The sulfonium salt having no aromatic ring includes a salt containing a sulfonium represented by formula (II) shown below as a cation.

(II)

wherein, $R^{1b}$ to $R^{3b}$ each independently represent an organic group containing no aromatic ring. The term "aromatic ring" as used herein includes an aromatic ring having a hetero atom.

The organic group containing no aromatic ring for each of $R^{1b}$ to $R^{3b}$ usually has from 1 to 30 carbon atoms, and preferably has from 1 to 20 carbon atoms.

$R^{1b}$ to $R^{3b}$ each independently represents preferably an alkyl group, a 2-oxoalkyl group, an alkoxycarbonylmethyl group, an allyl group or a vinyl group, more preferably a straight-chain, branched or cyclic 2-oxoalkyl group or an alkoxycarbonylmethyl group, and particularly preferably a straight-chain or branched 2-oxoalkyl group.

The alkyl group for each of $R^{1b}$ to $R^{3b}$ may be a straight-chain, branched or cyclic alkyl group. Preferred examples thereof include a straight-chain or branched alkyl group having from 1 to 10 carbon atoms (e.g., methyl, ethyl, propyl, butyl or pentyl group) and a cyclic alkyl group having from 3 to 10 carbon atoms (e.g., cyclopentyl, cyclohexyl or norbornyl group).

The 2-oxoalkyl group for each of $R^{1b}$ to $R^{3b}$ may be a straight chain, branched or cyclic 2-oxoalkyl group. Preferred examples thereof include groups having >C=O at the 2-position of the above-described alkyl groups for each of $R^{1b}$ to $R^{3b}$.

The alkoxy group of the alkoxycarbonylmethyl group for each of $R^{1b}$ to $R^{3b}$ is preferably an alkoxy group having from 1 to 5 carbon atoms (e.g., methoxy, ethoxy, propoxy, butoxy or pentyloxy group).

The group for each of $R^{1b}$ to $R^{3b}$ may be further substituted with a halogen atom, an alkoxy group (e.g., an alkoxy group having from 1 to 5 carbon atoms), a hydroxy group, a cyano group or a nitro group.

Two of $R^{1b}$ to $R^{3b}$ may be connected with each other to form a cyclic structure and the cyclic structure may contain, in the ring thereof, an oxygen atom, a sulfur atom, an ester bond, an amido bond or a carbonyl group. Examples of the group formed by connecting two of $R^{1b}$ to $R^{3b}$ include an alkylene group (e.g., butylene or pentylene group).

From the viewpoint of photoreactivity, it is preferred that any one of $R^{1b}$ to $R^{3b}$ is a group having a carbon-carbon double bond or carbon-oxygen double bond.

An anion of the sulfonium salt having no aromatic ring is a sulfonic acid anion. The anion is preferably an alkanesulfonic acid anion in which the carbon atom of the 1-position is substituted with a fluorine atom or a benzenesulfonic acid anion substituted with an electron-attracting group, more preferably a perfluoroalkanesulfonic acid anion having from 1 to 8 carbon atoms, and most preferably perfluorobutanesulfonic acid anion or perfluorooctanesulfonic acid anion. By using such a sulfonic acid anion, decomposition speed of the acid-decomposable group increases, resulting in the improvement in sensitivity, and diffusion of the acid generated is restrained, resulting in the improvement in resolution.

Examples of the electron-attracting group include a fluorine atom, a chlorine atom, a bromine atom, a nitro group, a cyano group, an alkoxycarbonyl group, an acyloxy group and an acyl group.

A compound wherein at least one of $R^{1b}$ to $R^{3b}$ of one compound represented by formula (II) is bonded to at least one of $R^{1b}$ to $R^{3b}$ of another compound represented by formula (II) may also be used.

Specific examples of the sulfonium salt having no aromatic ring for use in the present invention are set forth below, but the present invention should not be construed as being limited thereto.

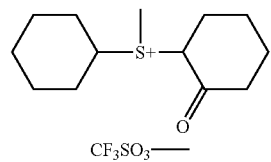
CF$_3$SO$_3$—
(II-1)

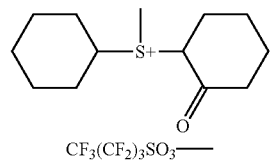
CF$_3$(CF$_2$)$_3$SO$_3$—
(II-2)

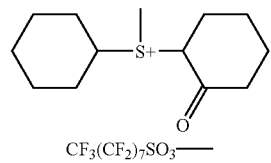
CF$_3$(CF$_2$)$_7$SO$_3$—
(II-3)

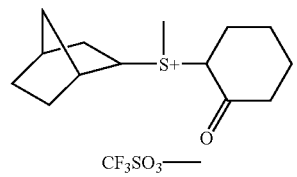
CF$_3$SO$_3$—
(II-4)

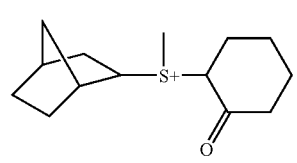
CF$_3$(CF$_2$)$_3$SO$_3$—
(II-5)

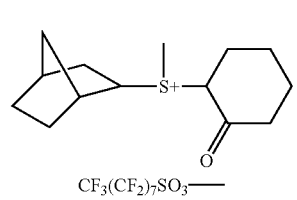
CF$_3$(CF$_2$)$_7$SO$_3$—
(II-6)

-continued

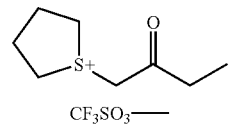
CF$_3$SO$_3$—
(II-7)

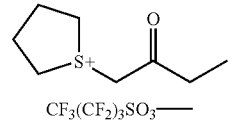
CF$_3$(CF$_2$)$_3$SO$_3$—
(II-8)

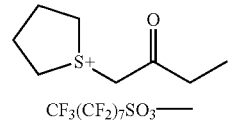
CF$_3$(CF$_2$)$_7$SO$_3$—
(II-9)

CF$_3$SO$_3$—
(II-10)

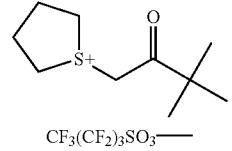
CF$_3$(CF$_2$)$_3$SO$_3$—
(II-11)

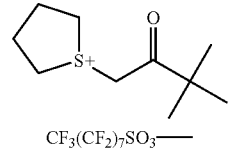
CF$_3$(CF$_2$)$_7$SO$_3$—
(II-12)

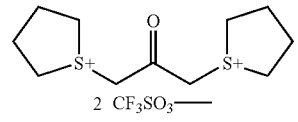
2 CF$_3$SO$_3$—
(II-13)

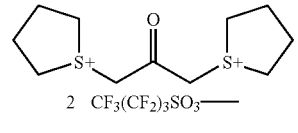
2 CF$_3$(CF$_2$)$_3$SO$_3$—
(II-14)

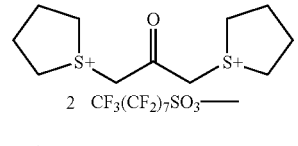
2 CF$_3$(CF$_2$)$_7$SO$_3$—
(II-15)

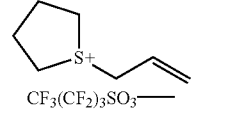
CF$_3$(CF$_2$)$_3$SO$_3$—
(II-16)

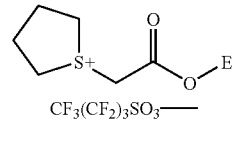
CF$_3$(CF$_2$)$_3$SO$_3$—
(II-17)

-continued

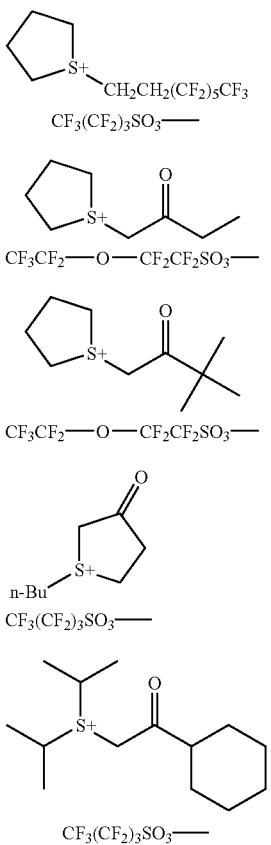

(II-18)

(II-19)

(II-20)

(II-21)

(II-22)

The compound having a phenacylsulfonium salt structure, which is capable of generating an acid upon irradiation of an actinic ray or radiation, includes a compound represented by the following formula (III):

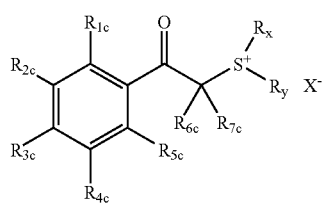

(III)

wherein, $R_{1c}$ to $R_{5c}$ each independently represent a hydrogen atom, an alkyl group, an alkoxy group or a halogen atom; $R_{6c}$ to $R_{7c}$ each independently represent a hydrogen atom, an alkyl group or an aryl group; $R_x$ and $R_y$ each independently represent an alkyl group, a 2-oxoalkyl group, an alkoxycarbonylmethyl group, an allyl group or a vinyl group, or at least any two of $R_{1c}$ to $R_{7c}$, or $R_x$ and $R_y$ may be connected with each other to form a cyclic structure and the cyclic structure may contain an oxygen atom, a sulfur atom, an ester bond or an amido bond; and $X^-$ represents an anion of sulfonic acid, carboxylic acid or sulfonylimide.

The alkyl group for each of $R_{1c}$ to $R_{5c}$ may be any of a straight-chain, branched or cyclic alkyl group, and includes, for example, an alkyl group having from 1 to 10 carbon atoms. Preferred examples thereof include a straight-chain or branched alkyl group having from 1 to 5 carbon atoms (e.g., methyl, ethyl, straight-chain or branched propyl, straight-chain or branched butyl, or straight-chain or branched pentyl group) and a cyclic alkyl group having from 3 to 8 carbon atoms (e.g., cyclopentyl or cyclohexyl group).

The alkoxy group for each of $R_{1c}$ to $R_{5c}$ may be any of a straight-chain, branched or cyclic alkoxy group, and includes, for example, an alkoxy group having from 1 to 10 carbon atoms. Preferred examples thereof include a straight-chain or branched alkoxy groups having from 1 to 5 carbon atoms (e.g., methoxy, ethoxy, straight-chain or branched propoxy, straight-chain or branched butoxy, or straight-chain or branched pentoxy group) and a cyclic alkoxy group having from 3 to 8 carbon atoms (e.g., cyclopentyloxy or cyclohexyloxy group).

Preferably, any one of $R_{1c}$ to $R_{5c}$ represents a straight-chain, branched or cyclic alkyl group or a straight-chain, branched or cyclic alkoxy group, and more preferably, $R_{1c}$ to $R_{5c}$ have from 2 to 15 carbon atoms in total. This makes it possible to improve solubility in a solvent, thereby restraining the generation of particles during the storage of resist composition.

The alkyl group for $R_{6c}$ or $R_{7c}$ is same as that for each of $R_{1c}$ to $R_{5c}$, and examples of the aryl group for $R_{6c}$ or $R_{7c}$ include an aryl group having from 6 to 14 carbon atoms (e.g., phenyl group).

The alkyl group for $R_x$ or $R_y$ is same as that for each of $R_{1c}$ to $R_{5c}$.

Examples of the 2-oxoalkyl group for $R_x$ or $R_y$ include groups having >C=O at the 2-position of the alkyl groups for each of $R_{1c}$ to $R_{5c}$.

The alkoxy group of the alkoxycarbonylmethyl group is the same as the alkoxy group for each of $R_{1c}$ to $R_{5c}$.

Examples of the group formed by connecting $R_x$ and $R_y$ include butylene and pentylene groups.

By the formation of ring in the compound represented by formula (III), the steric configuration of the compound is fixed and the photolysis efficiency of the compound increases. In the case where any two of $R_{1c}$ to $R_{7c}$ are connected with each other to form a cyclic structure, a case where any one of $R_{1c}$ to $R_{5c}$ is connected with any one of $R_{6c}$ and $R_{7c}$ to form a single bond or a linkage group thereby forming a ring is preferred, and a case where $R_{5c}$ is connected with any one of $R_{6c}$ and $R_{7c}$ to form a single bond or a linkage group thereby forming a ring is particularly preferred.

Examples of the linkage group include an alkylene group which may have a substituent, an alkenylene group which may have a substituent, —O—, —S—, —CO—, —CONR— (wherein R represents a hydrogen atom, an alkyl group or an acyl group) and a group formed by combination of two or more of these groups. An alkylene group which may be substituted, an alkylene group containing an oxygen atom or an alkylene group containing a sulfur atom is preferred for the linkage group.

Examples of the substituent include an alkyl group (preferably having from 1 to 5 carbon atoms), an aryl group (preferably having from 6 to 10 carbon atoms, for example, phenyl group) and an acyl group (preferably having from 2 to 11 carbon atoms).

The linkage group capable of forming a 5-membered to 7-membered ring, for example, methylene, ethylene, propylene, —CH$_2$—O— or —CH$_2$—S— is preferred, and the linkage group capable of forming a 6-membered ring, for example, ethylene, —CH$_2$—O— or —CH$_2$—S— is particularly preferred. By the formation of 6-membered ring in the compound, an angle between the carbonyl plane and the C—S⁺ sigma bond comes close to perpendicular, and due to the orbital interaction the photolysis efficiency of the compound increases.

Further, any of $R_{1c}$ to $R_{7c}$ and $R_x$ and $R_y$ is bonded through a single bond or a linkage group to form a compound having two or more structures represented by formula (III).

X⁻ preferably represents a sulfonic acid anion, and more preferably an alkanesulfonic acid anion in which the carbon atom of the 1-position is substituted with a fluorine atom or a benzenesulfonic acid anion substituted with an electron-attracting group. The alkane portion of the alkanesulfonic acid anion may be substituted with a substituent, for example, an alkoxy group (for example, an alkoxy group having from 1 to 8 carbon atoms) or a perfluoroalkoxy group (for example, a perfluoroalkoxy group having from 1 to 8 carbon atoms). Examples of the electron-attracting group include a fluorine atom, a chlorine atom, a bromine atom, a nitro group, a cyano group, an alkoxycarbonyl group, an acyloxy group and an acyl group.

X⁻ still more preferably represents a perfluoroalkanesulfonic acid anion having from 1 to 8 carbon atoms, particularly preferably a perfluorooctanesulfonic acid anion, a perfluorobutanesulfonic acid anion or a trifluoromethanesulfonic acid anion, and most preferably a perfluorobutanesulfonic acid anion or a trifluoromethanesulfonic acid anion. By using such a sulfonic acid anion, decomposition speed of the acid-decomposable group increases, resulting in the improvement in sensitivity, and diffusion of the acid generated is restrained, resulting in the improvement in resolution.

Specific examples of the compound having a phenacylsulfonium salt structure for use in the present invention are set forth below, but the present invention should not be construed as being limited thereto.

(III-1)
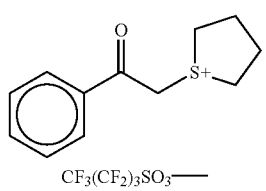
CF₃(CF₂)₃SO₃—

(III-2)
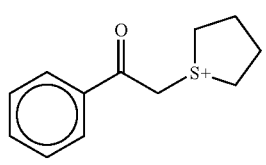
CF₃SO₃—

(III-3)
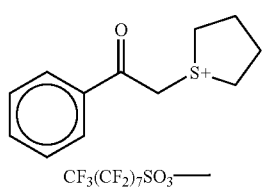
CF₃(CF₂)₇SO₃—

-continued (III-4)
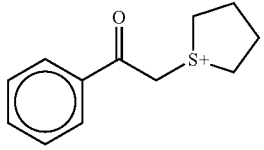
CF₃CF₂—O—CF₂CF₂SO₃—

(III-5)
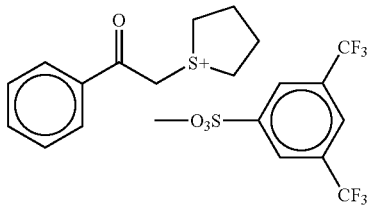

(III-6)
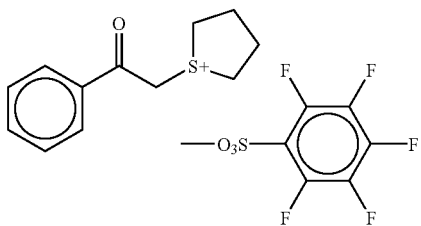

(III-7)
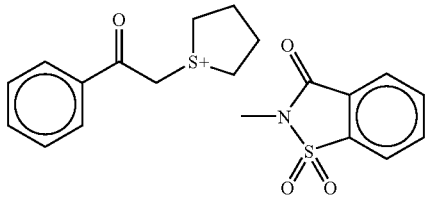

(III-8)
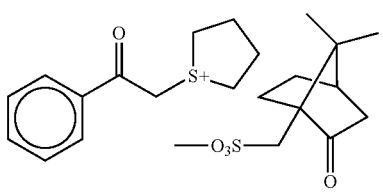

(III-9)
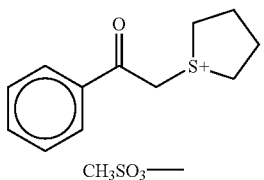
CH₃SO₃—

(III-10)
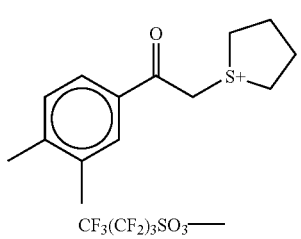
CF₃(CF₂)₃SO₃—

-continued (III-11) through (III-25): chemical structure illustrations of sulfonium salt photoacid generators with associated counter anions.

-continued
(III-26)
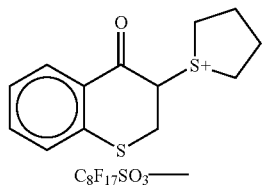
C8F17SO3—
(III-27)
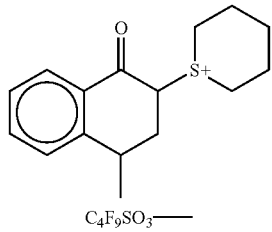
C4F9SO3—
(III-28)
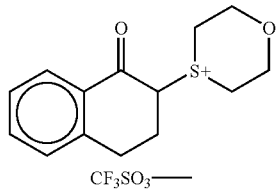
CF3SO3—
(III-29)
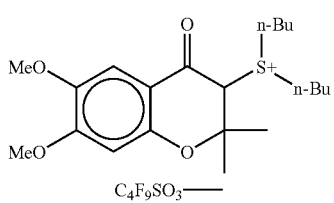
C4F9SO3—
(III-30)
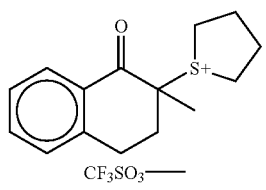
CF3SO3—
(III-31)
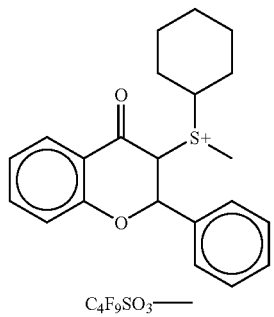
C4F9SO3—
(III-32)
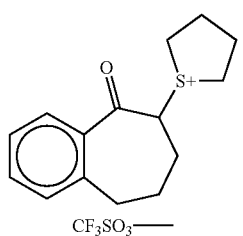
CF3SO3—
-continued
(III-33)
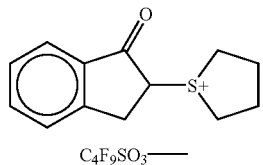
C4F9SO3—
(III-34)
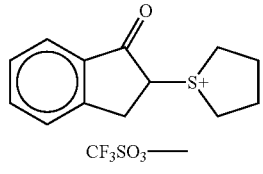
CF3SO3—
(III-35)
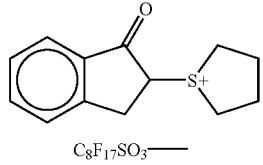
C8F17SO3—
(III-36)
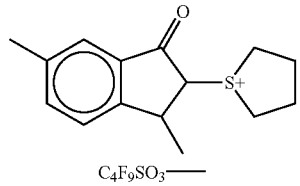
C4F9SO3—
(III-37)
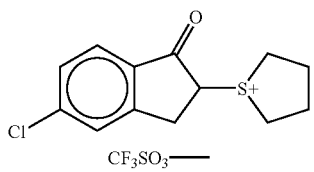
CF3SO3—
(III-38)
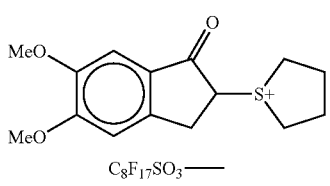
C8F17SO3—
(III-39)
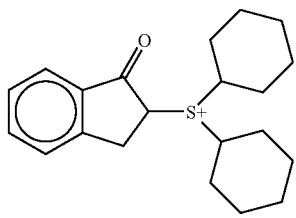
C4F9SO3—
(III-40)
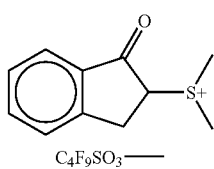
C4F9SO3—

-continued
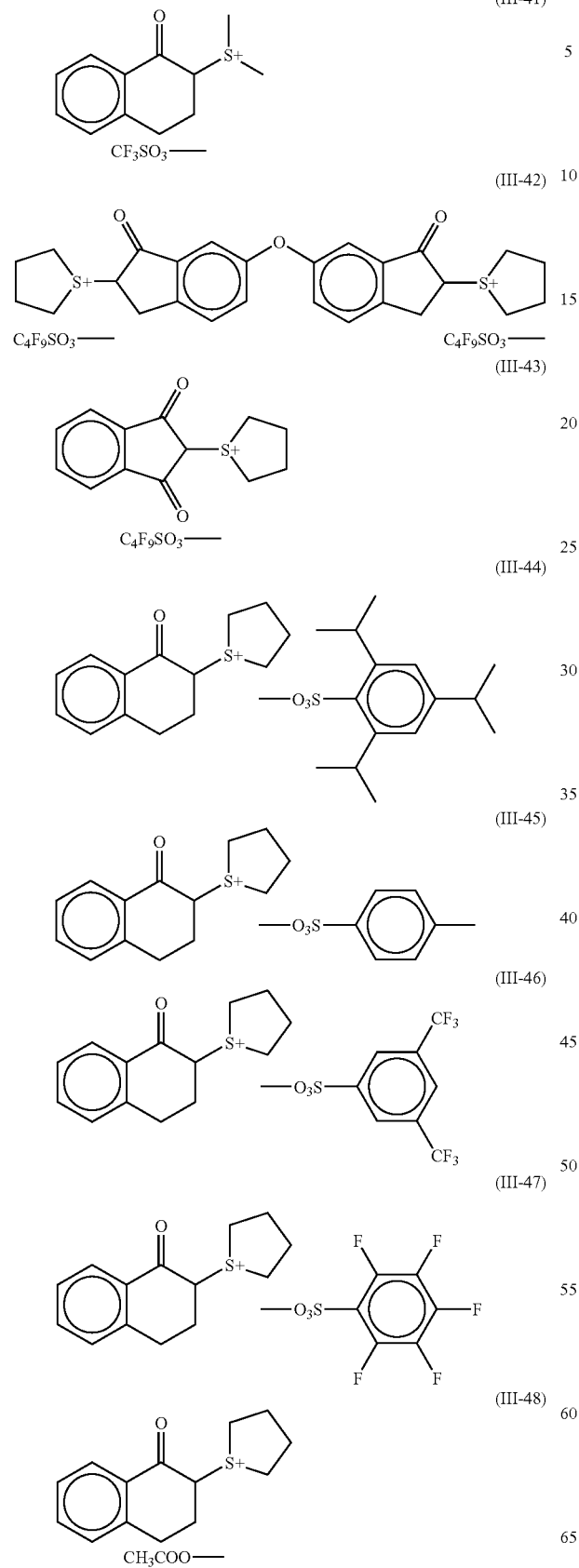
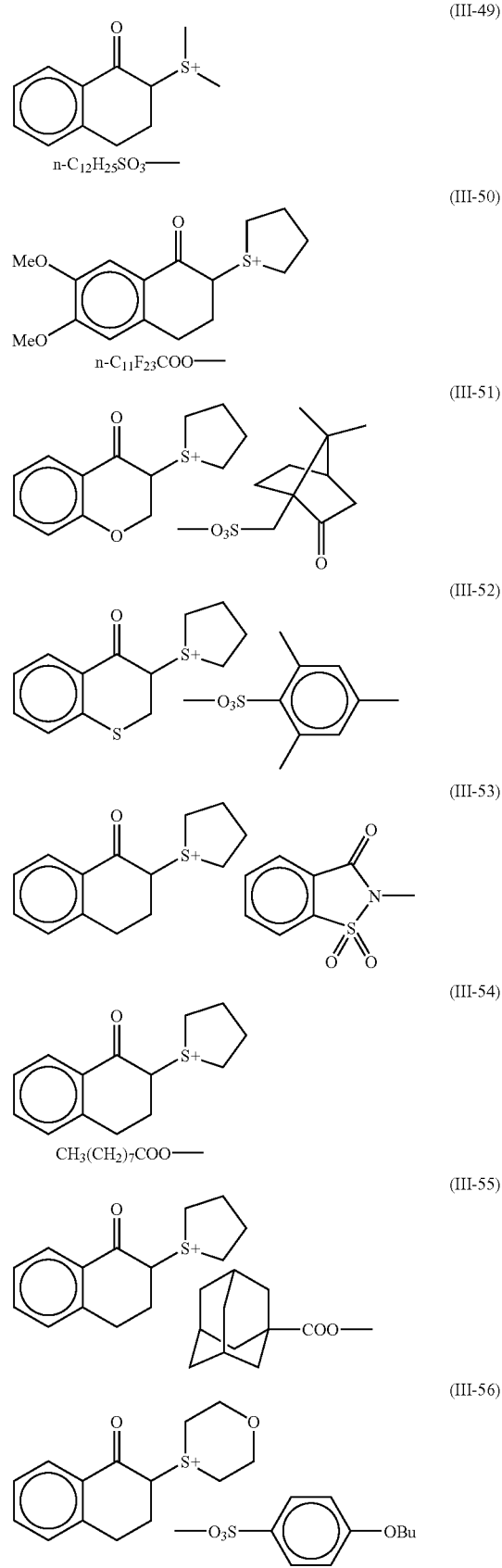

-continued (III-57)
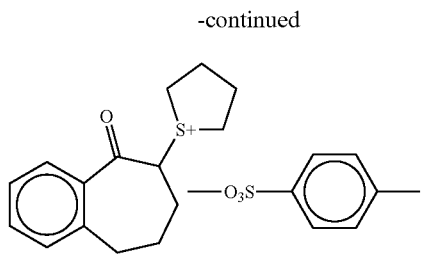

(III-58)
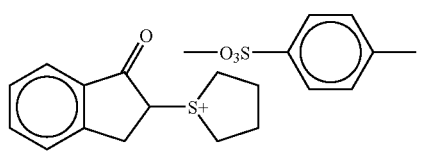

(III-59)
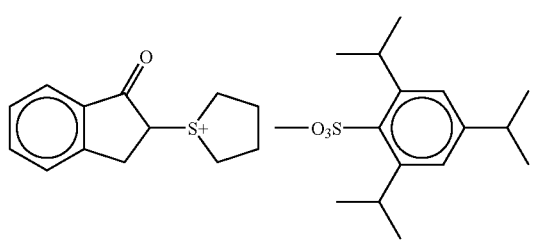

(III-60)
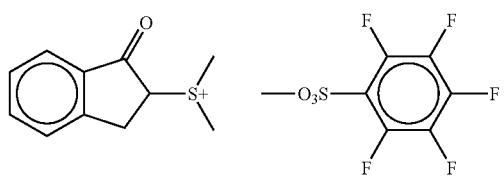

(III-61)
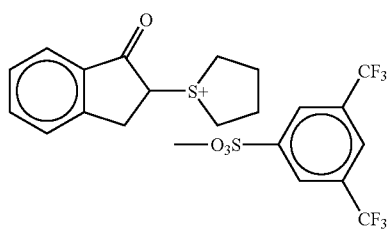

(III-62)
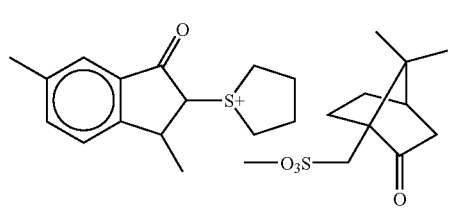

(III-63)
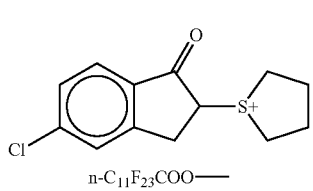
n-$C_{11}F_{23}COO$—

(III-64)
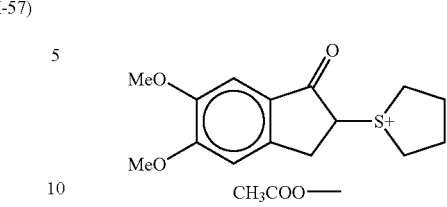
$CH_3COO$—

The amount of acid generator capable of generating an acid upon irradiation of an actinic ray or radiation of Component (B) added to the positive resist composition of the invention is ordinarily 1% by weight or more, preferably from 1.5 to 12% by weight, and more preferably from 2 to 8% by weight, based on the total solid content of the composition.

The sulfonium salts containing no aromatic ring and compounds having a phenacylsulfonium salt structure are used individually or as a mixture of two or more thereof as the acid generator in the present invention. In case of using the sulfonium salt containing no aromatic ring and the compound having a phenacylsulfonium salt structure in combination, the total amount of these acid generators added is ordinarily 2% by weight or more, preferably from 3 to 20% by weight, and more preferably from 4 to 15% by weight, based on the total solid content of the composition. Also, other acid generating compounds as described below may be used individually or as a mixture of two or more thereof together with the acid generator of the present invention.

<Acid Generating Compound Used in Combination With the Acid Generator of Component (B)>

In the present invention, a compound (photo-acid generator) other than the acid generator of the present invention, which is decomposed by irradiation of an actinic ray or radiation to generate an acid, may be used in combination with the acid generator of Component (B).

A molar ratio of the acid generator of Component (B) of the present invention to the photo-acid generator used in combination therewith (Component (B)/other photo-acid generator) is usually from 100/0 to 20/80, preferably from 100/0 to 40/60, and more preferably from 100/0 to 50/50.

Such a photo-acid generator used in combination with the acid generator of Component (B) is appropriately selected from photoinitiators for photo cationic polymerization, photoinitiators for photo radical polymerization, photodecolorizers for dyes, photo discoloring agents, known compounds capable of generating an acid upon irradiation of an actinic ray or radiation used for micro resist, and mixtures thereof.

Specific examples of the photo-acid generator include onium salts, e.g., diazonium salts, ammonium salts, phosphonium salts, iodonium salts, sulfonium salts, selenonium salts or arsonium salts, organic halogen compounds, organic metal/organic halide compounds, photo-acid generators having an o-nitrobenzyl protecting group, compounds generating a sulfonic acid by photolysis as represented by iminosulfonates, and disulfone compounds.

It is also possible to use polymer compounds having in the main chain or side chain thereof a group or compound capable of generating an acid upon irradiation of an actinic ray or radiation, for example, compounds as described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Compounds generating an acid as described, for example, in U.S. Pat. No. 3,779,778 and European Patent 126,712 are also used.

Of the above-described compounds, which are decomposed upon irradiation of an active ray or radiation to generate an acid, used in combination with the acid generator of the present invention, those particularly effectively used are described in detail below.

(1) Oxazole derivative substituted with a trihalomethyl group represented by formula (PAG1) shown below or S-triazine derivative substituted with a trihalomethyl group represented by formula (PAG2) shown below.

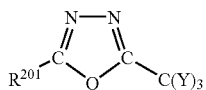

(PAG1)

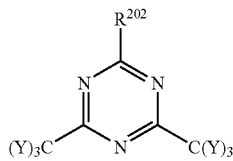

(PAG2)

In formulae (PAG1) and (PAG2), $R^{201}$ represents a substituted or unsubstituted aryl or a substituted or unsubstituted alkenyl group; $R^{202}$ represents a substituted or unsubstituted aryl group, a substituted or unsubstituted alkenyl group, a substituted or unsubstituted alkyl group or —C(Y)$_3$; and Y represents a chlorine atom or a bromine atom.

Specific examples of such compounds are set forth below, but the present invention should not be construed as being limited thereto.

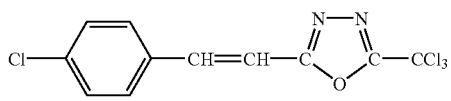

(PAG1-1)

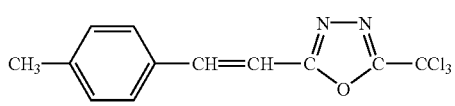

(PAG1-2)

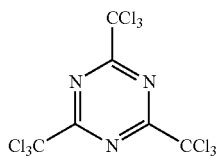

(PAG2-1)

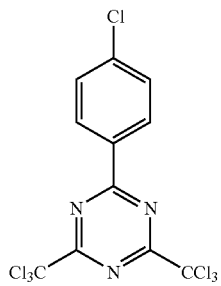

(PAG2-2)

(2) Iodonium salt represented by formula (PAG3) shown below or sulfonium salt represented by formula (PAG4) shown below.

(PAG3)

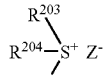

(PAG4)

In formulae (PAG3) and (PAG4), $Ar^1$ and $Ar^2$, which may be the same or different, each independently represent a substituted or unsubstituted aryl group. Preferred examples of the substituent include an alkyl group, a haloalkyl group, a cycloalkyl group, an aryl group, an alkoxy group, a nitro group, a carboxy group, an alkoxycarbonyl group, a hydroxy group, a mercapto group and a halogen atom.

$R^{203}$, $R^{204}$ and $R^{205}$, which may be the same or different, each independently represent a substituted or unsubstituted alkyl group or a substituted or unsubstituted aryl group, preferably an aryl group having from 6 to 14 carbon atoms, an alkyl group having 1 to 8 carbon atoms or a substituted derivative thereof. Preferred examples of the substituent for the aryl group include an alkoxy group having from 1 to 8 carbon atoms, an alkyl group having from 1 to 8 carbon atoms, a nitro group, a carboxy group, a hydroxy group and a halogen atom. Preferred examples of the substituent for the alkyl group include an alkoxy group having from 1 to 8 carbon atoms, a carboxy group and an alkoxycarbonyl group.

$Z^-$ represents a counter anion. Examples the counter anion include $BF_4^-$, $AsF_6^-$, $PF_6^-$, $SbF_6^-$, $SiF_6^{2-}$, $ClO_4^-$, a perfluoroalkane sulfonic acid anion, e.g., $CF_3SO_3^-$, pentafluolobenzenesulfonic acid anion, a condensed polynuclear aromatic sulfonic acid anion, e.g., naphthalene-1-sulfonic acid anion, an anthraquinonesulfonic acid anion and a dye containing a sulfonic acid group. However, the present invention should not be construed as being limited to these examples.

Alternatively, two of $R^{203}$, $R^{204}$ and $R^{205}$, or $Ar^1$ and $Ar^2$ may be connected with each other through a single bond or a substituent.

Specific examples of such compounds are set forth below, but the present invention should not be construed as being limited thereto.

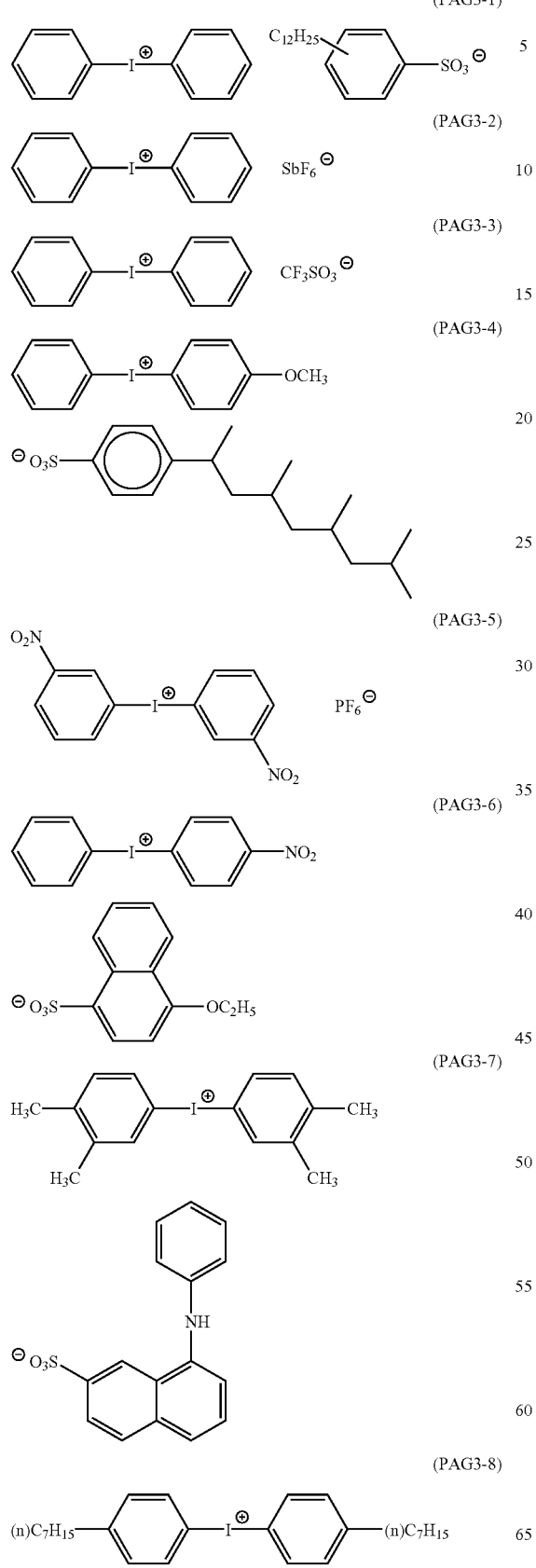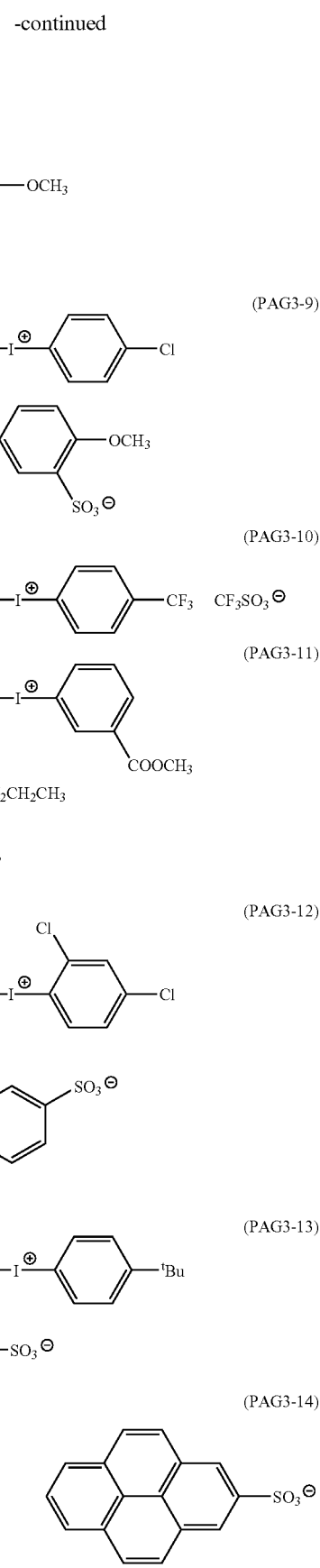

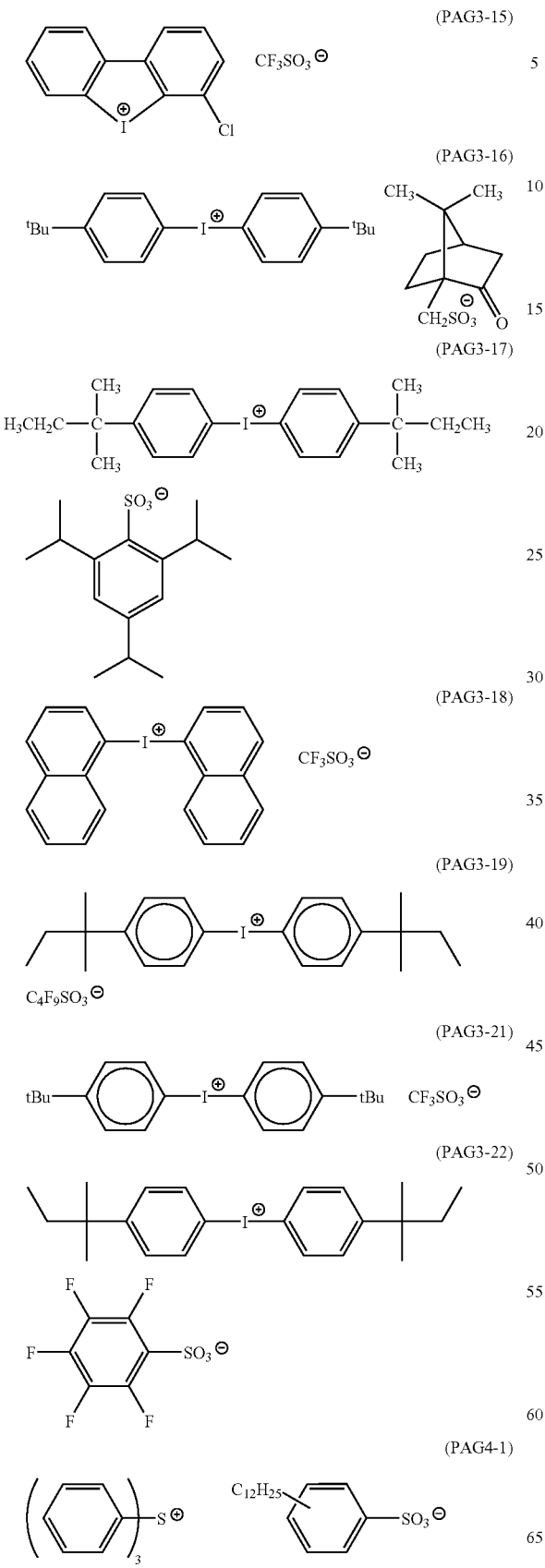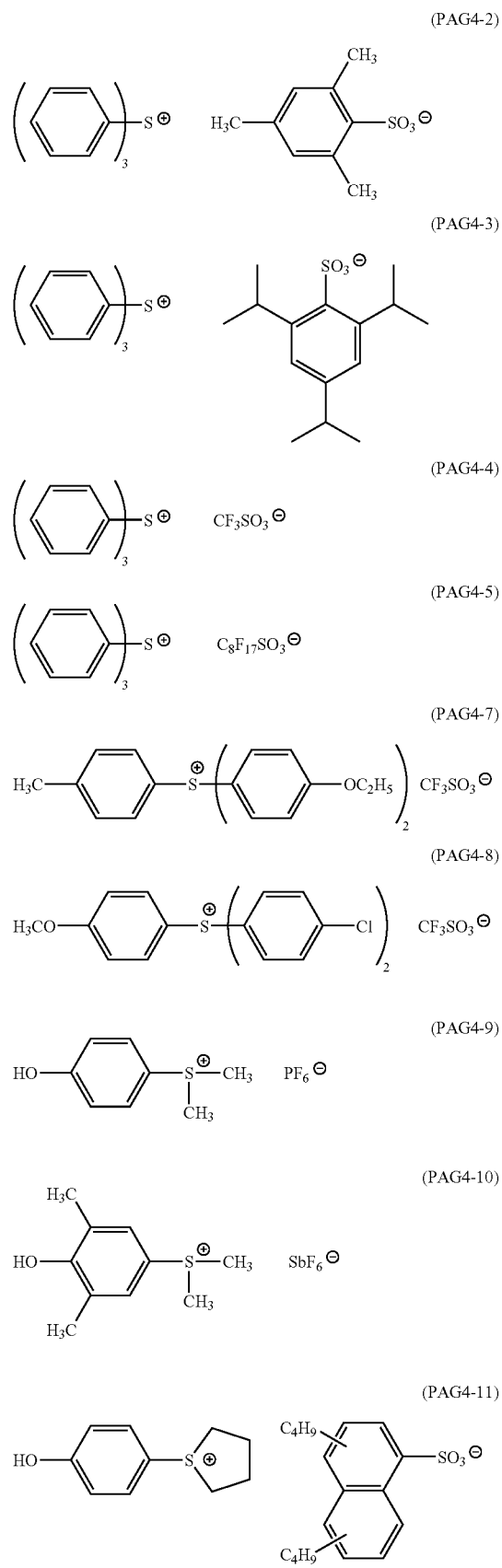

-continued
(PAG4-12)
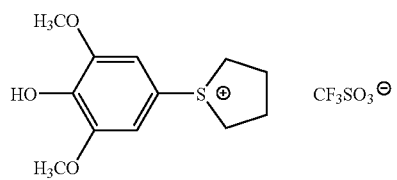
(PAG4-13)
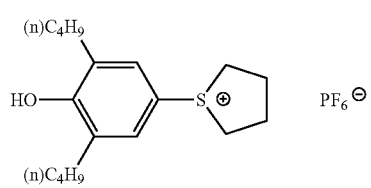
(PAG4-14)
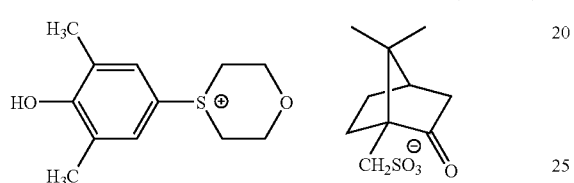
(PAG4-15)
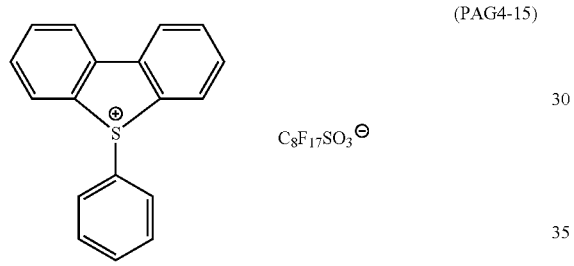
(PAG4-16)
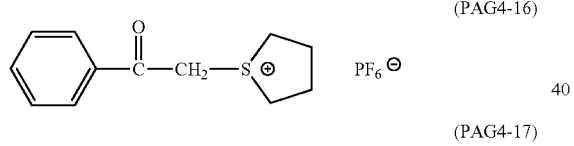
(PAG4-17)
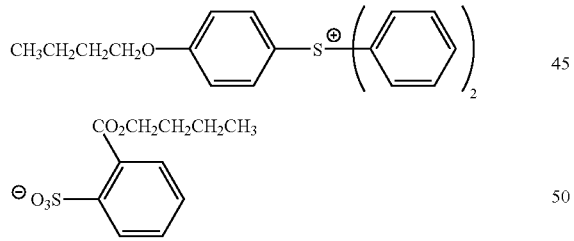
(PAG4-18)
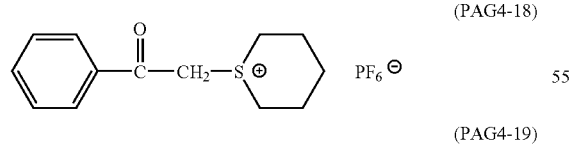
(PAG4-19)
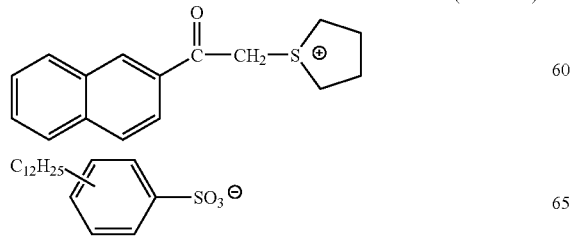
-continued
(PAG4-20)
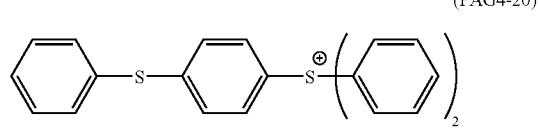
(PAG4-21)
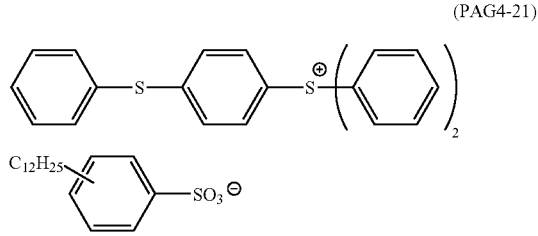
(PAG4-22)
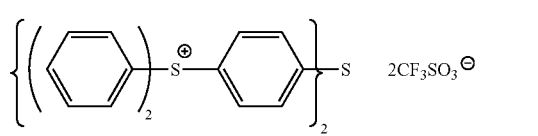
(PAG4-23)
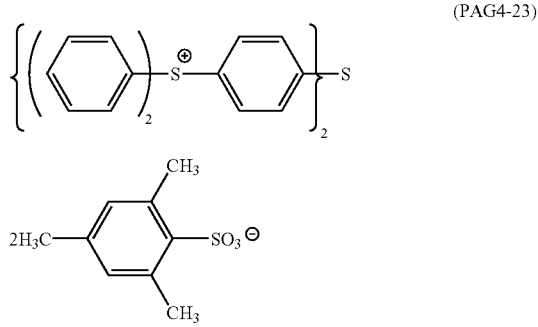
(PAG4-24)
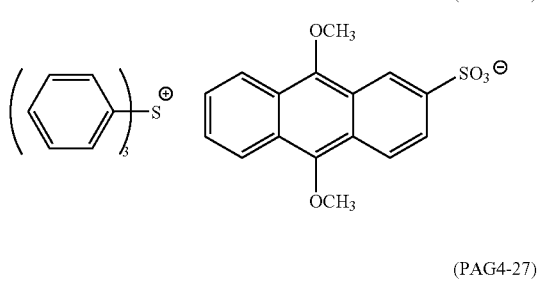
(PAG4-27)
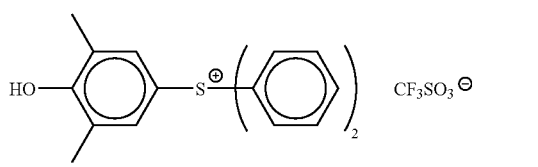
(PAG4-28)
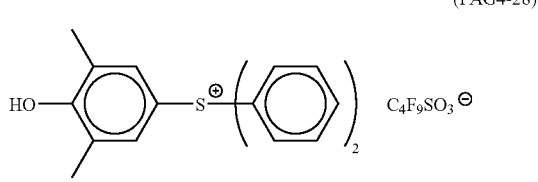

(PAG4-29)
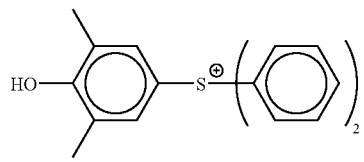

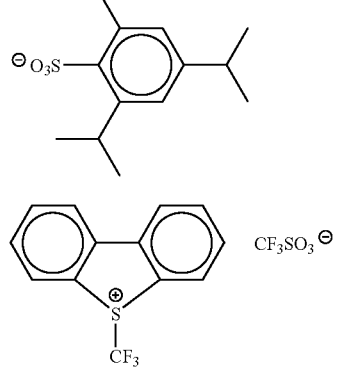
(PAG4-30)

(PAG4-31)

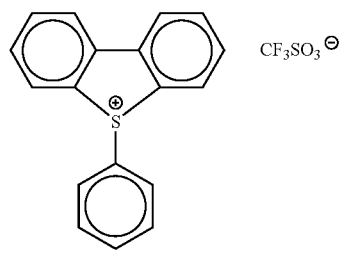
(PAG4-32)

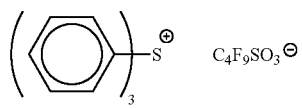
(PAG4-33)

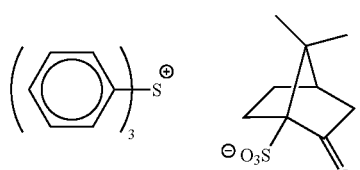

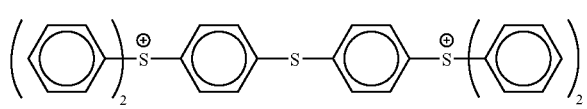
(PAG4-34)

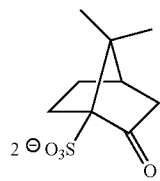

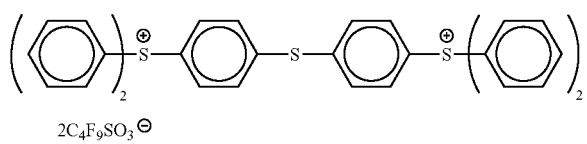
(PAG4-35)

(PAG4-36)
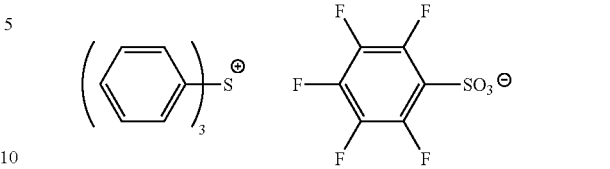

(PAG4-37)
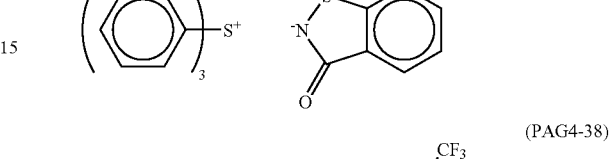

(PAG4-38)
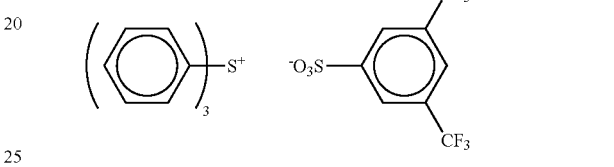

The onium salts represented by formulae (PAG3) and (PAG4) are known and can be synthesized, for example, by methods as described in U.S. Pat. Nos. 2,807,648 and 4,247,473, and JP-A-53-101331.

(3) Disulfone derivative represented by formula (PAG5) shown below and iminosulfonate derivative represented by formula (PAG6) shown below.

(PAG5)

(PAG6)
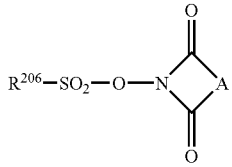

In formulae (PAG5) and (PAG6), $Ar^3$ and $Ar^4$, which may be the same or different, each independently represent a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Specific examples of such compounds are set forth below, but the present invention should not be construed as being limited thereto.

(PAG5-1)
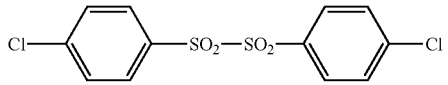

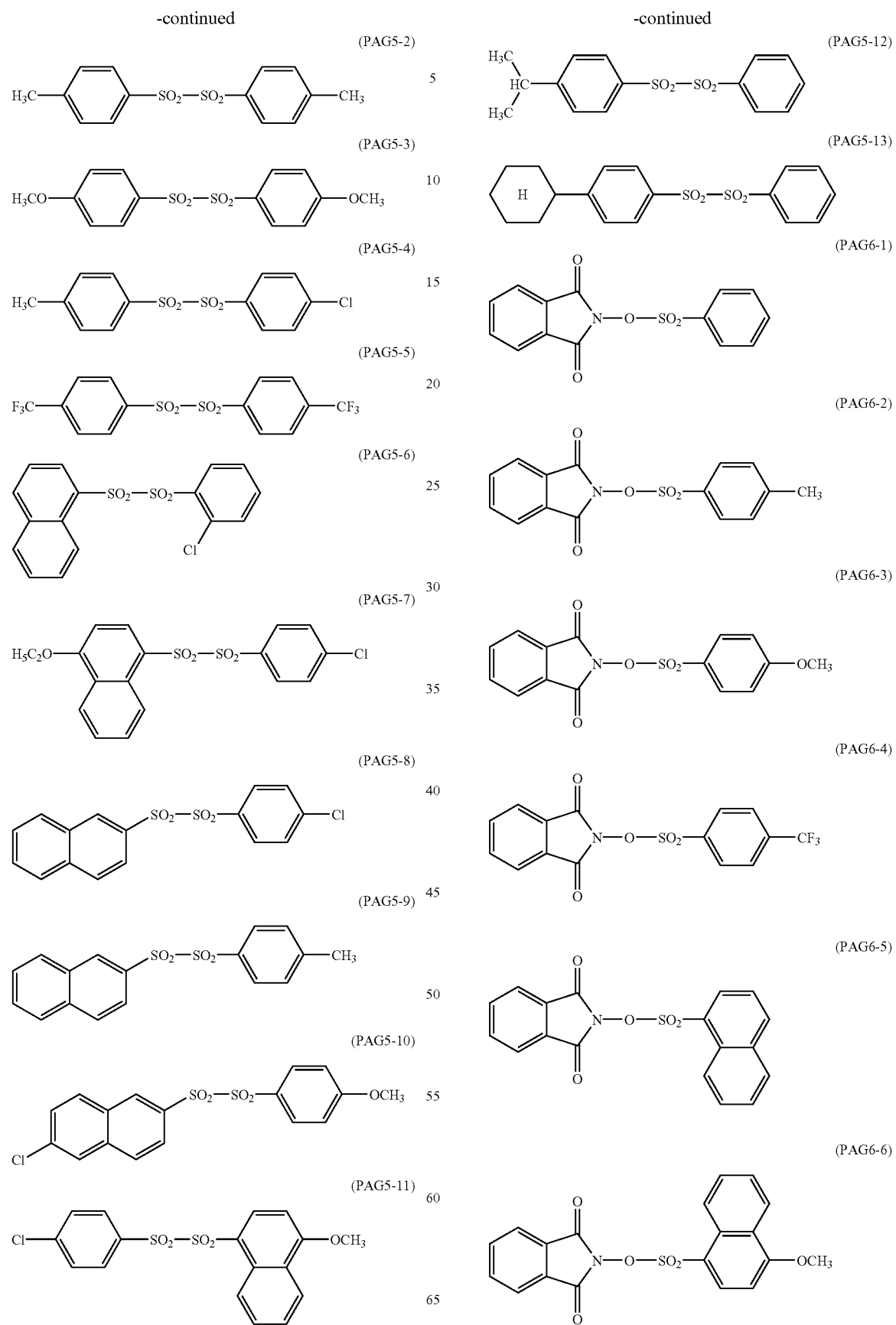

-continued (PAG6-7) 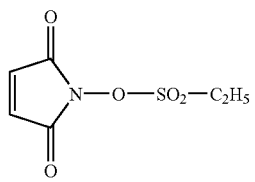

(PAG6-8) 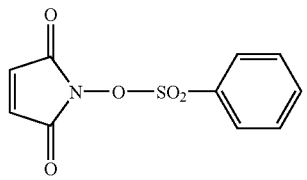

(PAG6-9) 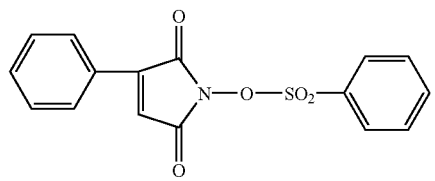

(PAG6-10) 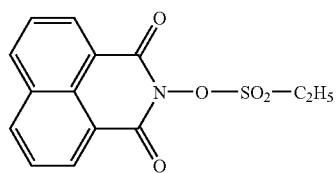

(PAG6-11) 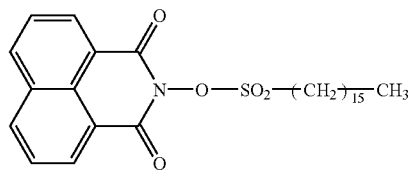

(PAG6-12) 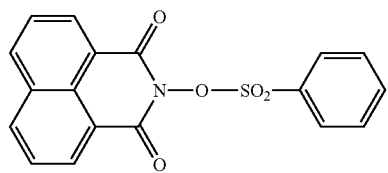

(PAG6-13) 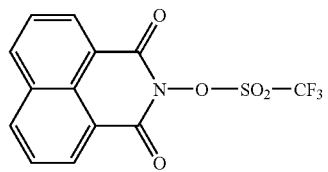

(4) Diazodisulfone derivative represented by formula (PAG7) shown below.

(PAG7) 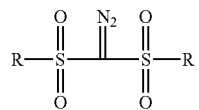

In formula (PAG7), R represents a straight-chain, branched or cyclic alkyl group or an aryl group which may have a substituent.

Specific examples of such compounds are set forth below, but the present invention should not be construed as being limited thereto.

(PAG7-1)

![](PAG7-1 structure: phenyl-SO2-C(N2)-SO2-phenyl)

(PAG7-2)

![](PAG7-2 structure: dimethylphenyl-SO2-C(N2)-SO2-dimethylphenyl)

(PAG7-3)

![](PAG7-3 structure: cyclohexyl-SO2-C(N2)-SO2-cyclohexyl)

(PAG7-4)

![](PAG7-4 structure: tolyl-SO2-C(N2)-SO2-tolyl)

(PAG7-5)

![](PAG7-5 structure: t-Bu-SO2-C(N2)-SO2-t-Bu)

Particularly preferred examples of the photo-acid generator used in combination with the acid generator of Component (B) in the present invention include the iminosulfonate derivative represented by formula (PAG6) and the diazodisulfone derivative represented by formula (PAG7), and specific examples thereof are set forth below.

(a1) 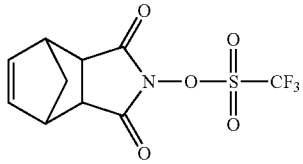

(a2) 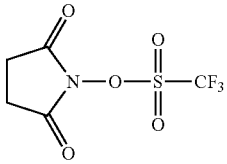

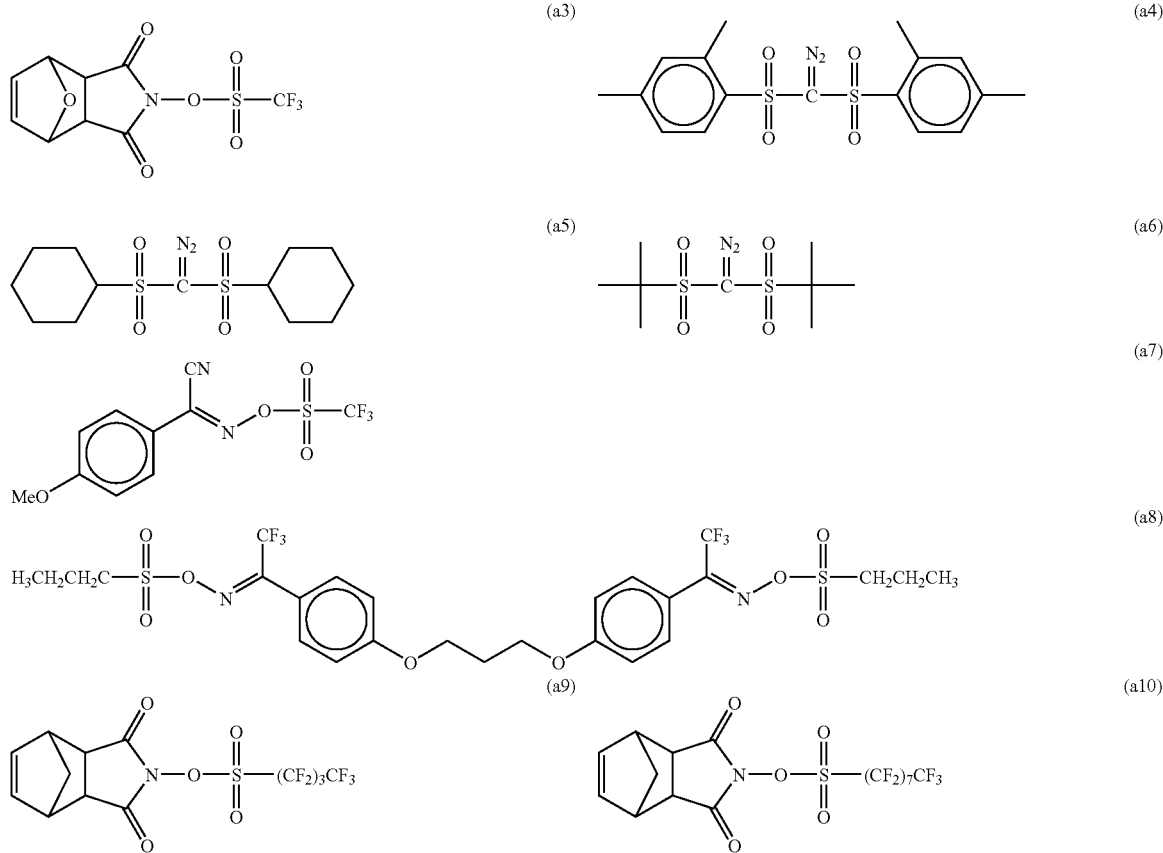

[3] Fluorine-Based and/or Silicon-Based Surface Active Agent of Component (C) of the Present Invention:

The positive resist composition of the present invention preferably contains a fluorine-based and/or silicon-based surface active agent of Component (C).

Specifically, it is preferred that the positive resist composition of the present invention contains one or more of a fluorine atom-containing surface active agent, a silicon atom-containing surface active agent and a surface active agent containing both a fluorine atom and a silicon atom. The addition of such a fluorine-based and/or silicon-based surface active agent is effective for the suppression of development defect and the improvement in coating property.

Examples of the surface active agent include those as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,296,143, 5,294,511 and 5,824,451. Commercially available surface active agents described below may also be used as they are.

Examples of the commercially available surface active agent, which can be used, include, e.g., Eftop EF301, EF303 and EF352 (manufactured by Shin-Akita Kasei Co., Ltd.), Florad FC430 and 431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as the silicon-based surface active agent.

The amount of surface active agent used is ordinarily from 0.1 to 10,000 ppm, and preferably from 1 to 1,000 ppm, on the basis of a solution of the positive resist composition of the present invention. The surface active agents may be used individually or in combination of two or more thereof.

[4] Acid Diffusion Preventing Agent of Component (D) of the Present Invention:

It is preferred that the positive resist composition of the present invention contains an acid diffusion preventing agent for the purpose of preventing fluctuations in performances (for example, formation of T-top shaped pattern, fluctuation in sensitivity or fluctuation in linewidth of pattern) with the lapse of time between the irradiation of an active ray or radiation and a heat treatment, fluctuations in performances with the lapse of time after coating, or excessive diffusion of the acid at the heat treatment after the irradiation of an active ray or radiation, which results in deterioration of the resolution. AS the acid diffusion preventing agent, an organic basic compound, for example, an organic basic compound containing a basic nitrogen atom, and preferably a compound exhibiting pKa of a conjugated acid of not less than 4 is used.

Specifically, compounds having a structure represented by any one of formulae (A) to (E) shown below are used.

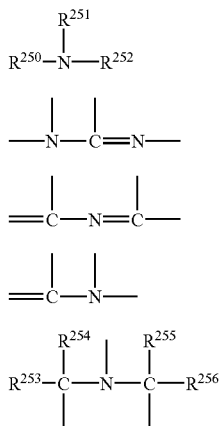

In the above formulae, $R^{250}$, $R^{251}$ and $R^{252}$ which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{251}$ and $R^{252}$ may be connected with each other to form a ring; and $R^{253}$ $R^{254}$ $R^{255}$ and $R^{256}$, which may be the same or different, each represent an alkyl group having from 1 to 6 carbon atoms.

More preferred compounds are nitrogen-containing basic compounds having two or more nitrogen atoms having different chemical circumstances per molecule, and particularly preferred compounds are compounds having both a substituted or unsubstituted amino group and a cyclic structure containing a nitrogen atom and compounds having an alkylamino group.

Preferred examples of the organic basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted imidazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted piperidines, substituted or unsubstituted aminomorpholines and substituted or unsubstituted aminoalkylmorpholines.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferred examples of the organic basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, the organic basic compounds for use in the present invention should not be construed as being limited to these compounds.

The organic basic compounds may be used individually or as a mixture of two or more thereof.

A molar ratio of the acid generator to the organic basic compound (acid generator)/(organic basic compound) used in the positive resist composition is preferably from 2.5 to 300. When the molar ratio is less than 2.5, the sensitivity may decrease and the resolution may be degraded. On the other hand, when it exceeds 300, pattern size may increase and the resolution may be degraded. The molar ratio of (acid generator)/(organic basic compound) is preferably from 5.0 to 200, and more preferably from 7.0 to 150.

[5] Other Components Used in the Positive Resist Composition of the Present Invention:

(1) Solvent

The positive resist composition of the present invention is used by dissolving the above-described components in a solvent that can dissolve the components, and coating the resulting solution on a substrate. Examples of the solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. The solvents may be used individually or as a mixture of two or more thereof.

The steps of pattern formation on the resist film, for example, in the production of precise integrated circuit devices comprises applying the positive resist composition of the present invention to a substrate (for example, silicon/silicon dioxide coating, a transparent substrate, e.g., glass substrate or ITO substrate), irradiating the resist film using an active ray or radiation lithography apparatus, followed by heating, developing, rinsing and drying. Thus, good resist patterns are obtained.

The developing solution, which can be used for the positive resist composition of the present invention, is an aqueous solution of alkali, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide, tetraethylammonium hydroxide or choline, and a cyclic amine, e.g., pyrrole or piperidine. A developing solution prepared by adding an appropriate amount of an alcohol, for example, isopropyl alcohol or a surface active agent, for example, a nonionic surface active agent to the above-described aqueous solution of alkali is also used.

Of the developers, those containing a quaternary ammonium salt are preferred and, those containing tetramethylammonium hydroxide or choline are more preferred.

The present invention will be described in greater detail with reference to the following examples, but the present invention should not be construed as being limited thereto.

SYNTHESIS EXAMPLE 1

In a one-liter autoclave was charged 150 ml of a 1,1,2-trichloro-trifluoroethane solution containing 9.4 g (0.10 mol) of norbornene and 19.4 g (0.10 mol) of tert-butyl norbornene-2-carboxylate and the autoclave was pressurized with nitrogen gas at 200 psi. Then, 20 g (0.20 mol) of tetrafluoroethylene was charged and the mixture was heated at 50° C. with stirring. To the reaction solution was charged 15 ml of a 1,1,2-trichloro-trifluoroethane solution containing 1.2 g of di(4-tert-butylcyclohexyl)peroxydicarbonate over a period of 20 minutes, followed by continuing to stir for 20 hours. After the completion of the reaction, the reaction solution was poured into 2 liters of methanol with vigorously stirring to deposit a white resin. The resin deposited was collected by filtration and dried in vacuo to obtain 23.5 g of Resin (1) according to the present invention.

The weight average molecular weight (Mw) of Resin (1) measured by GPC was 6,200. As a result of examining the composition of Resin (1) by means of $C^{13}$-NMR measurement, it was found that a molar ratio of structural units (F-1)/norbornene/(B-16) was 45/30/25.

The reference number of structural unit used herein means the number assigned to each of the repeating structural units shown hereinbefore as the specific examples with respect to the resin of Component (A) according to the present invention.

SYNTHESIS EXAMPLE 2

In 100 ml of methyl ethyl ketone (MEK) were dissolved 14.3 g (0.04 mol) of Monomer (a) shown below, 3.9 g (0.04 mol) of maleic anhydride and 2.6 g (0.02 mol) of tert-butyl acrylate and the solution was heated at 70° C. under nitrogen atmosphere. To the solution was added 0.2 g of V-601 (manufactured by Wako Pure Chemical Industries, Ltd.) as a polymerization initiator, followed by stirring for 3 hours. Further, 0.2 g of V-601 was added thereto, followed by continuing to stir for 4 hours. Then, the reaction solution was poured into one liter of tert-butyl methyl ether with vigorously stirring to deposit a white resin. The resin deposited was collected by filtration and dried in vacuo to obtain 12.1 g of Resin (2) according to the present invention.

The weight average molecular weight (Mw) of Resin (2) measured by GPC was 8,900. As a result of examining the composition of Resin (2) by means of $C^{13}$-NMR measurement, it was found that a molar ratio of structural units (F-21)/ maleic anhydride /(B-4) was 39/38/23.

Monomer (a)

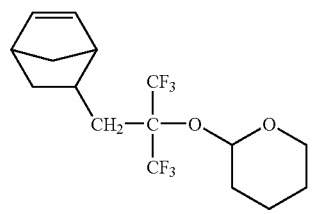

SYNTHESIS EXAMPLE 3

In 30 ml of 1-methoxy-2-propanol were dissolved 6.7 g (0.015 mol) of Monomer (b) shown below, 1.4 g (0.006 mol) of 2-methyl-2-adamanthane methacrylate and 1.8 g (0.009 mol) of mevalonic lactone methacrylate. To the solution were added dropwise 0.1 g of 2,2'-azobis(2,4-dimethylvaleronitrile) (V-65 manufactured by Wako Pure Chemical Industries, Ltd.) as a polymerization initiator and 70 ml of 1-methoxy-2-propanol solution containing 15.6 g (0.035 mol) of Monomer (b), 3.3 g (0.014 mol) of 2-methyl-2-adamanthane methacrylate and 4.2 g (0.021 mol) of mevalonic lactone methacrylate at 70° C. under nitrogen atmosphere with stirring over a period of 2 hours. After the reaction for 2 hours, 0.1 g of the polymerization initiator was further added, followed by reacting for 2 hours. The temperature of reaction solution was raised to 90° C., followed by continuing to stir for one hour. The reaction solution was allowed to cool and poured into one liter of a mixture of ion-exchanged water and methanol (1/1) with vigorously stirring to deposit a white resin. The resin deposited was collected by filtration and dried in vacuo to obtain 15.8 g of Resin (3) according to the present invention.

The weight average molecular weight (Mw) of Resin (3) measured by GPC was 10,200. As a result of examining the composition of Resin (3) by means of $C^{13}$-NMR measurement, it was found that a molar ratio of structural units (F-30)/ (B-7)/(B-11) was 48/21/31.

Monomer (b)

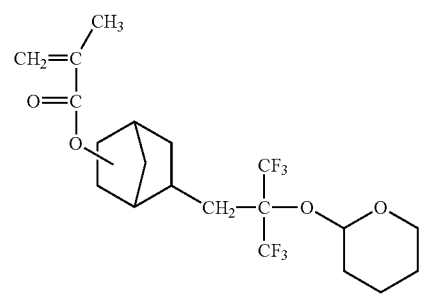

SYNTHESIS EXAMPLES 4 TO 8

The resins of Component (A) shown in Table 1 below according to the present invention were synthesized in a manner similar to the synthesis examples above.

TABLE 1

Synthesis of Resin of Component (A) according to Invention

| Resin of Component (A) | Composition (structural unit and molar ratio in resin) | Molecular Weight |
|---|---|---|
| (4) | (F-1)/(F-21)/(B-16) = 48/33/19 | 4,500 |
| (5) | (F-50)/(B-7)/(B-11) = 31/35/34 | 9,200 |
| (6) | (F-55)/maleic anhydride/(B-4) = 40/37/23 | 7,400 |
| (7) | (F-16)/maleic anhydride/(B-8) = 43/34/23 | 6,300 |
| (8) | (F-26)/maleic anhydride/(B-12) = 40/33/27 | 8,900 |

SYNTHESIS EXAMPLE 9

In a one-liter autoclave was charged 150 ml of a 1,1,2-trichloro-trifluoroethane solution containing 9.4 g (0.10 mol) of norbornene and 35.8 g (0.10 mol) of Monomer (a) shown below and the autoclave was pressurized with nitrogen gas at 200 psi. Then, 20 g (0.20 mol) of tetrafluoroethylene was charged and the mixture was heated at 50° C. with stirring. To the reaction solution was charged 15 ml of a 1,1,2-trichloro-trifluoroethane solution containing 1.2 g of di(4-tert-butylcyclohexyl)peroxydicarbonate over a period of 20 minutes, followed by continuing to stir for 20 hours. After the completion of the reaction, the reaction solution was poured into 2 liters of methanol with vigorously stirring to deposit a white resin. The resin deposited was collected by filtration and dried in vacuo to obtain 37.4 g of Resin (9) according to the present invention.

The weight average molecular weight (Mw) of Resin (9) measured by GPC was 8,800. As a result of examining the composition of Resin (9) by means of $C^{13}$-NMR measurement, it was found that a molar ratio of structural units (F-1)/(F-21)/norbornene was 48/30/22.

Monomer (a)

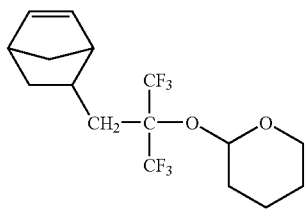

SYNTHESIS EXAMPLE 10

In the same manner as in Synthesis Example 9 except for using 32.2 g (0.04 mol) of Monomer (c) shown below in place of Monomer (a), 34.1 g of Resin (10) according to the present invention was synthesized.

The weight average molecular weight (Mw) of Resin (10) measured by GPC was 7,400. As a result of examining the composition of Resin (10) by means of $C^{13}$-NMR measurement, it was found that a molar ratio of structural units (F-1)/(F-15)/norbornene was 49/25/26.

Monomer (c)

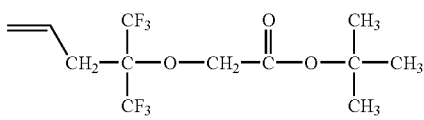

SYNTHESIS EXAMPLES 11 TO 14

The resins of Component (A) shown in Table 2 below according to the present invention were synthesized in a manner similar to the synthesis examples above.

TABLE 2

Synthesis of Resin of Component (A) according to Invention

| Resin of Component (A) | Composition (structural unit and molar ratio in resin) | Molecular Weight |
|---|---|---|
| (11) | (F-1)/(F-20)/(B-4) = 48/30/22 | 9,300 |
| (12) | (F-2)/(F-22)/(B-4) = 42/39/19 | 7,900 |
| (13) | (F-12)/(F-21)/norbornene = 23/38/39 | 5,800 |
| (14) | (F-1)/(F-16)/(B-16) = 34/26/40 | 9,500 |

SYNTHESIS EXAMPLE 15

In 100 ml of methyl ethyl ketone (MEK) were dissolved 14.3 g (0.04 mol) of Monomer (a) shown below, 3.9 g (0.04 mol) of maleic anhydride and 11.7 g (0.02 mol) of 2-(perfluorooctyl)ethyl norbornene-2-carboxylate and the solution was heated at 70° C. under nitrogen atmosphere. To the solution was added 0.2 g of V-601 (manufactured by Wako Pure Chemical Industries, Ltd.) as a polymerization initiator, followed by stirring for 3 hours. Further, 0.2 g of V-601 was added thereto, followed by continuing to stir for 4 hours. Then, the reaction solution was poured into one liter of tert-butyl methyl ether with vigorously stirring to deposit a white resin. The resin deposited was collected by filtration and dried in vacuo to obtain 16.2 g of Resin (15) according to the present invention.

The weight average molecular weight (Mw) of Resin (15) measured by GPC was 8,700. As a result of examining the composition of Resin (15) by means of $C^{13}$-NMR measurement, it was found that a molar ratio of structural units (F-21)/(F-55)/maleic anhydride was 42/18/40.

Monomer (a)

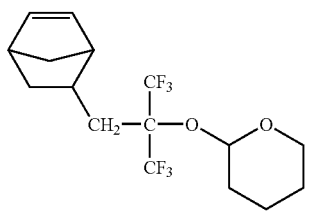

SYNTHESIS EXAMPLE 16

In 30 ml of 1-methoxy-2-propanol were dissolved 6.7 g (0.015 mol) of Monomer (b) shown below, 2.7 g (0.005 mol) of 2-(perfluorooctyl)ethyl methacrylate, 1.2 g (0.005 mol) of 2-methyl-2-adamanthane methacrylate and 1.0 g (0.005 mol) of mevalonic lactone methacrylate. To the solution were added dropwise 0.1 g of 2,2'-azobis(2,4-dimethylvaleronitrile) (V-65 manufactured by Wako Pure Chemical Industries, Ltd.) as a polymerization initiator and 70 ml of 1-methoxy-2-propanol solution containing 15.6 g (0.035 mol) of Monomer (b), 6.4 g (0.012 mol) of 2-(perfluorooctyl)ethyl methacrylate, 2.8 g (0.012 mol) of 2-methyl-2-adamanthane methacrylate and 2.4 g (0.012 mol) of mevalonic lactone methacrylate at 70° C. under nitrogen atmosphere with stirring over a period of 2 hours. After the reaction for 2 hours, 0.1 g of the polymerization initiator was further added, followed by reacting for 2 hours. The temperature of reaction solution was raised to 90° C., followed by continuing to stir for one hour. The reaction solution was allowed to cool and poured into one liter of a mixture of ion-exchanged water and methanol (1/1) with vigorously stirring to deposit a white resin. The resin deposited was collected by filtration and dried in vacuo to obtain 21.5 g of Resin (16) according to the present invention.

The weight average molecular weight (Mw) of Resin (16) measured by GPC was 10,500. As a result of examining the composition of Resin (16) by means of $C^{13}$-NMR measurement, it was found that a molar ratio of structural units (F-30)/ (F-48)/(B-7)/(B-11) was 48/15/18/19.

Monomer (b)

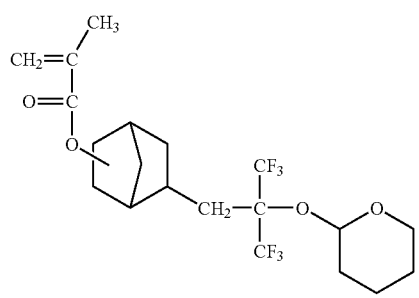

SYNTHESIS EXAMPLES 17 TO 19

The resins of Component (A) shown in Table 3 below according to the present invention were synthesized in a manner similar to the synthesis examples above.

TABLE 3

Synthesis of Resin of Component (A) according to Invention

| Resin of Component (A) | Composition (structural unit and molar ratio in resin) | Molecular Weight |
|---|---|---|
| (17) | (F-15)/(F-58)/maleic anhydride = 30/24/46 | 9,700 |
| (18) | (F-25)/(F-55)/(B-4)/maleic anhydride = 21/18/25/36 | 7,800 |
| (19) | (F-30)/(F-54)/(B-7)/(B-13) = 38/15/31/16 | 9,900 |

SYNTHESIS EXAMPLE 20

In 100 ml of N,N-dimethylacetamide were dissolved 13.5 g (0.05 mol) of 4-[bis(trifluoromethyl)-hydroxymethyl]styrene and 3.4 g (0.05 mol) of methacrylonitrile and the solution was heated at 70° C. under nitrogen atmosphere. To the solution was added 0.1 g of 2,2'-azobis(2,4-dimethylvaleronitrile) (V-65 manufactured by Wako Pure Chemical Industries, Ltd.) as a polymerization initiator, followed by stirring for 3 hours. Further, 0.1 g of V-65 was added thereto, followed by continuing to stir for 4 hours. Then, the reaction solution was poured into one liter of a mixture of methanol and tert-butyl methyl ether (1/1) with vigorously stirring to deposit a white resin. The resin deposited was collected by filtration, dried in vacuo and then dissolved in 100 ml of tetrahydrofuran (THF). To the solution were added 2.9 g (0.04 mol) of ethyl vinyl ether and then a catalytic amount of p-toluenesulfonic acid, followed by stirring at room temperature for 8 hours. To the solution was added triethylamine in an amount of twice of the amount of p-toluenesulfonic acid to terminate the reaction, and the reaction solution was poured into 3 liters of pure water with vigorous stirring. The resin thus-deposited was collected by filtration, dried in vacuo to obtain 14.1 g of Resin (20) according to the present invention.

The weight average molecular weight (Mw) of Resin (20) measured by GPC was 10,900. As a result of examining the composition of Resin (20) by means of $C^{13}$-NMR measurement, it was found that a molar ratio of structural units (F-39)/(F-42)/(C-10) was 16/36/48.

SYNTHESIS EXAMPLES 21 TO 23

The resins of Component (A) shown in Table 4 below according to the present invention were synthesized in a manner similar to the synthesis examples above.

TABLE 4

Synthesis of Resin of Component (A) according to Invention

| Resin of Component (A) | Composition (structural unit and molar ratio in resin) | Molecular Weight |
|---|---|---|
| (21) | (F-39)/(F-41)/(C-10) = 14/38/48 | 11,100 |
| (22) | (F-39)/(F-43)/(C-10) = 13/39/48 | 12,600 |
| (23) | (F-1)/(B-4)/(C-8) = 43/34/23 | 7,400 |

SYNTHESIS EXAMPLES 24 TO 41

Synthesis of Resin (25)

In a 100-ml, three necked flask equipped with a reflux condenser and a nitrogen inlet pipe were charged 4-(2-hydroxyhexafluoroisopropyl)styrene (manufactured by Central Glass Co., Ltd.) and 4-(1-methoxyethyl)styrene (manufactured by Tosoh Corp.) in a molar ratio of 50/50 and tetrahydrofuran was added thereto to prepare 30 g of a reaction solution having the monomer concentration of 30% by weight. The reaction solution was heated to 65° C. with stirring under nitrogen atmosphere. Then, 2,2'-azobis(2,4-dimethylvaleronitrile) (V-65 manufactured by Wako Pure Chemical Industries, Ltd.) was added thereto as a polymerization initiator in an amount corresponding to 5.0% by mole based on the total molar amount of the above-described two kinds of monomers, followed by reacting with stirring under nitrogen atmosphere for 8 hours. To the resulting reaction solution was added 200 ml of hexane, the polymer synthesized was deposited in the solution to separate the unreacted monomer, thereby purifying the polymer. The composition of Resin (25) determined by means of $C^{13}$-NMR measurement was 49/51 in a molar ratio.

As a result of analyzing the resin by GPC (using tetrahydrofuran (THF) as the solvent) and being calculated in terms of standard polystyrene, it was found that the weight average molecular weight was 10,200, the dispersity was 2.20 and the ratio of component having the molecular weight of 1,000 or less in the resin was 15% by weight.

The resins of Component (A) shown in Table 5 below according to the present invention were synthesized in a manner similar to the synthesis example above.

TABLE 5

Synthesis of Resin of Component (A) according to Invention

| Resin of Component (A) | Composition (structural unit and molar ratio in resin) | Molecular Weight |
|---|---|---|
| (24) | (II-1)/(A-1) = 48/52 | 8,900 |
| (25) | (II-1)/(A-2) = 49/51 | 10,200 |
| (26) | (II-1)/(A-3') = 53/47 | 5,800 |
| (27) | (II-1)/(A-10) = 61/39 | 10,200 |
| (28) | (II-1)/(A-19) = 64/36 | 8,500 |
| (29) | (II-1)/(A-34) = 60/40 | 8,600 |
| (30) | (II-1)/(A-35) = 51/49 | 8,800 |
| (31) | (II-2)/(A-19) = 64/36 | 10,100 |
| (32) | (II-4)/(A-26) = 52/48 | 12,100 |
| (33) | (II-1)/(B-7) = 78/22 | 9,200 |
| (34) | (II-1)/(A-19)/(VII-2) = 64/26/10 | 9,200 |
| (35) | (II-1)/(A-19)/(F72) = 58/33/9 | 9,500 |
| (36) | (II-1)/(B-4)/(VII-2) = 61/24/15 | 10,600 |
| (37) | (II-3)/(B-8)/(F-7) = 49/36/15 | 9,200 |
| (38) | (II-4)/(B-12')/(F-24) = 59/33/8 | 8,300 |
| (39) | (II-1)/(A-1)/(B-6) = 48/30/22 | 9,200 |
| (40) | (II-1)/(A-2)/(B-8) = 51/39/10 | 8,400 |
| (41) | (II-1)/(A-1)/(B-1)/(C-1) = 48/36/11/5 | 10,200 |

EXAMPLES 101 TO 126 AND COMPARATIVE EXAMPLES 101 TO 103

A sample solution was prepared by dissolving 1.2 g of the resin of Component (A) as shown in Tables 1 to 5 above, 0.03 g of the photo-acid generator (Component (B) of the present invention or other acid generator), 100 ppm of the surface active agent of Component (C) and 0.0012 g of the basic compound of Component (D) in 19.6 g of the solvent, as shown in Table 6 below. The solution was filtered through a Teflon filter having a pore size of 0.1 μm, whereby a positive resist composition for each of Examples 101 to 126 and Comparative Example 101 to 103 was prepared.

The reference number of photo-acid generator used in Table 6 means the number assigned to each of the acid generators shown hereinbefore as the specific examples.

TABLE 6

| Example | Resin (A) | Photo-Acid Generator (weight ratio) | Surface Active Agent (C) | Basic Compound (D) (weight ratio) | Solvent (weight ratio) |
|---|---|---|---|---|---|
| 101 | (1) | (II-1) | W-1 | N-3 | S-2 |
| 102 | (2) | (II-2) | W-1 | N-1 | S-2 |

TABLE 6-continued

| Example | Resin (A) | Photo-Acid Generator (weight ratio) | Surface Active Agent (C) | Basic Compound (D) (weight ratio) | Solvent (weight ratio) |
|---|---|---|---|---|---|
| 103 | (3) | (II-3) | W-1 | N-1/N-2 = 50/50 | S-2 |
| 104 | (4) | (II-4) | W-1 | N-4 | S-2 |
| 105 | (5) | (II-5) | W-1 | N-2 | S-2 |
| 106 | (6) | (II-6) | W-1 | N-6 | S-2 |
| 107 | (7) | (II-7) | W-2 | N-3 | S-2 |
| 108 | (8) | (II-8) | W-1 | N-7 | S-2 |
| 109 | (9) | (II-9) | W-1 | N-5 | S-2/S-3 = 80/20 |
| 110 | (10) | (II-10) | W-1 | N-4 | S-2 |
| 111 | (11) | (II-11) | W-2 | N-2/N-3 = 50/50 | S-2/S-3 = 90/10 |
| 112 | (12) | (II-12) | W-1 | N-5 | S-2 |
| 113 | (13) | (II-13) | W-1 | N-3 | S-2 |
| 114 | (14) | (II-14) | W-1 | N-1 | S-2 |
| 115 | (15) | (II-15) | W-1 | N-2 | S-2/S-3 = 70/30 |
| 116 | (17) | (II-16) | W-2 | N-6 | S-2 |
| 117 | (18) | (II-17) | W-2 | N-1 | S-2 |
| 118 | (19) | (II-19) | W-1 | N-7 | S-2 |
| 119 | (21) | (II-20) | W-1 | N-7 | S-2 |
| 120 | (22) | (II-21) | W-1 | N-1 | S-2 |
| 121 | (23) | (II-22) | W-1 | N-1 | S-2 |
| 122 | (39) | (II-11)/(III-48) = 50/50 | W-2 | N-2 | S-2 |
| 123 | (41) | (II-11)/(III-1) = 50/50 | W-1 | N-3 | S-1/S-2 = 5/95 |
| 124 | (24) | (II-11)/(PAG4-1) = 50/50 | W-1 | N-3 | S-2/S-3 = 90/10 |
| 125 | (26) | (II-11)/(PAG5-1) = 50/50 | W-1 | N-4 | S-1/S-2 = 5/95 |
| 126 | (32) | (II-11)/(PAG7-1) = 50/50 | W-1 | N-5 | S-2 |
| Comparative Example 101 | (1) | (PAG4-1) | W-1 | N-2 | S-2 |
| Comparative Example 102 | (26) | (PAG4-1) | W-1 | N-3 | S-1/S-2 = 5/95 |
| Comparative Example 103 | (*1) | (II-1) | W-2 | N-2 | S-2 |

(*1): [p-1-(ethoxy)ethoxy]styrene/p-hydroxystyrene = 35/65

In Table 6 above, the abbreviations of the surface active agents indicate the following compounds:

W-1: Megafax F176 (manufactured by Dainippon Ink and Chemicals, Inc.) (fluorine-based)

W-2: Megafac R08 (manufactured by Dainippon Ink and Chemicals, In.) (fluorine- and silicon-based)

In Table 6 above, the abbreviations of the basic compounds indicate the following compounds:

N-1: 1,5-Diazabicyclo[4.3.0]-5-nonene

N-2: 2,4,5-Triphenylimidazole

N-3: N-Hydroxyethylpiperidine

N-4: 2,6-Diisopropylaniline

N-5: Dicyclohexylmethylamine

N-6: Hexamethylenetetramine

N-7: 1,8-Diazabicyclo[5.4.0]-7-undecene

In Table 6 above, the abbreviations of the solvents indicate the following compounds:

S-1: Ethyl lactate

S-2: Propylene glycol monomethyl ether acetate

S-3: Propylene glycol monomethyl ether

With respect to each resist composition, the transmittancy, defocus latitude (DOF) and photocrosslinking were evaluated in the following manner.

The results of evaluation are shown in Table 7 below.

(1) Measurement of Transmittancy

Each of the positive resist compositions described above was applied on an $MgF_2$ substrate by a spin coater and baked at 100° C. for 90 seconds using a hot plate to prepare a resist film having 200 nm on the $MgF_2$ substrate. The transmittancy of the resist film at 157 nm was measured by means of a vacuum ultraviolet photometer (VUV200S manufactured by JASCO Corp.).

(2) Evaluation of Defocus Latitude (DOF)

On a silicon substrate was uniformly coated a bottom anti-reflective coating film (BARC film) (ARC25 manufactured by Brewer Science, Inc.) having a thickness of 600 angstroms by a spin coater, followed by heating at 190° C. for 240 seconds to dry. On the bottom anti-reflective coating film was coated each of the positive resist compositions described above by a spin coater, followed by heating at 120° C. for 90 seconds to dry, thereby preparing a resist film having a thickness of 0.3 μm. The resist film was subjected to image formation using an KrF excimer stepper (FPA-3000EX5 manufacture by Canon Inc., NA=0.60), heated at 110° C. for 90 seconds after the exposure, and then developed with a 0.262 N aqueous tetramethylammonium hydroxide (TMAH) solution to prepare a L/S pattern of 0.20 μm.

The defocus latitude (DOF) of 0.20 μm in an exposure amount necessary for reproducing 0.20-μm line and space (=1/1) pattern was observed.

(3) Evaluation of Photocrosslinking

Each of the positive resist compositions described above was applied on a silicon wafer, which had been subjected to treatment with hexamethylenedisilazane in advance, using a spin coater and heated at 120° C. for 90 seconds on a hot plate to dry, thereby preparing a resist film having a thickness of 0.1 μm.

The resist film was exposed in an exposure amount ranging from 1 $mJ/cm^2$ to 100 $mJ/cm^2$ using a laser irradiation apparatus of 157 nm (VUVES-4500 manufactured by Litho Tech Japan Corp.), heated at 110° C. for 90 seconds using a hot plate after the exposure, and then subjected to development with a 0.262 N aqueous tetramethylammonium hydroxide (TMAH) solution.

The thickness of resist film after the development was measured and evaluated according to the following criteria:

TABLE 7

| Example | Transmittancy at 157 nm (%) | Defocus Latitude (μm) | Photocrosslinking |
|---|---|---|---|
| 101 | 48 | 0.7 | ○ |
| 102 | 43 | 0.7 | ○ |
| 103 | 45 | 0.7 | ○ |
| 104 | 42 | 0.8 | ○ |
| 105 | 48 | 0.7 | ○ |
| 106 | 49 | 0.7 | ○ |
| 107 | 46 | 0.8 | ○ |
| 108 | 45 | 0.6 | ○ |
| 109 | 44 | 0.7 | ○ |
| 110 | 42 | 0.8 | ○ |
| 111 | 47 | 0.7 | ○ |
| 112 | 48 | 0.9 | ○ |
| 113 | 49 | 0.8 | ○ |
| 114 | 46 | 0.8 | ○ |
| 115 | 45 | 0.7 | ○ |
| 116 | 44 | 0.7 | ○ |
| 117 | 42 | 0.7 | ○ |
| 118 | 47 | 0.8 | ○ |
| 119 | 43 | 0.7 | ○ |
| 120 | 45 | 0.8 | ○ |
| 121 | 42 | 0.8 | ○ |
| 122 | 48 | 0.7 | ○ |
| 123 | 49 | 0.7 | ○ |
| 124 | 46 | 0.8 | ○ |
| 125 | 45 | 0.7 | ○ |
| 126 | 44 | 0.7 | ○ |
| Comparative Example 101 | 34 | 0.4 | x |
| Comparative Example 102 | 35 | 0.5 | x |
| Comparative Example 103 | 18 | 0.6 | ○ |

○: The resist film was completely dissolved in the area irradiated with the large exposure amount of from 50 $mJ/cm^2$ to 100 $mJ/cm^2$.
x: The resist film remained in the area irradiated with the large exposure amount of from 50 $mJ/cm^2$ to 100 $mJ/cm^2$ to cause concerns about the photocrosslinking.

It can be seen from the results shown in Table 7 that the positive resist composition of the present invention has the high transmittancy and broad defocus latitude and is excellent in the evaluation of photocrosslinking because of the substantially complete dissolution of resist film.

Further, with respect to each resist composition described above, the line edge roughness (LER) and footing profile were evaluated in the following manner.

(4) Evaluation of Line Edge Roughness (LER)

On a silicon substrate was uniformly coated a bottom anti-reflective coating film (BARC film) (ARC25 manufactured by Brewer Science, Inc.) having a thickness of 600 angstroms by a spin coater, followed by heating at 190° C. for 240 seconds to dry. On the bottom anti-reflective coating film was coated each of the positive resist compositions described above by a spin coater, followed by heating at 120° C. for 90 seconds to dry, thereby preparing a resist film having a thickness of 0.12 μm.

The resist film was exposed through a contact mask using a laser irradiation apparatus of 157 nm (VUVES-4500 manufactured by Litho Tech Japan Corp.) in an exposure amount ranging from 1 to 100 $mJ/cm^2$, heated at 110° C. for 90 seconds using a hot plate after the exposure, and then subjected to development with a 0.262 N aqueous tetramethylammonium hydroxide (TMAH) solution to prepare a line and space (1/1) pattern of 0.35 μm.

The evaluation of line edge roughness was conducted by measuring the edge of 0.35-μm line and space (1/1) using a critical dimension scanning electron microscope (CD-SEM). Specifically, the pattern edge was detected in multiple positions in the measuring monitor and the dispersion ($3\sigma$) at the multiple positions of detection was used an index of the line edge roughness. As the value is smaller, the line edge roughness is better.

(5) Evaluation of Footing Profile

The line and space (1/1) pattern of 0.35 μm was observed by a scanning electron microscope (S-8840 manufactured by Hitachi, Ltd.) and a degree of the footing profile was evaluated according to the following equation:

$$(B-A)/2B \times 100(\%)$$

wherein A and B each represent length shown in FIG. 1. As the value is smaller, the degree of footing profile is smaller.

The results of evaluation are shown in Table 8.

TABLE 8

| Example | Line Edge Roughness | Footing Profile |
|---|---|---|
| 101 | 4.9 | 15 |
| 102 | 5.0 | 14 |
| 103 | 5.1 | 13 |
| 104 | 5.1 | 14 |
| 105 | 4.9 | 12 |
| 106 | 5.0 | 15 |
| 107 | 4.9 | 12 |
| 108 | 4.8 | 13 |
| 109 | 5.1 | 14 |
| 110 | 5.0 | 15 |
| 111 | 4.9 | 13 |
| 112 | 4.8 | 12 |
| 113 | 4.9 | 14 |
| 114 | 4.7 | 13 |
| 115 | 4.8 | 15 |
| 116 | 4.9 | 13 |
| 117 | 4.8 | 14 |
| 118 | 4.8 | 15 |
| 119 | 4.9 | 15 |
| 120 | 5.1 | 16 |
| 121 | 4.9 | 15 |
| 122 | 5.0 | 14 |
| 123 | 5.2 | 13 |
| 124 | 6.1 | 13 |
| 125 | 5.9 | 13 |
| 126 | 5.0 | 15 |
| Comparative Example 101 | 9.3 | 30 |
| Comparative Example 102 | 10.8 | 35 |
| Comparative Example 103 | —*1) | —*1) |

*1)The evaluation could not be conducted.

It can be seen from the results shown in Table 8 that the positive resist composition of the present invention reduces the degree of line edge roughness and exhibits the small degree of footing profile.

EXAMPLES 201 TO 243 AND COMPARATIVE EXAMPLES 201 TO 203

A sample solution was prepared by dissolving 1.2 g of the resin of component (A) as shown in Tables 1 to 5 above, 0.03 g of the photo-acid generator (Component (B) of the present invention or other acid generator), 100 ppm of the surface active agent of Component (C) and 0.0012 g of the basic compound of Component (D) in 19.6 g of the solvent, as shown in Tables 9 and 10 below. The solution was filtered through a Teflon filter having a pore size of 0.1 μm, whereby a positive resist composition for each of Examples 201 to 243 and Comparative Example 201 to 203 was prepared.

The reference number of photo-acid generator used in Tables 9 and 10 means the number assigned to each of the acid generators shown hereinbefore as the specific examples.

TABLE 9

| Example | Resin (A) | Photo-Acid Generator (weight ratio) | Surface Active Agent (C) | Basic Compound (D) (weight ratio) | Solvent (weight ratio) |
|---|---|---|---|---|---|
| 201 | (1) | (III-1) | W-1 | N-3 | S-2 |
| 202 | (2) | (III-2) | W-1 | N-1 | S-2 |
| 203 | (3) | (III-5) | W-1 | N-1/N-2 = 50/50 | S-2 |
| 204 | (4) | (III-6) | W-1 | N-4 | S-2 |
| 205 | (5) | (III-7) | W-1 | N-2 | S-2 |
| 206 | (6) | (III-8) | W-1 | N-6 | S-2 |
| 207 | (7) | (III-9) | W-2 | N-3 | S-2 |
| 208 | (8) | (III-10) | W-1 | N-7 | S-2 |
| 209 | (9) | (III-11) | W-1 | N-5 | S-2/S-3 = 80/20 |
| 210 | (10) | (III-12) | W-1 | N-4 | S-2 |
| 211 | (11) | (III-13) | W-2 | N-2/N-3 = 50/50 | S-2/S-3 = 90/10 |
| 212 | (12) | (III-14) | W-1 | N-5 | S-2 |
| 213 | (13) | (III-15) | W-1 | N-3 | S-2 |
| 214 | (14) | (III-16) | W-1 | N-1 | S-2 |
| 215 | (15) | (III-17) | W-1 | N-2 | S-2/S-3 = 70/30 |
| 216 | (17) | (III-18) | W-2 | N-6 | S-2 |
| 217 | (18) | (III-23) | W-2 | N-1 | S-2 |
| 218 | (19) | (III-25) | W-1 | N-7 | S-2 |
| 219 | (21) | (III-28) | W-1 | N-7 | S-2 |
| 220 | (22) | (III-31) | W-1 | N-1 | S-2 |
| 221 | (23) | (III-36) | W-1 | N-1 | S-2 |
| 222 | (24) | (III-42) | W-2 | N-2 | S-2 |
| 223 | (26) | (III-44) | W-1 | N-3 | S-1/S-2 = 5/95 |
| 224 | (28) | (III-46) | W-1 | N-3 | S-2/S-3 = 90/10 |
| 225 | (31) | (III-47) | W-1 | N-4 | S-1/S-2 = 5/95 |
| 226 | (32) | (III-1)/(III-48) = 50/50 | W-1 | N-5 | S-2 |
| 227 | (33) | (III-49) | W-1 | N-2 | S-2 |
| 228 | (34) | (III-1)/(III-50) = 50/50 | W-1 | N-3 | S-2 |
| 229 | (35) | (III-53) | W-2 | N-1 | S-2 |
| 230 | (36) | (III-1)/(III-54) = 50/50 | W-1 | N-6 | S-2/S-4 = 95/5 |

TABLE 10

| Example | Resin (A) | Photo-Acid Generator (weight ratio) | Surface Active Agent (C) | Basic Compound (D) (weight ratio) | Solvent (weight ratio) |
|---|---|---|---|---|---|
| 231 | (37) | (III-1)/(III-55) = 50/50 | W-1 | N-4 | S-1/S-2 = 10/90 |
| 232 | (38) | (III-59) | W-1 | N-7 | S-2 |
| 233 | (39) | (III-60) | W-1 | N-5 | S-2 |
| 234 | (40) | (III-61) | W-2 | N-6 | S-2/S-5 = 95/5 |
| 235 | (41) | (III-62) | W-1 | N-2 | S-2 |
| 236 | (24) | (III-1)/(III-63) = 50/50 | W-1 | N-4 | S-1/S-2 = 40/60 |
| 237 | (25) | (III-1)/(III-64) = 50/50 | W-1 | N-5 | S-2/S-3 = 50/50 |
| 238 | (26) | (III-1)/(PAG4-1) = 50/50 | W-4 | N-6 | S-2 |
| 239 | (27) | (III-1)/(PAG4-2) = 50/50 | W-1 | N-5 | S-2 |
| 240 | (28) | (III-1) / (III-5) = 50/50 | W-1 | N-7 | S-2/S-6 = 95/5 |
| 241 | (29) | (III-1)/(PAG7-1) = 50/50 | W-3 | N-2 | S-2/S-3 = 50/50 |
| 242 | (30) | (III-1)/(PAG5-2) = 50/50 | W-1 | N-3 | S-2/S-7 = 95/5 |
| 243 | (26) | (III-1)/(PAG5-2) = 50/50 | W-1 | N-4 | S-2 |
| Comparative Example 201 | (1) | (PAG4-1) | W-1 | N-2 | S-2 |
| Comparative Example 202 | (26) | (PAG4-1) | W-2 | N-3 | S-1/S-2 = 5/95 |

TABLE 10-continued

| Example | Resin (A) | Photo-Acid Generator (weight ratio) | Surface Active Agent (C) | Basic Compound (D) (weight ratio) | Solvent (weight ratio) |
|---|---|---|---|---|---|
| Comparative Example 203 | (*2) | (III-1) | W-1 | N-2 | S-2 |

(*2) [p-1-(ethoxy)ethoxy]styrene/p-hydroxystyrene = 35/65

In Tables 9 and 10 above, the abbreviations of the surface active agents indicate the following compounds:
W-1: Megafax F176 (manufactured by Dainippon Ink and Chemicals, Inc.) (fluorine-based)
W-2: Megafac R08 (manufactured by Dainippon Ink and Chemicals, Inc.) (fluorine- and silicon-based)
W-3: Polysiloxane Polymer KP-341 (manufactured by Shin-Etsu Chemical Co., Ltd.) (silicon-based)
W-4: Troysol S-366 (manufactured by Troy Chemical Co., Ltd.)

In Tables 9 and 10 above, the abbreviations of the basic compounds indicate the following compounds:
N-1: 1,5-Diazabicyclo[4.3.0]-5-nonene
N-2: 2,4,5-Triphenylimidazole
N-3: N-Hydroxyethylpiperidine
N-4: 2,6-Diisopropylaniline
N-5: Dicyclohexylmethylamine
N-6: Hexamethylenetetramine
N-7: 1,8-Diazabicyclo[5.4.0]-7-undecene In Tables 9 and 10 above, the abbreviations of the solvents indicate the following compounds:
S-1: Ethyl lactate
S-2: Propylene glycol monomethyl ether acetate
S-3: Propylene glycol monomethyl ether
S-4: 2-Heptanone
S-5: Ethyl ethoxypropionate
S-6: γ-butyrolactone
S-7: Butyl acetate With respect to each resist composition, the transmittancy, defocus latitude (DOF) and line edge roughness (LER) were evaluated in the following manner.

The results of evaluation are shown in Tables 11 and 12 below.

(1) Measurement of Transmittancy

Each of the positive resist compositions described above was applied on an $MgF_2$ substrate by a spin coater and baked at 100° C. for 90 seconds using a hot plate to prepare a resist film having 200 nm on the $MgF_2$ substrate. The transmittancy of the resist film at 157 nm was measured by means of a vacuum ultraviolet photometer (VUV200S manufactured by JASCO Corp.).

(2) Evaluation of Defocus Latitude (DOF)

On a silicon substrate was uniformly coated a bottom anti-reflective coating film (BARC film) (ARC25 manufactured by Brewer Science, Inc.) having a thickness of 600 angstroms by a spin coater, followed by heating at 190° C. for 240 seconds to dry. On the bottom anti-reflective coating film was coated each of the positive resist compositions described above by a spin coater, followed by heating at 120° C. for 90 seconds to dry, thereby preparing a resist film having a thickness of 0.3 μm. The resist film was subjected to image formation using an KrF excimer stepper (FPA-3000EX5 manufacture by Canon Inc., NA=0.60), heated at 110° C. for 90 seconds after the exposure, and then developed with a 0.262 N aqueous tetramethylammonium hydroxide (TMAH) solution to prepare a L/S pattern of 0.20 μm.

The defocus latitude (DOF) of 0.20 μm in an exposure amount sufficient for reproducing 0.20-μm line and space (=1/1) pattern was observed.

(3) Evaluation of Line Edge Roughness (LER)

The evaluation of line edge roughness was conducted by measuring the edge of 0.20-μm line and space (=1/1) using a critical dimension scanning electron microscope (CD-SEM). Specifically, the pattern edge was detected in multiple positions in the measuring monitor and the dispersion (3σ) at the multiple positions of detection was used an index of the line edge roughness. As the value is smaller, the line edge roughness is better.

TABLE 11

| Example | Transmittancy at 157 nm (%) | Defocus Latitude (μm) | Line Edge Roughness |
|---|---|---|---|
| 201 | 42 | 0.7 | 4.5 |
| 202 | 49 | 0.7 | 4.3 |
| 203 | 46 | 0.7 | 4.1 |
| 204 | 45 | 0.8 | 3.8 |
| 205 | 47 | 0.7 | 3.6 |
| 206 | 42 | 0.7 | 3.7 |
| 207 | 46 | 0.8 | 3.5 |
| 208 | 44 | 0.6 | 3.8 |
| 209 | 41 | 0.7 | 3.9 |
| 210 | 45 | 0.8 | 4.1 |
| 211 | 47 | 0.7 | 4.0 |
| 212 | 43 | 0.9 | 4.3 |
| 213 | 45 | 0.8 | 4.2 |
| 214 | 42 | 0.8 | 4.4 |
| 215 | 48 | 0.7 | 4.1 |
| 216 | 49 | 0.7 | 3.6 |
| 217 | 46 | 0.7 | 3.8 |
| 218 | 45 | 0.8 | 3.9 |
| 219 | 44 | 0.7 | 3.8 |
| 220 | 46 | 0.8 | 3.6 |

TABLE 12

| Example | Transmittancy at 157 nm (%) | Defocus Latitude (μm) | Line Edge Roughness |
|---|---|---|---|
| 221 | 47 | 0.8 | 3.7 |
| 222 | 45 | 0.7 | 3.4 |
| 223 | 46 | 0.7 | 3.7 |
| 224 | 42 | 0.8 | 3.5 |
| 225 | 48 | 0.7 | 3.6 |
| 226 | 49 | 0.7 | 3.5 |
| 227 | 46 | 0.7 | 3.4 |
| 228 | 45 | 0.8 | 3.4 |
| 229 | 45 | 0.8 | 3.6 |
| 230 | 47 | 0.7 | 3.5 |
| 231 | 48 | 0.7 | 3.8 |
| 232 | 46 | 0.8 | 3.7 |
| 233 | 45 | 0.7 | 3.6 |
| 234 | 43 | 0.8 | 3.8 |
| 235 | 47 | 0.8 | 3.7 |
| 236 | 46 | 0.7 | 3.6 |
| 237 | 46 | 0.9 | 4.3 |
| 238 | 45 | 0.7 | 4.2 |
| 239 | 47 | 0.8 | 4.1 |
| 240 | 46 | 0.7 | 4.1 |
| 241 | 45 | 0.8 | 4.1 |
| 242 | 46 | 0.7 | 3.9 |
| 243 | 48 | 0.7 | 3.8 |
| Comparative Example 201 | 34 | 0.4 | 6.8 |

TABLE 12-continued

| Example | Transmittancy at 157 nm (%) | Defocus Latitude (μm) | Line Edge Roughness |
|---|---|---|---|
| Comparative Example 202 | 35 | 0.5 | 5.6 |
| Comparative Example 203 | 18 | 0.6 | 10.5 |

It can be seen from the results shown in Tables 11 and 12 that the positive resist composition of the present invention has the high transmittancy and broad defocus latitude and reduces the degree of line edge roughness.

Further, with respect to each resist composition described above, the line edge roughness (LER), footing profile and photocrosslinking were evaluated in the following manner.

(4) Evaluation of Line Edge Roughness (LER)

On a silicon substrate was uniformly coated a bottom anti-reflective coating film (BARC film) (ARC25 manufactured by Brewer Science, Inc.) having a thickness of 600 angstroms by a spin coater, followed by heating at 190° C. for 240 seconds to dry. On the bottom anti-reflective coating film was coated each of the positive resist compositions described above by a spin coater, followed by heating at 120° C. for 90 seconds to dry, thereby preparing a resist film having a thickness of 0.12 μM.

The resist film was exposed through a contact mask using a laser irradiation apparatus of 157 nm (VUVES-4500 manufactured by Litho Tech Japan Corp.) in an exposure amount ranging from 1 to 100 mJ/cm², heated at 110° C. for 90 seconds using a hot plate after the exposure, and then subjected to development with a 0.262 N aqueous tetramethylammonium hydroxide (TMAH) solution to prepare a line and space (1/1) pattern of 0.35 μm.

The evaluation of line edge roughness was conducted by measuring the edge of 0.35-μm line and space (1/1) using a critical dimension scanning electron microscope (CD-SEM). Specifically, the pattern edge was detected in multiple positions in the measuring monitor and the dispersion (3σ) at the multiple positions of detection was used an index of the line edge roughness. As the value is smaller, the line edge roughness is better.

(5) Evaluation of Footing Profile

The line and space (1/1) pattern of 0.35 μm was observed by a scanning electron microscope (S-8840 manufactured by Hitachi, Ltd.) and a degree of the footing profile was evaluated according to the following equation:

(B−A)/2B×100(%)

wherein A and B each represent length shown in FIG. 1. As the value is smaller, the degree of footing profile is smaller.

(6) Evaluation of Photocrosslinking

Each of the positive resist compositions described above was applied on a silicon wafer, which had been subjected to treatment with hexamethylenedisilazane in advance, using a spin coater and heated at 120° C. for 90 seconds on a hot plate to dry, thereby preparing a resist film having a thickness of 0.1 μm.

The resist film was exposed in an exposure amount ranging from 1 mJ/cm² to 100 mJ/cm² using a laser irradiation apparatus of 157 nm (VUVES-4500 manufactured by Litho Tech Japan Corp.), heated at 110° C. for 90 seconds using a hot plate after the exposure, and then subjected to development with a 0.262 N aqueous tetramethylammonium hydroxide (TMAH) solution.

The thickness of resist film after the development was measured and evaluated according to the following criteria:

TABLE 13

| Example | Line Edge Roughness | Footing Profile | Photocrosslinking |
|---|---|---|---|
| 201 | 5.0 | 14 | ○ |
| 202 | 5.2 | 13 | ○ |
| 203 | 6.1 | 15 | ○ |
| 204 | 5.9 | 13 | ○ |
| 205 | 5.0 | 14 | ○ |
| 206 | 4.9 | 15 | ○ |
| 207 | 5.1 | 15 | ○ |
| 208 | 4.9 | 16 | ○ |
| 209 | 5.0 | 15 | ○ |
| 210 | 5.2 | 14 | ○ |
| 211 | 4.9 | 13 | ○ |
| 212 | 5.1 | 13 | ○ |
| 213 | 4.9 | 13 | ○ |
| 214 | 5.0 | 15 | ○ |
| 215 | 5.2 | 15 | ○ |
| 216 | 6.1 | 13 | ○ |
| 217 | 5.9 | 14 | ○ |
| 218 | 5.0 | 13 | ○ |
| 219 | 4.9 | 15 | ○ |
| 220 | 5.1 | 15 | ○ |
| 221 | 4.9 | 13 | ○ |
| 222 | 5.0 | 14 | ○ |
| 223 | 5.2 | 13 | ○ |
| 224 | 6.1 | 13 | ○ |
| 225 | 5.9 | 15 | ○ |
| 226 | 5.0 | 16 | ○ |
| 227 | 5.2 | 14 | ○ |
| 228 | 4.9 | 15 | ○ |
| 229 | 5.1 | 15 | ○ |
| 230 | 5.2 | 16 | ○ |
| 231 | 6.1 | 15 | ○ |
| 232 | 5.9 | 14 | ○ |
| 233 | 5.0 | 13 | ○ |
| 234 | 4.9 | 13 | ○ |
| 235 | 5.1 | 13 | ○ |
| 236 | 4.9 | 15 | ○ |
| 237 | 5.0 | 15 | ○ |
| 238 | 5.2 | 13 | ○ |
| 239 | 6.1 | 14 | ○ |
| 240 | 5.9 | 13 | ○ |
| 241 | 5.0 | 15 | ○ |
| 242 | 5.3 | 15 | ○ |
| 243 | 5.2 | 13 | ○ |
| Comparative Example 201 | 9.3 | 30 | x |
| Comparative Example 202 | 10.8 | 35 | x |
| Comparative Example 203 | —*1) | —*1) | ○ |

○: The resist film was completely dissolved in the area irradiated with the large exposure energy amount of from 50 mJ/cm² to 100 mJ/cm².
x: The resist film remained in the area irradiated with the large exposure amount of from 50 mJ/cm² to 100 mJ/cm² to cause concerns about the photocrosslinking.
The results of evaluation are shown in Table 13.
*1)The evaluation could not be conducted.

It can be seen from the results shown in Table 13 that the positive resist composition of the present invention reduces the degree of line edge roughness, exhibits the small degree of footing profile and is excellent in the evaluation of photocrosslinking because of the substantially complete dissolution of resist film.

According to the present invention, the positive resist composition, which exhibits the sufficient transmittancy in a short wavelength region of not more than 160 nm, particularly an F2 excimer laser beam (157 nm), has a broad defocus latitude, forms a resist film that is substantially completely dissolved upon development with a developer without concerns about the photocrosslinking, and is prevented from the occurrence of line edge roughness, can be provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive resist composition comprising (A) a fluorine group-containing resin, which has a structure substituted with a fluorine atom in the main chain and/or side chain of polymer skeleton and a group that is decomposed by the action of an acid to increase solubility in an alkali developer and (B) an acid generator capable of generating an acid upon irradiation of an actinic ray or radiation, and the acid generator of (B) comprises a sulfonium salt represented by the following formula (II):

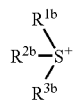

(II)

wherein $R^{1b}$ to $R^{3b}$ each independently represents an alkyl group or a 2-oxoalkyl group; and wherein the fluorine group-containing resin of (A) comprises at least one of repeating units represented by the following formulae (IV) to (VII) and at least one of repeating units represented by the following formulae (XV) to (XVII):

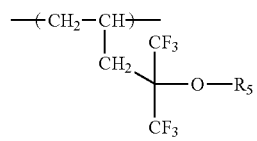

(IV)

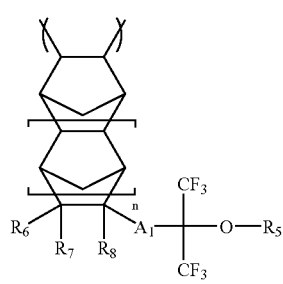

(V)

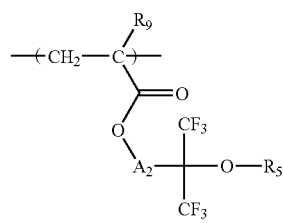

(VI)

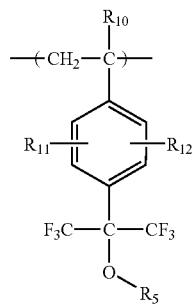

(VII)

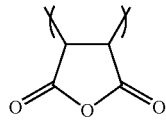

(XV)

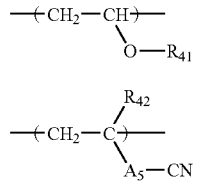

(XVI)

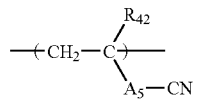

(XVII)

wherein $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represents a hydrogen atom, a halogen atom, an alkyl group which may have a substituent, a perfluoroalkyl group which may have a substituent or an alkoxy group which may have a substituent; $R_9$ and $R_{10}$, which may be the same or different, each represents a hydrogen atom, a halogen atom, a cyano group, an alkyl group which may have a substituent or a haloalkyl group which may have a substituent; $R_{11}$ and $R_{12}$, which may be the same or different, each represents a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent; $A_1$ and $A_2$ each represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; n represents 0 or 1; $R_{41}$ represents an alkyl group which may have a substituent, a cycloalkyl group which may have a substituent, an aralkyl group which may have a substituent or an aryl group which may have a substituent; $R_{42}$ represents a hydrogen atom, a halogen atom, a cyano group, an alkyl group which may have a substituent or a haloalkyl group which may have a substituent; and $A_5$ represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—.

2. The positive resist composition as claimed in claim 1, wherein the fluorine group-containing resin of (A) is a resin containing at least one moiety selected from a perfluoroalkylene group and a perfluoroarylene group in the main chain of polymer skeleton or a resin containing at least one moiety selected from a perfluoroalkyl group, a perfluoroayl group, a hexafluoro-2-propanol group and a group obtained by protecting the hydroxy group of hexafluoro-2-propanol group in the side chain of polymer skeleton.

3. The positive resist composition as claimed in claim 1, wherein the fluorine group-containing resin of (A) further comprises at least one of repeating units represented by the following formulae (I) to (III) and (VIII) to (X):

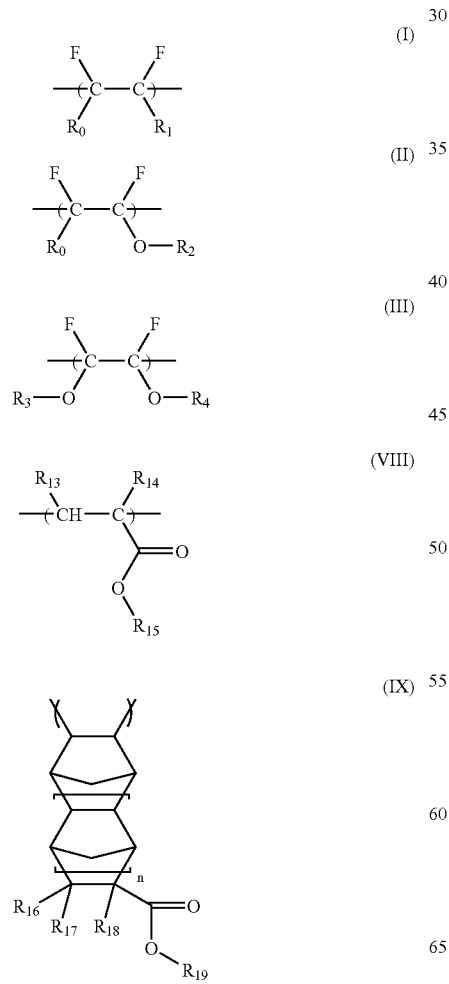

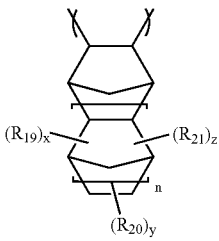

wherein $R_0$ and $R_1$ each represents a hydrogen atom, a fluorine atom, an alkyl group which may have a substituent, a perfluoroalkyl group which may have a substituent, a cycloalkyl group which may have a substituent or an aryl group which may have a substituent; $R_2$ to $R_4$ each represents an alkyl group which may have a substituent, a perfluoroalkyl group which may have a substituent, a cycloalkyl group which may have a substituent or an aryl group which may have a substituent; or $R_0$ and $R_1$, $R_0$ and $R_2$ or $R_3$ and $R_4$ may be combined with each other to form a ring; $R_{13}$ and $R_{14}$, which may be the same or different, each represents a hydrogen atom, a halogen atom, a cyano group, an alkyl group which may have a substituent or a haloalkyl group which may have a substituent; $R_{15}$ represents an alkyl group having a fluorine atom, a monocyclic or polycyclic cycloalkyl group having a fluorine atom, an alkenyl group having a fluorine atom, an aralkyl group having a fluorine atom or an aryl group having a fluorine atom; $R_{16}$, $R_{17}$ and $R_{18}$, which may be the same or different, each represents a hydrogen atom, a halogen atom, a cyano group, an alkyl group which may have a substituent, a perfluoroalkyl group which may have a substituent, an alkoxy group which may have a substituent or —CO—O—$R_{15}$; $R_{19}$, $R_{20}$ and $R_{21}$, which may be the same or different, each represents a hydrogen atom, a fluorine atom, an alkyl group having a fluorine atom, a monocyclic or polycyclic cycloalkyl group having a fluorine atom, an alkenyl group having a fluorine atom, an aralkyl group having a fluorine atom, an aryl group having a fluorine atom or an alkoxy group having a fluorine atom, provided that at least one of $R_{19}$, $R_{20}$ and $R_{21}$ is a substituent other than a hydrogen atom; n represents 0 or 1; and x, y and z each represents an integer of from 0 to 4.

4. The positive resist composition as claimed in claim 1, wherein the fluorine group-containing resin of (A) further comprises at least one of repeating units represented by the following formulae (XI) to (XIII):

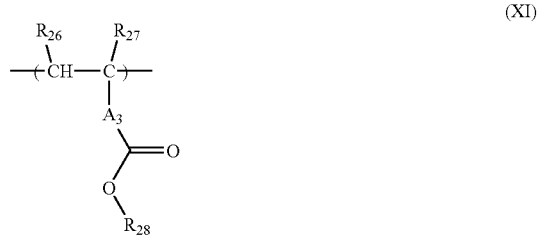

-continued

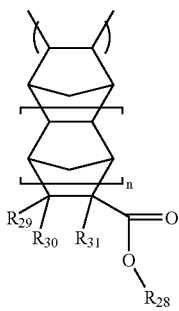
(XII)

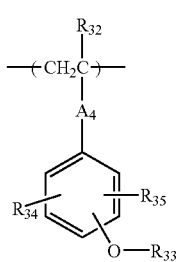
(XIII)

wherein $R_{26}$, $R_{27}$ and $R_{32}$, which may be the same or different, each represents a hydrogen atom, a halogen atom, a cyano group, an alkyl group which may have a substituent or a haloalkoxy group which may have a substituent; $R_{28}$ and $R_{33}$ each represents —C($R_{36}$)($R_{37}$)($R_{38}$), —C($R_{36}$)($R_{37}$)(O$R_{39}$) or a group represented by the following formula (XIV):

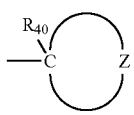
(XIV)

wherein $R_{29}$, $R_{30}$ and $R_{31}$, which may be the same or different, each represents a hydrogen atom, a halogen atom, a cyano group, an alkyl group which may have a substituent, a perfluoroalkyl group which may have a substituent, an alkoxy group which may have a substituent or —CO—O—$R_{28}$; $R_{34}$ and $R_{35}$, which may be the same or different, each represents a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent; $R_{36}$, $R_{37}$, $R_{38}$ and $R_{39}$, which may be the same or different, each represents an alkyl group which may have a substituent, a cycloalkyl group which may have a substituent, an alkenyl group which may have a substituent, an alkynyl group which may have a substituent, an aralkyl group which may have a substituent or an aryl group which may have a substituent; or two of $R_{36}$, $R_{37}$ and $R_{38}$ or two of $R_{36}$, $R_{37}$ and $R_{39}$ may be combined with each other to form a ring; $R_{40}$ represents an alkyl group which may have a substituent, a cycloalkyl group which may have a substituent, an alkenyl group which may have a substituent, an alkynyl group which may have a substituent, an aralkyl group which may have a substituent or an aryl group which may have a substituent; $A_3$ and $A_4$ each represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; Z represents an atomic group necessary for forming a monocyclic or polycyclic alicyclic group together with the carbon atom; and n represents 0 or 1.

5. The positive resist composition as claimed in claim 1, wherein the fluorine group-containing resin of (A) further comprises at least one of repeating units represented by the following formulae (I) to (III) and comprises at least one of repeating units represented by the following formulae (IV) to (VI):

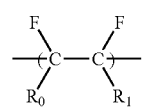
(I)

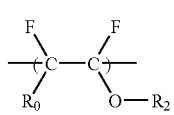
(II)

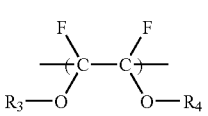
(III)

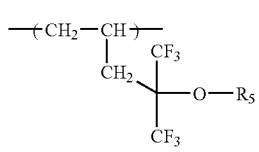
(IV)

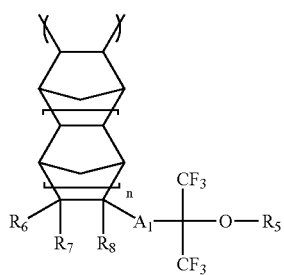
(V)

-continued

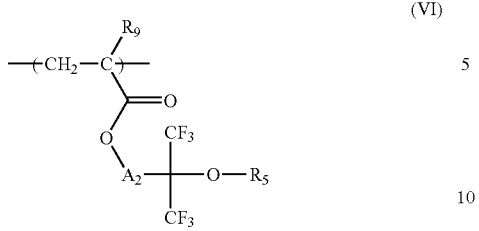
(VI)

wherein $R_0$ and $R_1$ each represents a hydrogen atom, a fluorine atom, an alkyl group which may have a substituent, a perfluoroalkyl group which may have a substituent, a cycloalkyl group which may have a substituent or an aryl group which may have a substituent; $R_2$ to $R_4$ each represents an alkyl group which may have a substituent, a perfluoroalkyl group which may have a substituent, a cycloalkyl group which may have a substituent or an aryl group which may have a substituent; or $R_0$ and $R_1$, $R_0$ and $R_2$ or $R_3$ and $R_4$ may be combined with each other to form a ring; $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represents a hydrogen atom, a halogen atom, an alkyl group which may have a substituent, a perfluoroalkyl group which may have a substituent or an alkoxy group which may have a substituent; $R_9$ represents a hydrogen atom, a halogen atom, a cyano group, an alkyl group which may have a substituent or a haloalkyl group which may have a substituent; $A_1$ and $A_2$ each represents a single bond, a divalent group selected from an alkylene group, an alkenylene group, a cycloalkylene group and an arylene group, each of which may have a substituent, —O—CO—$R_{22}$—, —CO—O—$R_{23}$— or CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; and n represents 0 or 1.

6. The positive resist composition as claimed in claim 1, wherein the fluorine group-containing resin of (A) comprises at least one of repeating units represented by the following formulae (IV) to (VI) and further comprises at least one of repeating units represented by the following formulae (VIII) to (X):

(IV)

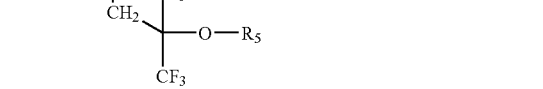
(V)

(VI)

(VIII)

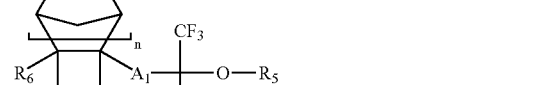
(IX)

(X)

wherein $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent;

$R_6$, $R_7$ and $R_8$, which may be the same or different, each represents a hydrogen atom, a halogen atom, an alkyl group which may have a substituent, a perfluoroalkyl group which may have a substituent or an alkoxy group which may have a substituent; $R_9$ represents a hydrogen atom, a halogen atom, a cyano group, an alkyl group which may have a substituent or a haloalkyl group which may have a substituent; $R_{13}$ and $R_{14}$, which may be the same or different, each represents a hydrogen atom, a halogen atom, a cyano group, an alkyl group which may have a substituent or a haloalkyl group which may have a substituent; $R_{15}$ represents an alkyl group having a fluorine atom, a monocyclic or polycyclic cycloalkyl group having a fluorine atom, an alkenyl group having a fluorine atom, an aralkyl group having a fluorine atom or an aryl group having a fluorine atom; $R_{16}$, $R_{17}$ and $R_{18}$, which may be the same or different, each represents a hydrogen atom, a halogen atom, a cyano group, an alkyl group which may have a substituent, a perfluoroalkyl group which may have a substituent, an alkoxy group which may have a substituent or —CO—O—$R_{15}$; $R_{19}$, $R_{20}$ and $R_{21}$, which may be the same or different, each represents a hydrogen atom, a fluorine atom, an alkyl group having a fluorine atom, a monocyclic or polycyclic cycloalkyl group having a fluorine atom, an alkenyl group having a fluorine atom, an aralkyl group having a fluorine atom, an aryl group having a fluorine atom or an alkoxy group having a fluorine atom, provided that at least one of $R_{19}$, $R_{20}$ and $R_{21}$ is a substituent other than a hydrogen atom; $A_1$ and $A_2$ each represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; n represents 0 or 1; and x, y and z each represents an integer of from 0 to 4.

7. The positive resist composition as claimed in claim 1, wherein the fluorine group-containing resin of (A) is a resin having at least one repeating unit represented by the following formula (IA) and at least one repeating unit represented by the following formula (IIA):

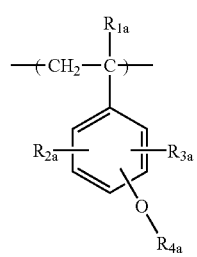
(IA)

-continued

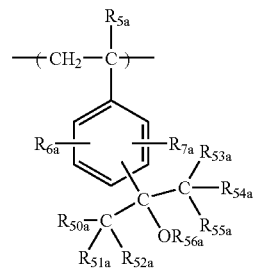
(IIA)

wherein $R_{1a}$ and $R_{5a}$, which may be the same or different, each represents a hydrogen atom, a halogen atom, a cyano group or an alkyl group which may have a substituent; $R_{2a}$, $R_{3a}$, $R_{6a}$ and $R_{7a}$, which may be the same or different, each represents a hydrogen atom, a halogen atom, a cyano group, a hydroxy group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{50a}$ to $R_{55a}$, which may be the same or different, each represents a hydrogen atom, a fluorine atom or an alkyl group which may have a substituent, provided that at least one of $R_{50a}$ to $R_{55a}$ represents a fluorine atom or an alkyl group in which at least one of the hydrogen atoms is substituted with a fluorine atom; $R_{56a}$ represents a hydrogen atom, an alkyl group which may have a substituent, a cycloalkyl group which may have a substituent, an acyl group which may have a substituent or an alkoxycarbonyl group which may have a substituent; $R_{4a}$ represents a group represented by the following formula (IVA) or (VA):

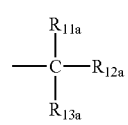
(IVA)

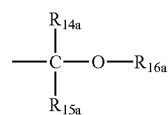
(VA)

wherein $R_{11a}$, $R_{12a}$ and $R_{13a}$, which may be the same or different, each represents an alkyl group which may have a substituent, a cycloalkyl group which may have a substituent, an alkenyl group which may have a substituent, an aralkyl group which may have a substituent or an aryl group which may have a substituent; $R_{14a}$ and $R_{15a}$, which may be the same or different, each represents a hydrogen atom or an alkyl group which may have a substituent; $R_{16a}$ represents an alkyl group which may have a substituent, a cycloalkyl group which may have a substituent, an aralkyl group which may have a substituent or an aryl group which may have a substituent; or two of $R_{14a}$ to $R_{16a}$ may be combined with each other to form a ring.

8. The positive resist composition as claimed in claim 1, wherein the fluorine group-containing resin of (A) is a resin having at least one repeating unit represented by the following formula (IIA) and at least one repeating unit represented by the following formula (VIA):

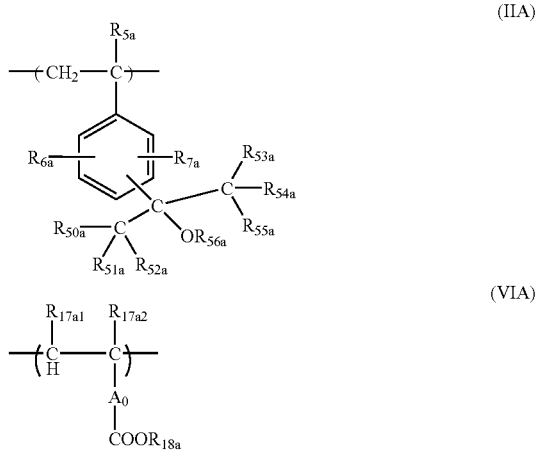

wherein $R_{5a}$ represents a hydrogen atom, a halogen atom, a cyano group or an alkyl group which may have a substituent; $R_{6a}$ and $R_{7a}$, which may be the same or different, each represents a hydrogen atom, a halogen atom, a cyano group, a hydroxy group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{50a}$ to $R_{55a}$, which may be the same or different, each represents a hydrogen atom, a fluorine atom or an alkyl group which may have a substituent, provided that at least one of $R_{50a}$ to $R_{55a}$ represents a fluorine atom or an alkyl group in which at least one of the hydrogen atoms is substituted with a fluorine atom; $R_{56a}$ represents a hydrogen atom, an alkyl group which may have a substituent, a cycloalkyl group which may have a substituent, an acyl group which may have a substituent or an alkoxycarbonyl group which may have a substituent; $R_{17a1}$ and $R_{17a2}$, which may be the same or different, each represents a hydrogen atom, a halogen atom, a cyano group or an alkyl group which may have a substituent; $R_{18a}$ represents —$C(R_{18a1})(R_{18a2})(R_{18a3})$ or —$C(R_{18a1})(R_{18a2})(OR_{18a4})$: $R_{18a1}$ to $R_{18a4}$, which may be the same or different, each represents a hydrogen atom, an alkyl group which may have a substituent, a cycloalkyl group which may have a substituent, an alkenyl group which may have a substituent, an aralkyl group which may have a substituent or an aryl group which may have a substituent; or two of $R_{18a1}$, $R_{18a2}$ and $R_{18a3}$ or two of $R_{18a1}$, $R_{18a2}$ and $R_{18a4}$ may be combined with each other to form a ring; and $A_0$ represents a single bond or a divalent connecting group which may have a substituent.

9. The positive resist composition as claimed in claim 8, wherein $R_{18a}$ in formula (VIA) is a group represented by the following formula (VIA-A):

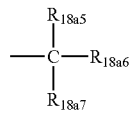

wherein $R_{18a5}$ and $R_{18a6}$, which may be the same or different, each represents an alkyl group which may have a substituent; and $R_{18a7}$ represents a cycloalkyl group which may have a substituent.

10. The positive resist composition as claimed in claim 8, wherein $R_{18a}$ in formula (VIA) is a group represented by the following formula (VIA-B):

wherein $R_{18a8}$ represents an alkyl group which may have a substituent, an alkenyl group which may have a substituent, an alkynyl group which may have a substituent, an aralkyl group which may have a substituent or an aryl group which may have a substituent.

11. The positive resist composition as claimed in claim 7, wherein at least one of $R_{1a}$ in formula (IA), $R_{5a}$ in formula (IIA) and $R_{17a2}$ in formula (VIA) is a trifluoromethyl group.

12. The positive resist composition as claimed in claim 7, wherein the fluorine group-containing resin of (A) further comprises at least one of repeating units represented by the following formulae (IIIA) and (VIIA):

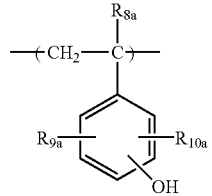

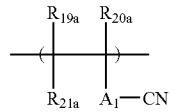

wherein $R_{8a}$ represents a hydrogen atom, a halogen atom, a cyano group or an alkyl group which may have a substituent; $R_{9a}$ and $R_{10a}$, which may be the same or different, each represents a hydrogen atom, a halogen atom, a cyano group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{19a}$ and $R_{20a}$, which may be the same or different, each represents a hydrogen atom, a halogen atom, a cyano group or an alkyl group which may have a substituent; $R_{21a}$ represents a hydrogen atom, a halogen atom, an alkyl group which may have a substituent or a group of —$A_1$—CN wherein $A_1$ represents a single bond or a divalent connecting group.

13. The positive resist composition as claimed in claim 1, which further comprises (C) a silicon-based and/or fluorine-based surface active agent.

14. The positive resist composition as claimed in claim 1, which further comprises a compound having a basic nitrogen atom as (D) an acid diffusion inhibiting agent.

15. The positive resist composition as claimed in claim 1, wherein the acid generator of (B) comprises a sulfonium salt represented by the formula (II), which generates a perfluoroalkylsulfonic acid having at least 2 carbon atoms, a perfluoroarylsulfonic acid or an arylsulfonic acid substituted with a perfluoroalkyl group upon irradiation with an actinic ray or radiation.

16. A method for forming a pattern comprising the steps of imagewise exposing a resist film formed from the positive resist composition as claimed in claim 1 to a vacuum ultraviolet ray of not more than 160 nm as a light source for exposure, and developing the exposed resist film.

17. A positive resist composition comprising (A) a fluorine group-containing resin, which has a structure substituted with a fluorine atom in the main chain and/or side chain of polymer skeleton and a group that is decomposed by the action of an acid to increase solubility in an alkali developer and (B) an acid generator capable of generating an acid upon irradiation of an actinic ray or radiation, and the acid generator of (B) comprises a compound having a phenacylsulfonium salt structure.

18. The positive resist composition as claimed in claim 17, wherein the fluorine group-containing resin of (A) is a resin containing at least one moiety selected from a perfluoroalkylene group and a perfluoroarylene group in the main chain of polymer skeleton or a resin containing at least one moiety selected from a perfluoroalkyl group, a perfluoroayl group, a hexafluoro-2-propanol group and a group obtained by protecting the hydroxy group of hexafluoro-2-propanol group in the side chain of polymer skeleton.

19. The positive resist composition as claimed in claim 17, wherein the fluorine group-containing resin of (A) comprises at least one of repeating units represented by the following formulae (I) to (X):

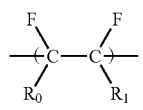

(I)

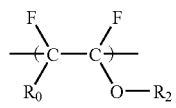

(II)

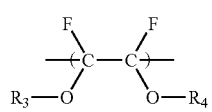

(III)

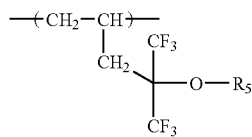

(IV)

-continued

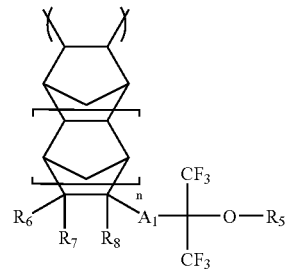

(V)

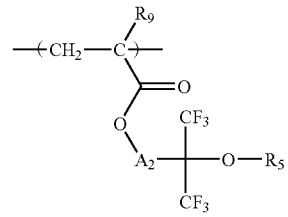

(VI)

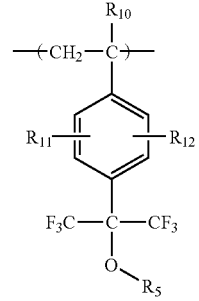

(VII)

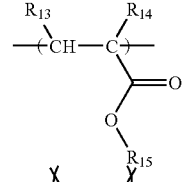

(VIII)

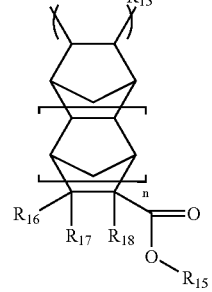

(IX)

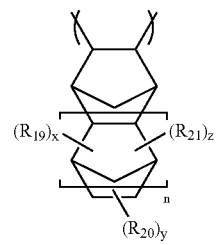

(X)

wherein $R_0$ and $R_1$ each represents a hydrogen atom, a fluorine atom, an alkyl group which may have a substituent, a perfluoroalkyl group which may have a substituent, a cycloalkyl group which may have a substituent or an aryl group which may have a substituent; $R_2$ to $R_4$ each represents an alkyl group which may have a substituent, a perfluoroalkyl group which may have a substituent, a cycloalkyl group which may have a substituent or an aryl group which may have a substituent; or $R_0$ and $R_1$, $R_0$ and $R_2$ or $R_3$ and $R_4$ may be combined with each other to form a ring; $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represents a hydrogen atom, a halogen atom, an alkyl group which may have a substituent, a perfluoroalkyl group which may have a substituent or an alkoxy group which may have a substituent; $R_9$ and $R_{10}$, which may be the same or different, each represents a hydrogen atom, a halogen atom, a cyano group, an alkyl group which may have a substituent or a haloalkyl group which may have a substituent; $R_{11}$ and $R_{12}$, which may be the same or different, each represents a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent; $R_{13}$ and $R_{14}$, which may be the same or different, each represents a hydrogen atom, a halogen atom, a cyano group, an alkyl group which may have a substituent or a haloalkyl group which may have a substituent; $R_{15}$ represents an alkyl group having a fluorine atom, a monocyclic or polycyclic cycloalkyl group having a fluorine atom, an alkenyl group having a fluorine atom, an aralkyl group having a fluorine atom or an aryl group having a fluorine atom; $R_{16}$, $R_{17}$ and $R_{18}$, which may be the same or different, each represents a hydrogen atom, a halogen atom, a cyano group, an alkyl group which may have a substituent, a perfluoroalkyl group which may have a substituent, an alkoxy group which may have a substituent or —CO—O—$R_{15}$; $R_{19}$, $R_{20}$ and $R_{21}$, which may be the same or different, each represents a hydrogen atom, a fluorine atom, an alkyl group having a fluorine atom, a monocyclic or polycyclic cycloalkyl group having a fluorine atom, an alkenyl group having a fluorine atom, an aralkyl group having a fluorine atom, an aryl group having a fluorine atom or an alkoxy group having a fluorine atom, provided that at least one of $R_{19}$, $R_{20}$ and $R_{21}$ is a substituent other than a hydrogen atom; $A_1$ and $A_2$ each represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; n represents 0 or 1; and x, y and z each represents an integer of from 0 to 4.

20. The positive resist composition as claimed in claim 17, wherein the fluorine group-containing resin of (A) further comprises at least one of repeating units represented by the following formulae (XI) to (XIII):

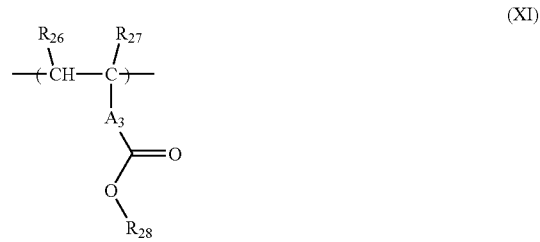

(XI)

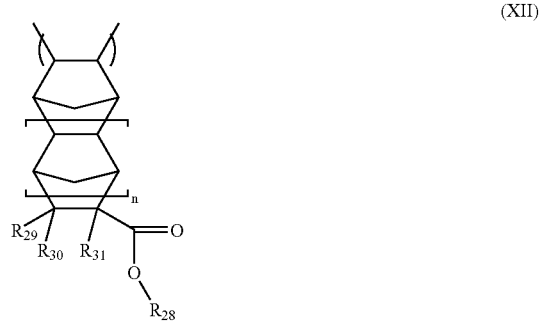

(XII)

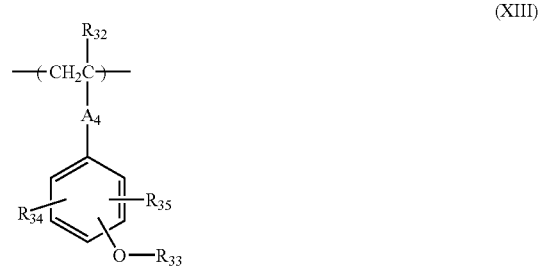

(XIII)

wherein $R_{26}$, $R_{27}$ and $R_{32}$, which may be the same or different, each represents a hydrogen atom, a halogen atom, a cyano group, an alkyl group which may have a substituent or a haloalkoxy group which may have a substituent; $R_{28}$ and $R_{33}$ each represents —C($R_{36}$)($R_{37}$)($R_{38}$), —C($R_{36}$)($R_{37}$)(OR$_{39}$) or a group represented by the following formula (XIV):

(XIV)

wherein $R_{29}$, $R_{30}$ and $R_{31}$, which may be the same or different, each represents a hydrogen atom, a halogen atom, a cyano group, an alkyl group which may have a substituent, a perfluoroalkyl group which may have a substituent, an alkoxy group which may have a substituent or —CO—O—$R_{28}$; $R_{34}$ and $R_{35}$, which may be the same or different, each represents a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent; $R_{36}$, $R_{37}$, $R_{38}$ and $R_{39}$, which may be the same or different, each represents an alkyl group which may have a substituent, a cycloalkyl group which may have a substituent, an alkenyl group which may have a substituent, an alkynyl group which may have a substituent, an aralkyl group which may have a substituent or an aryl group which may have a substituent; or two of $R_{36}$, $R_{37}$ and $R_{38}$ or two of $R_{36}$, $R_{37}$ and $R_{39}$ may be combined with each other to form a ring; $R_{40}$ represents an alkyl group which may have a substituent, a cycloalkyl group which may have a substituent, an alkenyl group which may have a substituent, an alkynyl group which may have a substituent, an aralkyl group which may have a substituent or an aryl group which may have a substituent; $A_3$ and $A_4$ each represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; Z represents an atomic group necessary for forming a monocyclic or polycyclic alicyclic group together with the carbon atom; and n represents 0 or 1.

21. The positive resist composition as claimed in claim 17, wherein the fluorine group-containing resin of (A) further comprises at least one of repeating units represented by the following formulae (XV) to (XVII):

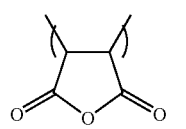

(XV)

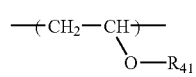

(XVI)

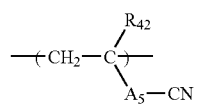

(XVII)

wherein $R_{41}$ represents an alkyl group which may have a substituent, a cycloalkyl group which may have a substituent, an aralkyl group which may have a substituent or an aryl group which may have a substituent; $R_{42}$ represents a hydrogen atom, a halogen atom, a cyano group, an alkyl group which may have a substituent or a haloalkyl group which may have a substituent; $A_5$ represents a single bond, a divalent group selected from an alkylene group, an alkenylene group, a cycloalkylene group and an arylene group, each of which may have a substituent, —O—CO—$R_{22}$—, —CO—O—$R_{23}$— or CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; and $R_{24}$ represents a hydrogen atom, an alkyl group which may have a substituent, a cycloalkyl group which may have a substituent, an aralkyl group which may have a substituent or an aryl group which may have a substituent.

22. The positive resist composition as claimed in claim 17, wherein the fluorine group-containing resin of (A) comprises at least one of repeating units represented by the following formulae (I) to (III) and at least one of repeating units represented by the following formulae (IV) to (VI):

(I)

(II)

(III)

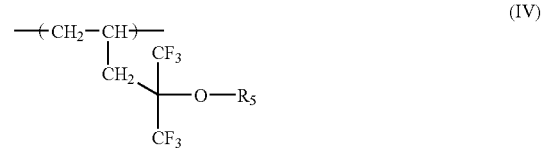

(IV)

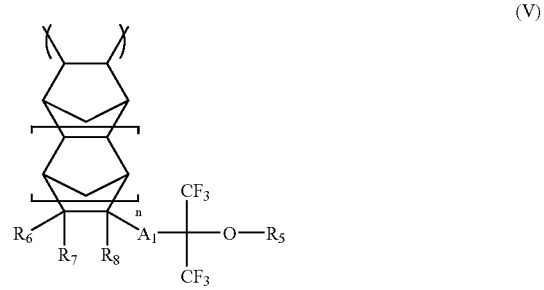

(V)

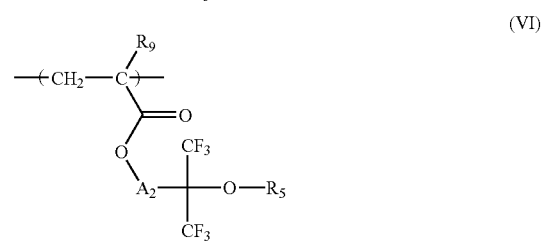

(VI)

wherein $R_0$ and $R_1$ each represents a hydrogen atom, a fluorine atom, an alkyl group which may have a substituent, a perfluoroalkyl group which may have a substituent, a cycloalkyl group which may have a substituent or an aryl group which may have a substituent; $R_2$ to $R_4$ each represents an alkyl group which may have a substituent, a perfluoroalkyl group which may have a substituent, a cycloalkyl group which may have a substituent or an aryl group which may have a substituent; or $R_0$ and $R_1$, $R_0$ and $R_2$ or $R_3$ and $R_4$ may be combined with each other to form a ring; $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represents a hydrogen atom, a halogen atom, an alkyl group which may have a substituent, a perfluoroalkyl group which may have a substituent or an alkoxy group which may have a substituent; $R_9$ represents a hydrogen atom, a halogen atom, a cyano group, an alkyl group which may have a substituent or a haloalkyl group which may have a substituent; $A_1$ and $A_2$ each represents a single bond, a divalent group selected from an alkylene group, an alkenylene group, a cycloalkylene group and an arylene group, each of which may have a substituent, —O—CO—$R_{22}$—, —CO—O—$R_{23}$— or CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; and n represents 0 or 1.

23. The positive resist composition as claimed in claim 17, wherein the fluorine group-containing resin of (A) comprises at least one of repeating units represented by the following formulae (IV) to (VI) and at least one of repeating units represented by the following formulae (VIII) to (X):

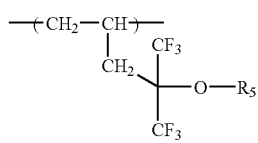
(IV)

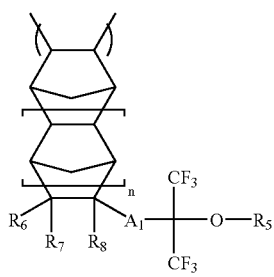
(V)

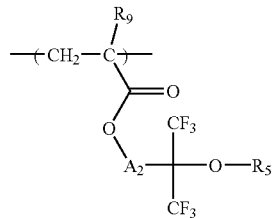
(VI)

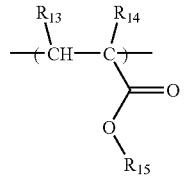
(VIII)

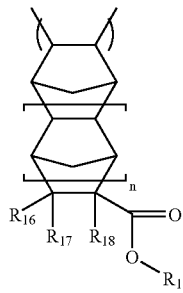
(IX)

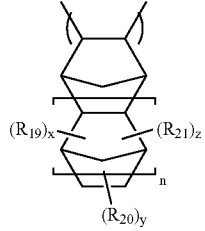
(X)

wherein $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represents a hydrogen atom, a halogen atom, an alkyl group which may have a substituent, a perfluoroalkyl group which may have a substituent or an alkoxy group which may have a substituent; $R_9$ represents a hydrogen atom, a halogen atom, a cyano group, an alkyl group which may have a substituent or a haloalkyl group which may have a substituent; $R_{13}$ and $R_{14}$, which may be the same or different, each represents a hydrogen atom, a halogen atom, a cyano group, an alkyl group which may have a substituent or a haloalkyl group which may have a substituent; $R_{15}$ represents an alkyl group having a fluorine atom, a monocyclic or polycyclic cycloalkyl group having a fluorine atom, an alkenyl group having a fluorine atom, an aralkyl group having a fluorine atom or an aryl group having a fluorine atom; $R_{16}$, $R_{17}$ and $R_{18}$, which may be the same or different, each represents a hydrogen atom, a halogen atom, a cyano group, an alkyl group which may have a substituent, a perfluoroalkyl group which may have a substituent, an alkoxy group which may have a substituent or —CO—O—$R_{15}$; $R_{19}$, $R_{20}$ and $R_{21}$, which may be the same or different, each represents a hydrogen atom, a fluorine atom, an alkyl group having a fluorine atom, a monocyclic or polycyclic cycloalkyl group having a fluorine atom, an alkenyl group having a fluorine atom, an aralkyl group having a fluorine atom, an aryl group having a fluorine atom or an alkoxy group having a fluorine atom, provided that at least one of $R_{19}$, $R_{20}$ and $R_{21}$ is a substituent other than a hydrogen atom; $A_1$ and $A_2$ each represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; n represents 0 or 1; and x, y and z each represents an integer of from 0 to 4.

24. The positive resist composition as claimed in claim 17, wherein the fluorine group-containing resin of (A) comprises at least one of repeating units represented by the following formulae (IV) to (VII) and at least one of repeating units represented by the following formulae (XV) to (XVII):

(IV)

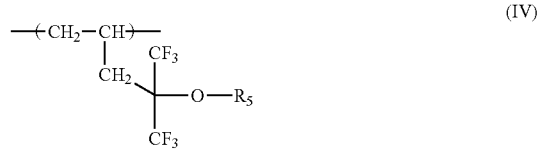

(V)

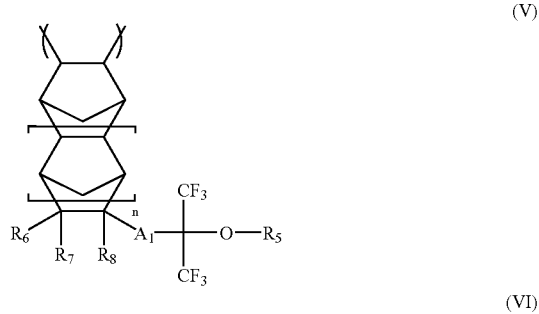

(VI)

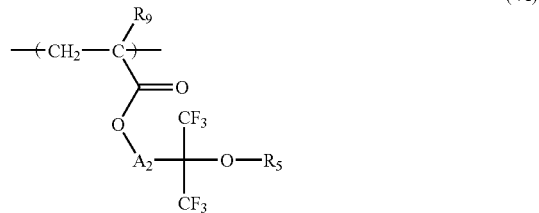

-continued (VII)

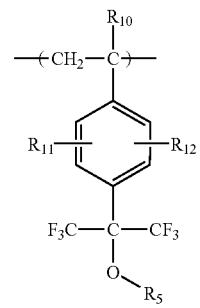

(XV)

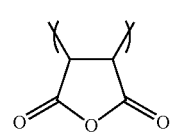

(XVI)

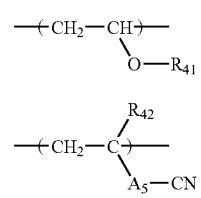

(XVII)

—(CH$_2$—C)—
        |
        R$_{42}$
        |
        A$_5$—CN wherein $R_5$ represents a hydrogen atom, an alkyl group which may have a substituent, a perfluoroalkyl group which may have a substituent, a monocyclic or polycyclic cycloalkyl group which may have a substituent, an acyl group which may have a substituent or an alkoxycarbonyl group which may have a substituent; $R_6$, $R_7$ and $R_8$, which may be the same or different, each represents a hydrogen atom, a halogen atom, an alkyl group which may have a substituent, a perfluoroalkyl group which may have a substituent or an alkoxy group which may have a substituent; $R_9$ and $R_{10}$, which may be the same or different, each represents a hydrogen atom, a halogen atom, a cyano group, an alkyl group which may have a substituent or a haloalkyl group which may have a substituent; $R_{11}$ and $R_{12}$, which may be the same or different, each represents a hydrogen atom, a hydroxy group, a halogen atom, a cyano group, an alkoxy group, an acyl group, an alkyl group which may have a substituent, a cycloalkyl group which may have a substituent, an alkenyl group which may have a substituent, an aralkyl group which may have a substituent or an aryl group which may have a substituent; $A_1$ and $A_2$ each represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—; $R_{22}$, $R_{23}$ and $R_{25}$, which may be the same or different, each represents a single bond or a divalent group selected from an alkylene group, an alkenylene group, a cycloalkylene group and an arylene group, each of which may have an ether group, an ester group, an amido group, a urethane group or a ureido group; $R_{24}$ represents a hydrogen atom, an alkyl group which may have a substituent, a cycloalkyl group which may have a substituent, an aralkyl group which may have a substituent or an aryl group which may have a substituent; n represents 0 or 1; $R_{41}$ represents an alkyl group which may have a substituent, a cycloalkyl group which may have a substituent, an aralkyl group which may have a substituent or an aryl group which may have a substituent; $R_{42}$ represents a hydrogen atom, a halogen atom, a cyano group, an alkyl group which may have a substituent or a haloalkyl group which may have a substituent; and $A_5$ represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—.

25. The positive resist composition as claimed in claim 17, wherein the fluorine group-containing resin of (A) is a resin having at least one repeating unit represented by the following formula (IA) and at least one repeating unit represented by the following formula (IIA):

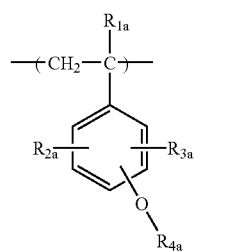

(IA)

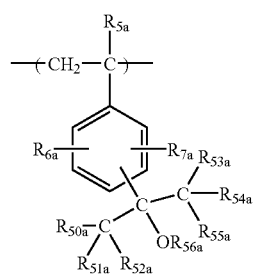

(IIA)

wherein $R_{1a}$ and $R_{5a}$, which may be the same or different, each represents a hydrogen atom, a halogen atom, a cyano group or an alkyl group which may have a substituent; $R_{2a}$, $R_{3a}$, $R_{6a}$ and $R_{7a}$, which may be the same or different, each represents a hydrogen atom, a halogen atom, a cyano group, a hydroxy group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{50a}$ to $R_{55a}$, which may be the same or different, each represents a hydrogen atom, a fluorine atom or an alkyl group which may have a substituent, provided that at least one of $R_{50a}$ to $R_{55a}$ represents a fluorine atom or an alkyl group in which at least one of the hydrogen atoms is substituted with a fluorine atom; $R_{56a}$ represents a hydrogen atom, an alkyl group which may have a substituent, a cycloalkyl group which may have a substituent, an acyl group which may have a substituent or an alkoxycarbonyl group which may have a substituent; $R_{4a}$ represents a group represented by the following formula (IVA) or (VA):

wherein $R_{11a}$, $R_{12a}$ and $R_{13a}$, which may be the same or different, each represents an alkyl group which may have a substituent, a cycloalkyl group which may have a substituent, an alkenyl group which may have a substituent, an aralkyl group which may have a substituent or an aryl group which may have a substituent; $R_{14a}$ and $R_{15a}$, which may be the same or different, each represents a hydrogen atom or an alkyl group which may have a substituent; $R_{16a}$ represents an alkyl group which may have a substituent, a cycloalkyl group which may have a substituent, an aralkyl group which may have a substituent or an aryl group which may have a substituent; or two of $R_{14a}$ to $R_{16a}$ may be combined with each other to form a ring.

26. The positive resist composition as claimed in claim 17, wherein the fluorine group-containing resin of (A) is a resin having at least one repeating unit represented by the following formula (IIA) and at least one repeating unit represented by the following formula (VIA):

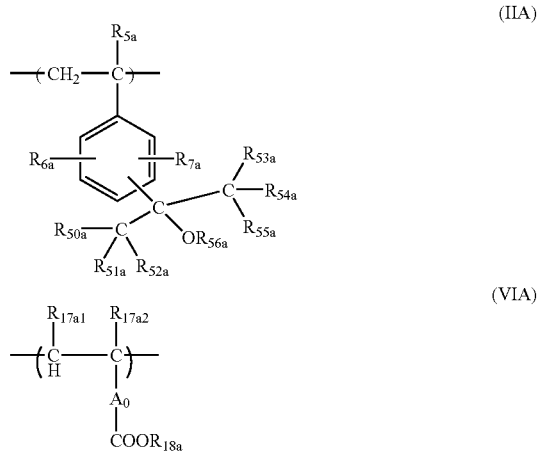

wherein $R_{5a}$ represents a hydrogen atom, a halogen atom, a cyano group or an alkyl group which may have a substituent; $R_{6a}$ and $R_{7a}$, which may be the same or different, each represents a hydrogen atom, a halogen atom, a cyano group, a hydroxy group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{50a}$ to $R_{55a}$, which may be the same or different, each represents a hydrogen atom, a fluorine atom or an alkyl group which may have a substituent, provided that at least one of $R_{50a}$ to $R_{55a}$ represents a fluorine atom or an alkyl group in which at least one of the hydrogen atoms is substituted with a fluorine atom; $R_{56a}$ represents a hydrogen atom, an alkyl group which may have a substituent, a cycloalkyl group which may have a substituent, an acyl group which may have a substituent or an alkoxycarbonyl group which may have a substituent; $R_{17a1}$ and $R_{17a2}$, which may be the same or different, each represents a hydrogen atom, a halogen atom, a cyano group or an alkyl group which may have a substituent; $R_{18a}$ represents —C($R_{18a1}$)($R_{18a2}$) ($R_{18a3}$) or —C($R_{18a1}$)($R_{18a2}$)(O$R_{18a4}$); $R_{18a1}$ to $R_{18a4}$, which may be the same or different, each represents a hydrogen atom, an alkyl group which may have a substituent, a cycloalkyl group which may have a substituent, an alkenyl group which may have a substituent, an aralkyl group which may have a substituent or an aryl group which may have a substituent; or two of $R_{18a1}$, $R_{18a2}$ and $R_{18a3}$ or two of $R_{18a1}$, $R_{18a2}$ and $R_{18a4}$ may be combined with each other to form a ring; and $A_0$ represents a single bond or a divalent connecting group which may have a substituent.

27. The positive resist composition as claimed in claim 26, wherein $R_{18a}$ in formula (VIA) is a group represented by the following formula (VIA-A):

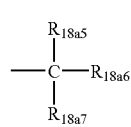

(VIA-A)

wherein $R_{18a5}$ and $R_{18a6}$, which may be the same or different, each represents an alkyl group which may have a substituent; and $R_{18a7}$ represents a cycloalkyl group which may have a substituent.

28. The positive resist composition as claimed in claim 26, wherein $R_{18a}$ in formula (VIA) is a group represented by the following formula (VIA-B):

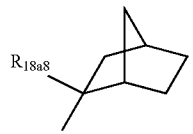

(VIA-B)

wherein $R_{18a8}$ represents an alkyl group which may have a substituent, an alkenyl group which may have a substituent, an alkynyl group which may have a substituent, an aralkyl group which may have a substituent or an aryl group which may have a substituent.

29. The positive resist composition as claimed in claim 25, wherein at least one of $R_{1a}$ in formula (IA), $R_{5a}$ in formula (IIA) and $R_{17a2}$ in formula (VIA) is a trifluoromethyl group.

30. The positive resist composition as claimed in claim 25, wherein the fluorine group-containing resin of (A) further comprises at least one of repeating units represented by the following formula (IIIA) and (VIIA):

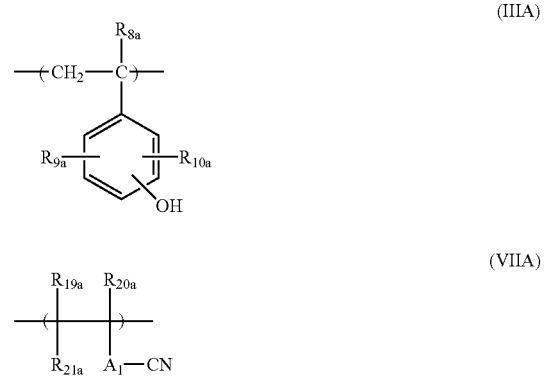

wherein $R_{8a}$ represents a hydrogen atom, a halogen atom, a cyano group or an alkyl group which may have a substituent; $R_{9a}$ and $R_{10a}$, which may be the same or different, each represents a hydrogen atom, a halogen atom, a cyano group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{19a}$ and $R_{20a}$, which may be the same or different, each represents a hydrogen atom, a halogen atom, a cyano group or an alkyl group which may have a substituent; $R_{21a}$ represents a hydrogen atom, a halogen atom, an alkyl group which may have a substituent or a group of —$A_1$—CN wherein $A_1$ represents a single bond or a divalent connecting group.

31. The positive resist composition as claimed in claim 17, which further comprises (C) a silicon-based and/or fluorine-based surface active agent.

32. The positive resist composition as claimed in claim 17, which further comprises a compound having a basic nitrogen atom as (D) an acid diffusion inhibiting agent.

33. The positive resist composition as claimed in claim 17, wherein the acid generator of (B) comprises a phenacylsulfonium salt, which generates a perfluoroalkylsulfonic acid having at least 2 carbon atoms, a perfluoroarylsulfonic acid or an arylsulfonic acid substituted with a perfluoroalkyl group upon irradiation with an actinic ray or radiation.

34. A method for forming a pattern comprising the steps of imagewise exposing a resist film formed from the positive resist composition as claimed in claim 17 to a vacuum ultraviolet ray of not more than 160 nm as a light source for exposure, and developing the exposed resist film.

35. A positive resist composition comprising (A) a fluorine group-containing resin, which has a structure substituted with a fluorine atom in the main chain and/or side chain of polymer skeleton and a group that is decomposed by the action of an acid to increase solubility in an alkali developer and (B) an acid generator capable of generating an acid upon irradiation of an actinic ray or radiation, and the acid generator of (B) comprises a sulfonium salt represented by the following formula (II):

(II)

wherein $R^{1b}$ to $R^{3b}$ each independently represents an alkyl group, a 2-oxoalkyl group, an alkoxycarbonylmethyl group, an allyl group or a vinyl group; and wherein the fluorine group-containing resin of (A) is a resin having at least one repeating unit represented by the following formula (IA) and at least one repeating unit represented by the following formula (IIA):

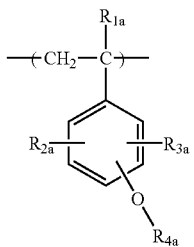
(IA)

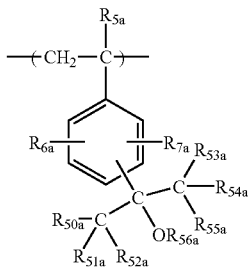
(IIA)

wherein $R_{1a}$ and $R_{5a}$, which may be the same or different, each represents a hydrogen atom, a halogen atom, a cyano group or an alkyl group which may have a substituent; $R_{2a}$, $R_{3a}$, $R_{6a}$ and $R_{7a}$, which may be the same or different, each represents a hydrogen atom, a halogen atom, a cyano group, a hydroxy group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{50a}$ to $R_{55a}$, which may be the same or different, each represents a hydrogen atom, a fluorine atom or an alkyl group which may have a substituent, provided that at least one of $R_{50a}$ to $R_{55a}$ represents a fluorine atom or an alkyl group in which at least one of the hydrogen atoms is substituted with a fluorine atom; $R_{56a}$ represents a hydrogen atom, an alkyl group which may have a substituent, a cycloalkyl group which may have a substituent, an acyl group which may have a substituent or an alkoxycarbonyl group which may have a substituent; $R_{4a}$ represents a group represented by the following formula (IVA) or (VA):

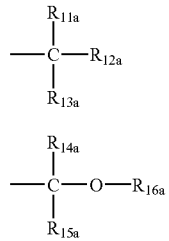
(IVA)

(VA)

wherein $R_{11a}$, $R_{12a}$ and $R_{13a}$, which may be the same or different, each represents an alkyl group which may have a substituent, a cycloalkyl group which may have a substituent, an alkenyl group which may have a substituent, an aralkyl group which may have a substituent or an aryl group which may have a substituent; $R_{14a}$ and $R_{15a}$, which may be the same or different, each represents a hydrogen atom or an alkyl group which may have a substituent; $R_{16a}$ represents an alkyl group which may have a substituent, a cycloalkyl group which may have a substituent, an aralkyl group which may have a substituent or an aryl group which may have a substituent; or two of $R_{14a}$ to $R_{16a}$ may be combined with each other to form a ring.

36. A positive resist composition comprising (A) a fluorine group-containing resin, which has a structure substituted with a fluorine atom in the main chain and/or side chain of polymer skeleton and a group that is decomposed by the action of an acid to increase solubility in an alkali developer and (B) an acid generator capable of generating an acid upon irradiation of an actinic ray or radiation, and the acid generator of (B) comprises a sulfonium salt represented by the following formula (II):

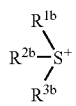
(II)

wherein $R^{1b}$ to $R^{3b}$ each independently represents an alkyl group, a 2-oxoalkyl group, an alkoxycarbonylmethyl group, an allyl group or a vinyl group; and wherein the fluorine group-containing resin of (A) is a resin having at least one repeating unit represented by the following formula (IIA) and at least one repeating unit represented by the following formula (VIA):

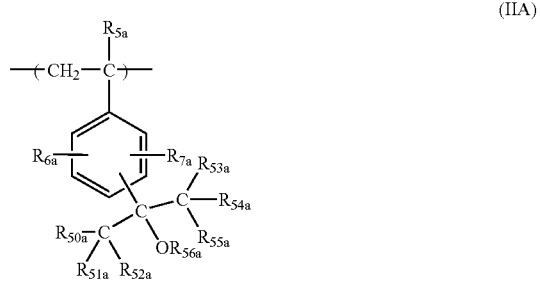
(IIA)

-continued

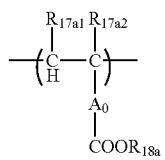

(VIA)

wherein $R_{5a}$ represents a hydrogen atom, a halogen atom, a cyano group or an alkyl group which may have a substituent; $R_{6a}$ and $R_{7a}$, which may be the same or different, each represents a hydrogen atom, a halogen atom, a cyano group, a hydroxy group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{50a}$ to $R_{55a}$, which may be the same or different, each represents a hydrogen atom, a fluorine atom or an alkyl group which may have a substituent, provided that at least one of $R_{50a}$ to $R_{55a}$ represents a fluorine atom or an alkyl group in which at least one of the hydrogen atoms is substituted with a fluorine atom; $R_{56a}$ represents a hydrogen atom, an alkyl group which may have a substituent, a cycloalkyl group which may have a substituent, an acyl group which may have a substituent or an alkoxycarbonyl group which may have a substituent; $R_{17a1}$ and $R_{17a2}$, which may be the same or different, each represents a hydrogen atom, a halogen atom, a cyano group or an alkyl group which may have a substituent; $R_{18a}$ represents $-C(R_{18a1})(R_{18a2})(R_{18a3})$ or $-C(R_{18a1})(R_{18a2})(OR_{18a4})$; $R_{18a1}$ to $R_{18a4}$, which may be the same or different, each represents a hydrogen atom, an alkyl group which may have a substituent, a cycloalkyl group which may have a substituent, an alkenyl group which may have a substituent, an aralkyl group which may have a substituent or an aryl group which may have a substituent; or two of $R_{18a1}$, $R_{18a2}$ and $R_{18a3}$ or two of $R_{18a1}$, $R_{18a2}$ and $R_{18a4}$ may be combined with each other to form a ring; and $A_0$ represents a single bond or a divalent connecting group which may have a substituent.

37. The positive resist composition as claimed in claim 36, wherein $R_{18a}$ in formula (VIA) is a group represented by the following formula (VIA-A):

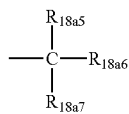

(VIA-A)

wherein $R_{18a5}$ and $R_{18a6}$, which may be the same or different, each represents an alkyl group which may have a substituent; and $R_{18a7}$ represents a cycloalkyl group which may have a substituent.

38. The positive resist composition as claimed in claim 36, wherein $R_{18a}$ in formula (VIA) is a group represented by the following formula (VIA-B):

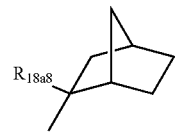

(VIA-B)

wherein $R_{18a8}$ represents an alkyl group which may have a substituent, an alkenyl group which may have a substituent, an alkynyl group which may have a substituent, an aralkyl group which may have a substituent or an aryl group which may have a substituent.

39. The positive resist composition as claimed in claim 35, wherein at least one of $R_{1a}$ in formula (IA), $R_{5a}$ in formula (IIA) and $R_{17a2}$ in formula (VIA) is a trifluoromethyl group.

40. The positive resist composition as claimed in claim 35, wherein the fluorine group-containing resin of (A) further comprises at least one of repeating units represented by the following formulae (IIIA) and (VIIA):

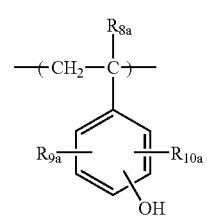

(IIIA)

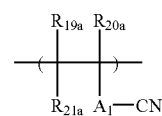

(VIIA)

wherein $R_{8a}$ represents a hydrogen atom, a halogen atom, a cyano group or an alkyl group which may have a substituent; $R_{9a}$ and $R_{10a}$, which may be the same or different, each represents a hydrogen atom, a halogen atom, a cyano group, an alkyl group which may have a substituent, a cycloalkyl group which may have a substituent, an alkoxy group which may have a substituent, an acyl group which may have a substituent, an acyloxy group which may have a substituent, an alkenyl group which may have a substituent, an aryl group which may have a substituent or an aralkyl group which may have a substituent; $R_{19a}$ and $R_{20a}$, which may be the same or different, each represents a hydrogen atom, a halogen atom, a cyano group or an alkyl group which may have a substituent; $R_{21a}$ represents a hydrogen atom, a halogen atom, an alkyl group which may have a substituent or a group of $-A_1-CN$ wherein $A_1$ represents a single bond or a divalent connecting group.

* * * * *